(12) United States Patent
Chen et al.

(10) Patent No.: US 11,271,132 B2
(45) Date of Patent: Mar. 8, 2022

(54) MULTI-WAFER BASED LIGHT ABSORPTION APPARATUS AND APPLICATIONS THEREOF

(71) Applicant: Artilux Inc., Menlo Park, CA (US)

(72) Inventors: Chien-Yu Chen, Zhubei (TW); Szu-Lin Cheng, Zhubei (TW); Chieh-Ting Lin, Zhubei (TW); Yu-Hsuan Liu, Zhubei (TW); Ming-Jay Yang, Zhubei (TW); Shu-Lu Chen, Zhubei (TW); Tsung-Ting Wu, Zhubei (TW); Chia-Peng Lin, Zhubei (TW); Yun-Chung Na, Zhubei (TW); Hui-Wen Chen, Zhubei (TW); Han-Din Liu, Zhubei (TW)

(73) Assignee: Artilux, Inc., Menlo Park, CA (US)

( * ) Notice: Subject to any disclaimer, the term of this patent is extended or adjusted under 35 U.S.C. 154(b) by 0 days.

(21) Appl. No.: 16/848,682

(22) Filed: Apr. 14, 2020

(65) Prior Publication Data

US 2020/0313029 A1    Oct. 1, 2020

Related U.S. Application Data

(60) Continuation of application No. 16/219,726, filed on Dec. 13, 2018, now Pat. No. 10,644,187, which is a
(Continued)

(51) Int. Cl.
*H01L 31/18*   (2006.01)
*H01L 31/028*  (2006.01)
(Continued)

(52) U.S. Cl.
CPC ...... *H01L 31/1812* (2013.01); *H01L 27/1469* (2013.01); *H01L 27/14629* (2013.01);
(Continued)

(58) Field of Classification Search
CPC . H01L 31/1812; H01L 31/105; H01L 31/028; H01L 31/0549; H01L 31/02327;
(Continued)

(56) References Cited

U.S. PATENT DOCUMENTS 3,622,319 A    11/1971  Sharp
4,592,043 A    5/1986   Williams
(Continued)

FOREIGN PATENT DOCUMENTS

CN    1652326 A    8/2005
CN    1780004 A    5/2006
(Continued)

OTHER PUBLICATIONS

Haque et al. "Investigations on Zn—Al—Ge Alloys as High Temperature Die Attach Material" 3rd Electronics System Integration Technology Conference ESTC, 2010, IEEE (Year: 2010).*
(Continued)

*Primary Examiner* — Sitaramarao S Yechuri
(74) *Attorney, Agent, or Firm* — Perkins Coie LLP

(57) ABSTRACT

Structures and techniques introduced here enable the design and fabrication of photodetectors (PDs) and/or other electronic circuits using typical semiconductor device manufacturing technologies meanwhile reducing the adverse impacts on PDs' performance. Examples of the various structures and techniques introduced here include, but not limited to, a pre-PD homogeneous wafer bonding technique, a pre-PD heterogeneous wafer bonding technique, a post-PD wafer bonding technique, their combinations, and a number of mirror equipped PD structures. With the introduced structures and techniques, it is possible to implement PDs using typical direct growth material epitaxy technology while reducing the adverse impact of the defect layer at the material interface caused by lattice mismatch.

19 Claims, 54 Drawing Sheets

Related U.S. Application Data continuation-in-part of application No. 15/996,261, filed on Jun. 1, 2018, now Pat. No. 10,529,886, which is a division of application No. 15/626,969, filed on Jun. 19, 2017, now Pat. No. 9,991,411, which is a continuation of application No. 15/219,200, filed on Jul. 25, 2016, now Pat. No. 9,704,916.

(60) Provisional application No. 62/598,411, filed on Dec. 13, 2017, provisional application No. 62/205,003, filed on Aug. 14, 2015, provisional application No. 62/204,460, filed on Aug. 13, 2015, provisional application No. 62/200,109, filed on Aug. 2, 2015, provisional application No. 62/196,315, filed on Jul. 24, 2015.

(51) Int. Cl.
*H01L 31/054* (2014.01)
*H01L 27/146* (2006.01)
*H01L 31/0232* (2014.01)
*H01L 31/107* (2006.01)
*H01L 31/0216* (2014.01)
*H01L 31/02* (2006.01)
*H01L 31/105* (2006.01)

(52) U.S. Cl.
CPC .. *H01L 27/14634* (2013.01); *H01L 31/02005* (2013.01); *H01L 31/028* (2013.01); *H01L 31/02161* (2013.01); *H01L 31/02327* (2013.01); *H01L 31/0549* (2014.12); *H01L 31/105* (2013.01); *H01L 31/107* (2013.01); *H01L 31/1892* (2013.01); *Y02E 10/52* (2013.01); *Y02E 10/547* (2013.01)

(58) Field of Classification Search
CPC .............. H01L 31/107; H01L 31/1892; H01L 31/02161; H01L 31/02005; H01L 27/14629; H01L 27/14634; H01L 27/1469; Y02E 10/547; Y02E 10/52; G02B 2006/12061; G02B 6/4204; G02B 6/34
See application file for complete search history.

(56) References Cited

U.S. PATENT DOCUMENTS

| | | | |
|---|---|---|---|
| 5,291,055 A | 3/1994 | Farhoomand et al. | |
| 5,315,128 A | 5/1994 | Hunt et al. | |
| 5,343,542 A | 8/1994 | Kash et al. | |
| 5,355,216 A | 10/1994 | Kim et al. | |
| 5,389,797 A | 2/1995 | Bryan et al. | |
| 5,455,421 A | 10/1995 | Spears | |
| 5,525,828 A | 6/1996 | Bassous et al. | |
| 5,783,364 A | 7/1998 | Ellis et al. | |
| 5,977,604 A | 11/1999 | Babic et al. | |
| 6,130,441 A | 10/2000 | Bowers et al. | |
| 6,172,408 B1 | 1/2001 | Seto et al. | |
| 6,218,719 B1 | 4/2001 | Tsang | |
| 6,349,106 B1 | 2/2002 | Coldren | |
| 6,836,574 B2 | 12/2004 | Shioda et al. | |
| 7,446,297 B1 | 11/2008 | Sigel et al. | |
| 7,535,944 B1 | 5/2009 | Guilfoyle et al. | |
| 8,058,549 B2 | 11/2011 | Kothari et al. | |
| 8,188,512 B2 | 5/2012 | Kim et al. | |
| 8,330,956 B1 | 12/2012 | Seletskiy et al. | |
| 8,921,794 B2 | 12/2014 | Stiens et al. | |
| 9,472,588 B1 | 10/2016 | Li et al. | |
| 10,399,186 B2 * | 9/2019 | Pan ........................ | B23K 35/26 |
| 2002/0171077 A1 | 11/2002 | Chu et al. | |
| 2003/0047752 A1 | 3/2003 | Campbell et al. | |
| 2003/0231683 A1 | 12/2003 | Chua et al. | |
| 2003/0235931 A1 | 12/2003 | Wada et al. | |
| 2004/0096574 A1 | 5/2004 | Hsieh et al. | |
| 2004/0137698 A1 | 7/2004 | Taraschi et al. | |
| 2004/0159775 A1 | 8/2004 | Sundaram et al. | |
| 2005/0002604 A1 | 1/2005 | Verbrugge et al. | |
| 2005/0035381 A1 | 2/2005 | Holm et al. | |
| 2005/0226294 A1 | 10/2005 | Ledentsov et al. | |
| 2006/0013591 A1 | 1/2006 | Rohde et al. | |
| 2006/0214249 A1 | 9/2006 | Nam et al. | |
| 2007/0002917 A1 | 1/2007 | Deng | |
| 2007/0019917 A1 | 1/2007 | Bayindir et al. | |
| 2007/0041414 A1 | 2/2007 | Albrecht et al. | |
| 2007/0086018 A1 | 4/2007 | Shih et al. | |
| 2007/0104441 A1 | 5/2007 | Ahn et al. | |
| 2007/0159638 A1 | 7/2007 | Zeng et al. | |
| 2007/0189688 A1 | 8/2007 | Dehlinger et al. | |
| 2007/0190681 A1 | 8/2007 | Lee et al. | |
| 2007/0231488 A1 | 10/2007 | Von | |
| 2007/0273887 A1 | 11/2007 | Russell et al. | |
| 2008/0001169 A1 | 1/2008 | Lochtefeld | |
| 2008/0181277 A1 | 7/2008 | Konig et al. | |
| 2009/0078973 A1 | 3/2009 | Hsu et al. | |
| 2009/0121305 A1 | 5/2009 | Pan et al. | |
| 2009/0273049 A1 | 11/2009 | Fattal et al. | |
| 2010/0006967 A1 | 1/2010 | Ishimura et al. | |
| 2010/0019334 A1 | 1/2010 | Ivanov et al. | |
| 2010/0026779 A1 | 2/2010 | Yonehara et al. | |
| 2010/0123120 A1 | 5/2010 | Mohseni | |
| 2011/0012221 A1 | 1/2011 | Fujikata et al. | |
| 2011/0116095 A1 | 5/2011 | Krol et al. | |
| 2011/0120538 A1 | 5/2011 | Lochtefeld et al. | |
| 2011/0163405 A1 | 7/2011 | Tay et al. | |
| 2012/0018744 A1 | 1/2012 | Dosunmu et al. | |
| 2012/0075634 A1 | 3/2012 | Sieben-xu et al. | |
| 2012/0077680 A1 | 3/2012 | Berggren et al. | |
| 2013/0023082 A1 * | 1/2013 | Martin .................... | H01L 23/10 438/51 |
| 2013/0081667 A1 | 4/2013 | Hwang et al. | |
| 2013/0164892 A1 | 6/2013 | Sugawara | |
| 2014/0090976 A1 | 4/2014 | Rotschild et al. | |
| 2014/0117383 A1 | 5/2014 | Tay et al. | |
| 2014/0120654 A1 | 5/2014 | Fujii | |
| 2014/0159183 A1 | 6/2014 | Na et al. | |
| 2014/0239301 A1 | 8/2014 | Huang et al. | |
| 2014/0246571 A1 | 9/2014 | Li et al. | |
| 2014/0264825 A1 * | 9/2014 | Ahmed ............... | H01L 21/3065 257/734 |
| 2014/0284450 A1 | 9/2014 | Chen et al. | |
| 2015/0191344 A1 * | 7/2015 | Sadaka ............... | B81C 1/00238 257/774 |
| 2016/0133762 A1 | 5/2016 | Blasco Claret | |

FOREIGN PATENT DOCUMENTS

| | | | | |
|---|---|---|---|---|
| CN | 1794474 A | 6/2006 | | |
| CN | 1812302 A | 8/2006 | | |
| CN | 101326646 A | 12/2008 | | |
| CN | 103955034 A | 7/2014 | | |
| DE | 2132254 A1 * | 1/1972 | ............ | H01L 24/83 |
| FR | 2096801 A1 * | 2/1972 | ............ | H01L 24/29 |
| JP | H11507178 A | 6/1999 | | |
| JP | 2003504677 A | 2/2003 | | |
| TW | 200605339 A | 2/2006 | | |
| TW | 201145487 A | 12/2011 | | |
| TW | 201421653 A | 6/2014 | | |

OTHER PUBLICATIONS

European Search Report dated Sep. 15, 2020 for European Application No. 2017252.0, 8 pages, dated Sep. 15, 2020.
Final Office Action dated Jun. 9, 2015, for U.S. Appl. No. 14/298,825, of Chen, S.L., filed Jun. 6, 2014.
Final Office Action dated Mar. 29, 2018, for U.S. Appl. No. 15/162,521, of Chen, S.L., filed May 23, 2016.
International Search Report and Written Opinion dated Oct. 31, 2016 for International Application No. PCT/US2016/043929, filed Jul. 25, 2016, 10 pages.

(56) References Cited

OTHER PUBLICATIONS

Non-Final Office Action dated Dec. 31, 2014, for U.S. Appl. No. 14/298,825, of Chen, S.L., filed Jun. 6, 2014.
Notice of Allowance dated Dec. 24, 2015, U.S. Appl. No. 14/298,825, of Chen, S.L., filed Jun. 6, 2014.
Notice of Allowance dated May 18, 2018 for JP 2014265530; 3 pages.
Notification of Reasons for Refusal dated Feb. 16, 2018 for Japanese Patent Application No. JP 2014-265530, 6 pages.
Extended European Search Report dated Feb. 12, 2019 for European Patent Application No. 16831211.4, filed Jul. 25, 2016., dated Feb. 12, 2019.
Non-Final Office Action dated May 24, 2018 for U.S. Appl. No. 14/998,053 of Chen et al., filed Dec. 24, 2015.
Cai, M., "Observation of critical coupling in a fiber taper to a silica-microsphere whispering-gallery mode system," Phys. Rev. Lett. 85(1), 74-77 (2000).
Carline et al. "Long-wavelength SiGe/Si resonant cavity infrared detector using a bonded silicon-on-oxide reflector," 1996, Applied Physics Letters, vol. 68, pp. 544-546.
Chen, C.-H., et al., "Resonant-cavity-enhanced p-i-n photodiode with a broad quantumefficiency spectrum by use of an anomalous-dispersion mirror," Appl. Opt. 44(29), 6131-6140 (2005).
Colace, L., "Germanium near infrared detector in Silicon on insulator," Appl. Phys. Lett. 91(2), 021107 (2007).
DeRose, C.T. et al. "Ultra compact 45 GHz CMOS compatible Germanium waveguide photodiode with low dark current," Opt. Express 19(25), 24897-24904 (2011).
Dosunmu, O. I., et al., "High-speed resonant cavity enhanced Ge photodetectors on reflecting Si substrates for 1550-nm operation," IEEE Photon. Technol. Lett. 17(1), 175-177 (2005).
Emsley, M. K., "High-speed resonant-cavity-enhanced Silicon photodetectors on reflecting Silicon-on-insulator substrates," IEEE Photon. Technol. Lett. 14(4), 519-521 (2002).
Extended European Search Report dated Jun. 29, 2015, for European Patent Application No. 14200338.3 filed Dec. 24, 2014, 9 pages.
Feng, D., et al., "High-speed Ge photodetector monolithically integrated with large crosssection Silicon-on-insulator waveguide," Appl. Phys. Lett. 95(26), 261105 (2009).
Joo, J. et al., "High-sensitivity 10 Gbps Ge-on-Si photoreceiver operating at I~1.55 mm," Opt. Express 18(16), 16474-16479 (2010).
Kishino, K., "Resonant cavity-enhanced (RCE) photodetectors," IEEE J. Quantum Electron. 27(8), 2025-2034 (1991).
Klinger, S., et al., "Ge-on-Si p-i-n photodiodes with a 3-Db bandwidth of 49 GHz," IEEE Photon. Technol. Lett. 21(13), 920-922 (2009).
Michel, J., et al., "High-performance Ge-on-Si photodetectors," Nat. Photonics 4(8), 527-534 (2010).
Morse, M., et al., "Performance of Ge-on-Si p-i-n photodetectors for standard receiver modules," IEEE Photon. Technol. Lett. 18(23), 2442-2444 (2006).
Non-Final Office Action dated Jun. 13, 2014, for U.S. Appl. No. 13/709,209, filed Dec. 10, 2012, now abandoned.
Notice of Allowance; dated Aug. 15, 2018; U.S. Appl. No. 15/162,521; filed May 23, 2016, dated Aug. 15, 2018.
Notice of Allowance dated Apr. 11, 2016, for U.S. Appl. No. 14/298,825, of Chen, S.L., filed Jun. 6, 2014.
Osmond, J., et al., "40 GB/s surface-illuminated Ge-on-Si photodetectors," Appl. Phys. Lett. 95(15), 151116 (2009).
Rouviere, M., et al.: "Integration of germanium waveguide photodectors for intrachip optical interconnects," Optical Engineering, vol. 44, No. 7, Jul. 18, 2005, p. 075402-1.
Tseng, C.-K., et al., "Selfaligned microbonded Ge/Si PIN waveguide photodetector," post-deadline session, 9th IEEE International Conference on Group IV Photonics (GFP), Aug. 29-31, 2012.
U.S. Appl. No. 13/709,209, filed Dec. 10, 2012, now abandoned.
U.S. Appl. No. 14/298,825 by Chen, S., et al., filed Jun. 6, 2014.
U.S. Appl. No. 14/998,053 by Chen, S., et al., filed Dec. 24, 2015.
Wu, T.-T., et al., "A critically coupled Germanium photodetector under vertical illumination," Optics express 20, (28) 29338-29346 (2012).
Yariv, A., "Critical coupling and its control in optical waveguide-ring resonator systems," IEEE Photon. Technol. Lett. 14(4), 483-485 (2002).
Yin, T., et al., "31 GHz Ge n-i-p waveguide photodetectors on Silicon-on-Insulator substrate," Opt. Express 15(21), 13965-13971 (2007).
Yu, H., et al., "High-efficiency p-i-n photodetectors on selective-area-grown Ge for monolithic integration," IEEE Electron Device Lett. 30(11), 1161-1163 (2009).
Cheng, B., et al., "Silicon-based long wavelength photodetectors", 2009 Asia Communications and Photonics conference and Exhibition, pp. 1-9 (Year: 2009), 2009, 1-9.
Das, M. K., et al., "On optimum designs of a RCE Si/SiGe/Si MQW photodetector for long wavelength applications", Opt Quant Electron 41 (7):539-549 (Year: 2009), 539-549.
De Stefano, Luca, et al., "Low-cost VLSI-compatible resonant-cavity-enhanced p-i-n in micron-Si operating at the VCSEL wavelengths around 850nm", SPIEDigitalLibrary.org/conference-proceedings-of-spie; Event: Microtechnologies for the New Millennium 2003, Canary Islands, Spain, 428-433.
Emsley, M. K., et al., "Silicon substrates with buried distributed Bragg reflectors for resonant cavity-enhanced optoelectronics",IEEE Journal of Selected Topics in Quantum Electronics., vol. 8, No. 4, Jul. 2002,XP055550990, ISSN: 1077-260X, DOI: 10.1109/JSTQE. 2002.801692 , Jul. 2002, 948-955.
Kaniewski, J., et al., "Resonant cavity enhanced InGaAs photodiodes for high speed detection of 1.55 um infrared radiation", Proceedings vol. 5783, Infrared Technology and Applications XXXI, 2005; pp. 47-56; SPIE, Bellingham, WA.
Li, C., "Si1-xGex/Si resonant-cavity-enhanced photodetectors with a silicon-on-oxide reflector operating near 1.3 µm", Applied Physics Letters 77(2), 157-159, Jul. 10, 2000, 157-159.
Li, Cheng, et al., "SiGe/Si resonant-cavity-enhanced photodetectors for 1.3 µm operation fabricated using wafer bonding techniques", Journal of Applied Physics, vol. 92, No. 3, Aug. 2002, p. 1718-1720, XP012057022, ISSN:0021-8979,DOI: 10.1063/1.1492868 , Aug. 2002, 1718-1720.
Sood, Ashok K., et al., "Development of SiGe arrays for visible-near IR applications", Proceedings of SPIE, vol. 7780, Aug. 17, 2010, p. 77800F1-10, XP055550694, ISSN: 0277-786X, DOI: 10.1117/12. 866362, ISBN: 978-1-5106-2099-5, Aug. 17, 2010, 11 pages.
Unlu, M. Selim, "Resonant cavity enhanced photonic devices", Resonant cavity enhanced photonic devices; Journal of Applied Physics, vol. 78, Mar. 1, 1995, pp. 607-639.
Wang, Jian, et al., "Ge-Photodetectors for Si-Based Optoelectronic Integration", Sensors, vol. 11, No. 12, Jan. 12, 2011, p. 696-718, XP055339081, DOI: 10.3390/s110100696, Jan. 12, 2011, 696-718.
China Office Action dated Nov. 17, 2021 in China App. 201680055334.6.
Taiwan Office Action dated Jul. 19, 2021 in Taiwan App. 109139891.

* cited by examiner

| Wafer #2 | 2305 |
|---|---|
| Barrier Layer | 2315 |
| Modified Aluminum Layer | 2325 |
| Modified Germanium Layer | 2335 |
| Modified Germanium Layer | 2330 |
| Modified Aluminum Layer | 2320 |
| Barrier Layer | 2310 |
| Wafer #1 | 2300 |

*FIG. 23B*

| Wafer #2 | 2305 |
|---|---|
| Barrier Layer | 2315 |
| Al-Ge Eutectic Alloy | 2340 |
| Barrier Layer | 2310 |
| Wafer #1 | 2300 |

*FIG. 23C*

MULTI-WAFER BASED LIGHT ABSORPTION APPARATUS AND APPLICATIONS THEREOF

PRIORITY CLAIM

This application is a continuation (CON) application of Ser. No. 16/219,726, entitled "MULTI-WAFER BASED LIGHT ABSORPTION APPARATUS AND APPLICATIONS THEREOF," filed Dec. 13, 2018, which is a continuation-in-part (CIP) application of Ser. No. 15/996,261, entitled "MULTI-WAFER BASED LIGHT ABSORPTION APPARATUS AND APPLICATIONS THEREOF," filed Jun. 1, 2018, now U.S. Pat. No. 10,529,886, which is a divisional (DIV) application of Ser. No. 15/626,969, entitled "MULTI-WAFER BASED LIGHT ABSORPTION APPARATUS AND APPLICATIONS THEREOF," filed Jun. 19, 2017, now U.S. Pat. No. 9,991,411, which is a continuation (CON) application of Ser. No. 15/219,200, entitled "MULTI-WAFER BASED LIGHT ABSORPTION APPARATUS AND APPLICATIONS THEREOF," filed Jul. 25, 2016, now U.S. Pat. No. 9,704,916, which claims priority to U.S. Provisional Patent Application No. 62/196,315, entitled "HIGH SPEED HYBRID WAVEGUIDE-BASED MULTIPLE CHANNEL OPTICAL MODULE," filed Jul. 24, 2015; U.S. Provisional Patent Application No. 62/200,109, entitled "PHOTODETECTOR AND INTEGRATION WITH INTEGRATED CIRCUITS," filed Aug. 2, 2015; U.S. Provisional Patent Application No. 62/204,460, entitled "SILICON GERMANIUM PHOTODIODE," filed Aug. 13, 2015; and U.S. Provisional Patent Application No. 62/205,003, entitled "SILICON GERMANIUM PHOTODIODE," filed Aug. 14, 2015; all of which are incorporated by reference herein in their entirety.

This application also claims priority to U.S. Provisional Patent Application No. 62/598,411, entitled "ALUMINUM-DOPED GERMANIUM WAFER BONDING AND ITS APPLICATION," filed Dec. 13, 2017, which is incorporated by reference herein.

TECHNICAL FIELD

Embodiments of the present disclosure relate to semiconductor device design, and more particularly, to multi-wafer based semiconductor photodetectors and other devices.

BACKGROUND

Fueled by big data, cloud computing, as well as other computer network and telecommunication applications, there is an ever increasing demand for high speed telecommunication means. High speed optical transmitters and receivers (or collectively referred to herein as "transceivers") that are capable of exceeding a transmission rate of 25 Gbps have attracted the public's attention.

While optical transceivers are gaining popularity, semiconductor photodetector (PD) design and manufacturing technology is often different and sometimes even incompatible with other kinds of traditional semiconductor device manufacturing technologies, such as those for metal oxide semiconductor (MOS) transistors. As an example, a direct growth of silicon germanium (SiGe) materials on silicon material substrates can often cause a defect layer, laden with lattice mismatch between Ge and Si. This defect layer can result in leakage current and degraded PD performance characteristics (e.g., signal-to-noise ratio (SNR)).

It is beneficial to have improved device design and fabrication techniques that enable PDs and/or other electronic circuits using typical semiconductor device manufacturing technologies meanwhile reducing the adverse impacts on PDs' performance.

BRIEF DESCRIPTION OF THE DRAWINGS

One or more embodiments of the present disclosure are illustrated by way of example and not limitation in the figures of the accompanying drawings, in which like references indicate similar elements. These drawings are not necessarily drawn to scale.

FIGS. 23A-23C illustrate an example modified aluminum-germanium (Al—Ge) eutectic alloy bonding scheme.

DETAILED DESCRIPTION

Figure 1A:
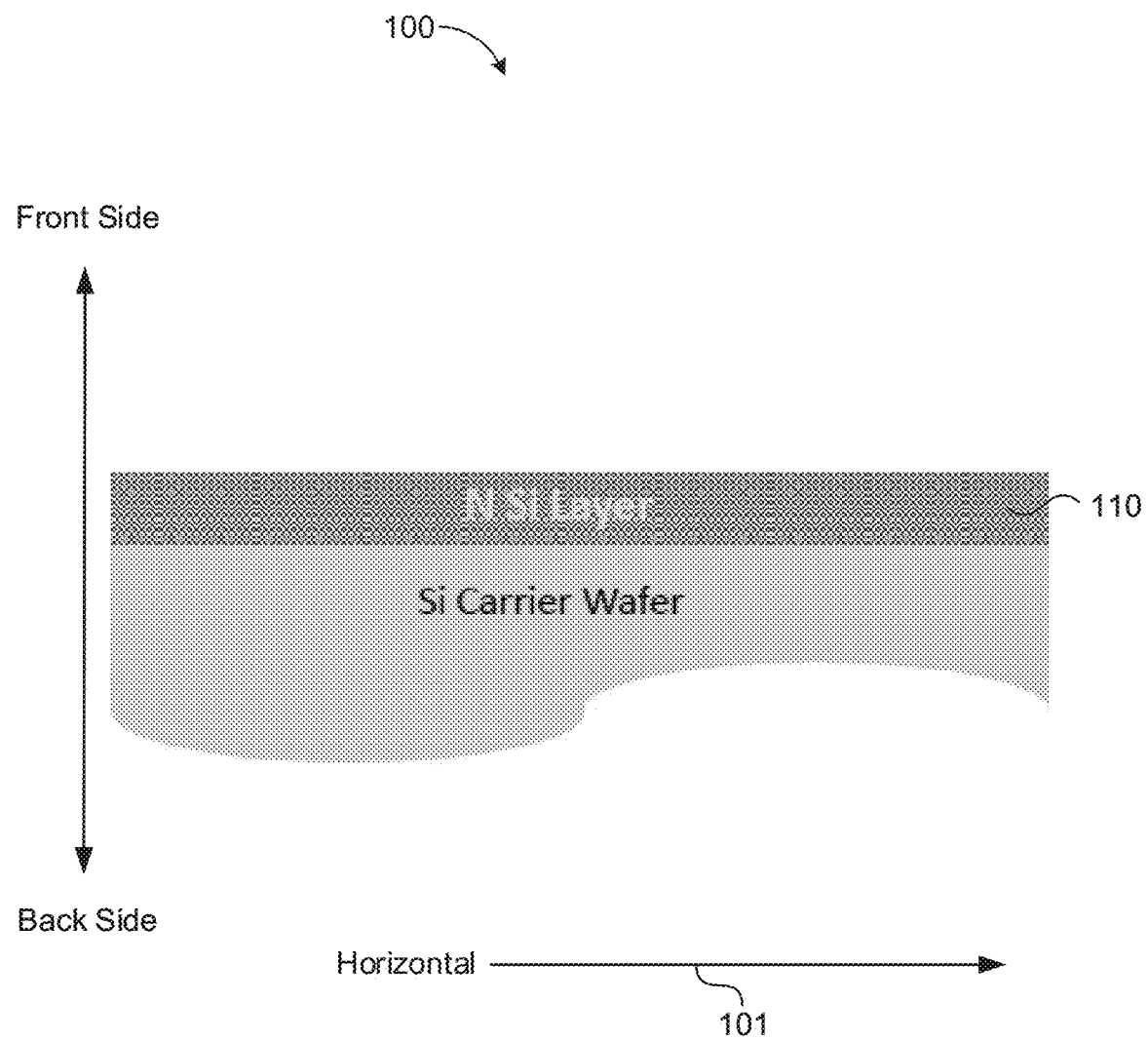
FIGS. 1A-1C are cross-sectional views of embodiments of a carrier wafer.

Germanium (Ge) based or silicon germanium (SiGe) based optical sensors (e.g., photodetectors or photodiodes (generally referred to as PD herein), avalanche photodiodes (APD), or image sensors) have long been applauded for their better sensitivity to near infra-red (NIR) wavelength optical signals. In addition, SiGe based material systems are relatively compatible to contemporary, high volume complementary metal oxide semiconductor (CMOS) manufacturing technologies, and therefore the integration potentials with integrated circuits of such material systems are much favored. With the advancement in Ge epitaxy technology, direct growth of $Si_xGe_{1-x}$ (where 0≤x<1) materials on silicon (Si) material substrates have become popular. (Note that $Si_xGe_{1-x}$ (where 0≤x<1) here includes all suitable SiGe composition combinations from 100% Ge to almost 100% Si.)

However, it is observed that, due to a large lattice mismatch (i.e., about 4%) between Ge and Si, a dense defect layer typically can form near the interface of the Si substrate and deposited $Si_xGe_{1-x}$ film to relax the strain energy generated from this large lattice mismatch. This dense defect layer is typically at least 30 nm in thickness and is highly dependent on the Ge content of the film. The large number of defects can act as carrier generation and recombination centers if these defects are located within or close to the electrical fields or intrinsic regions of the PD devices, which can severely increase the leakage current of such devices. This leakage current in PD, also known as the "dark current," is a major source of noise current for PDs that can severely degrade a photodetector's signal-to-noise (SNR) ratio. This relatively high threading dislocation density (TDD) issue makes Ge or $Si_xGe_{1-x}$ based photodiodes' dark current characteristics inferior when compared to competing photodiode materials systems such as pure silicon and III-V materials (e.g., GaAs or InGaAs). The magnitude of dark current have been shown to be positively correlated with the TDD. Furthermore, the high TDD layer has been observed to be horizontally conductive, posing detrimental effects to device performance if the direction of the device's primary current flow coincided with the horizontal direction of the high TDD layer. There has been attempts to use germanium substrate wafers to form the high quality germanium material layer that is to be transferred to other wafers. Yet, generally speaking, germanium substrate wafers are expensive, limited in size and difficult to handle due to its fragile nature, therefore making such approach difficult to scale for production.

Accordingly, introduced here are a number of device design and fabrication techniques that enable PDs and/or other electronic circuits using typical semiconductor device manufacturing technologies meanwhile reducing the adverse impacts on PDs' performance. Examples of the various techniques introduced here include, but not limited to, a pre-PD homogeneous wafer bonding technique, a pre-PD heterogeneous wafer bonding technique, a post-PD wafer bonding technique, a number of multi-stack PD device structures, as well as other structures and techniques related to integration and optoelectronic-related applications. With the introduced techniques, it is possible to fabricate PDs and/or other electronic circuits using typical semiconductor device manufacturing technologies, such as direct growth of $Si_xGe_{1-x}$ on Si substrate, while reducing the adverse impacts of the leakage current caused by the dense defect layer on PDs' performance.

In the following description, the example of a Si/SiGe material system PD is used, for illustrative purposes only, to explain various techniques that can be implemented for manufacturing the PD using typical direct growth material epitaxy technology while reducing the adverse impact of the defect layer at the material interface caused by lattice mismatch. Note, however, that the techniques introduced here are not limited in applicability to any particular kind of PD and/or transistors. For example, even though one or more figures introduced in connection with the techniques disclosed here (e.g., FIGS. 10A-10C, 15A-15B, and 16A-16B) illustrate a front side incidence double mirror PD structure, the techniques are applicable in a similar manner to other types of PD structure including, but not limited to, a single mirror PD structure, a back side incidence PD, or any suitable combination thereof.

For purposes of discussion herein, a PD is a semiconductor apparatus that converts an optical signal into a photo-generated electrical signal. Examples of PD devices include a P-I-N photodiode, an avalanche photodiode (APD), a uni-traveling carrier photodiode, or an image sensor (including, for example, a near-infrared (NIR) sensor). A typical P-I-N diode includes two highly-doped semiconductor layers with opposite electrical polarity (i.e., one "p-type" and one "n-type") and a photon absorption layer (i.e., "intrinsic")

sandwiched in between the two layers. In the context of P-I-N PDs, the term "highly-doped" typically may be understood as having a doping concentration above $10^{18}$ cm$^{-3}$; the term "intrinsic" typically may be understood as having a doping concentration below $10^{17}$ cm$^{-3}$ in Si$_x$Ge$_{1-x}$ material systems.

Further, in the following description, numerous specific details are set forth to provide a thorough understanding of the present disclosure. It will be apparent to one skilled in the art that the techniques introduced here may be practiced without these specific details. In other instances, well-known features, such as specific fabrication techniques, are not described in detail in order to not unnecessarily obscure the present disclosure. References in this description to "an embodiment," "one embodiment," or the like, mean that a particular feature, structure, material, or characteristic being described is included in at least one embodiment of the present disclosure. Thus, the appearances of such phrases in this specification do not necessarily all refer to the same embodiment. On the other hand, such references are not necessarily mutually exclusive either. Furthermore, the particular features, structures, materials, or characteristics may be combined in any suitable manner in one or more embodiments. Also, it is to be understood that the various exemplary embodiments shown in the figures are merely illustrative representations and are not necessarily drawn to scale.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. Unless otherwise made apparent in the context, the term "coupled" may be used to indicate that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one material layer with respect to other material layers. As such, for example, one layer disposed "over" or "under" another layer may be directly in contact with the other layer or may have one or more intervening layers. Moreover, one layer disposed "between" two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate. The term "atop" means "on the top of."

Similarly, the terms "above" and "below" are generally used herein for describing the relative physical location of different devices, layers, sections, portions, etc., with respect to their shortest distances to the semiconductor substrate. For example, a first layer "above" a second layer means that, when measured from the substrate at the same horizontal level, the first layer is farther away in distance from the substrate than the second layer. Conversely, a first layer "below" a second layer means that, when measured from the substrate at the same horizontal level, the first layer is closer in distance from the substrate than the second layer. As used herein, "horizontal" means parallel to the planar surface of the substrate, such as the horizontal axis 101 illustrated in FIG. 1A.

The terms "front side" and "back side" are used in a relative sense, from the perspective of an individual object that the terms modify or otherwise describe. As such, the terms "front side" and "back side" do not indicate an absolute direction; rather, the direction being referred to depends on the object that the term "front side" or "back side" modifies. For example, a "back side" of a donor wafer (e.g., wafer 100, FIG. 1A) may eventually become a "front side" of the resulting PD structure (e.g., structure 400, FIG. 4).

The term "immediately" or "directly" may be construed as "in physical contact," as will be made apparent by the context; for example, unless contradictory to the context, a first layer "immediately above" or "directly above" a second layer means that the first layer is above and in physical contact with the second layer.

As used herein, "contact plug," "contact via," or simply "contact" for a device refers to any substantially vertical wire between with the doped regions for the device and the first interconnect layer for the device. The term "interconnect" refers to any substantially horizontal wire between devices for inter-device signal transmission/communication. The "first" interconnect layer refers to the lowest interconnect layer. Notably, with the techniques introduces here, the first interconnect layer is device specific; that is to say, in some embodiments, the first interconnect for one device may be different than that for another device, even when both devices are fabricated on the same wafer.

Pre-PD Homogeneous Bonding

Figure 1B:
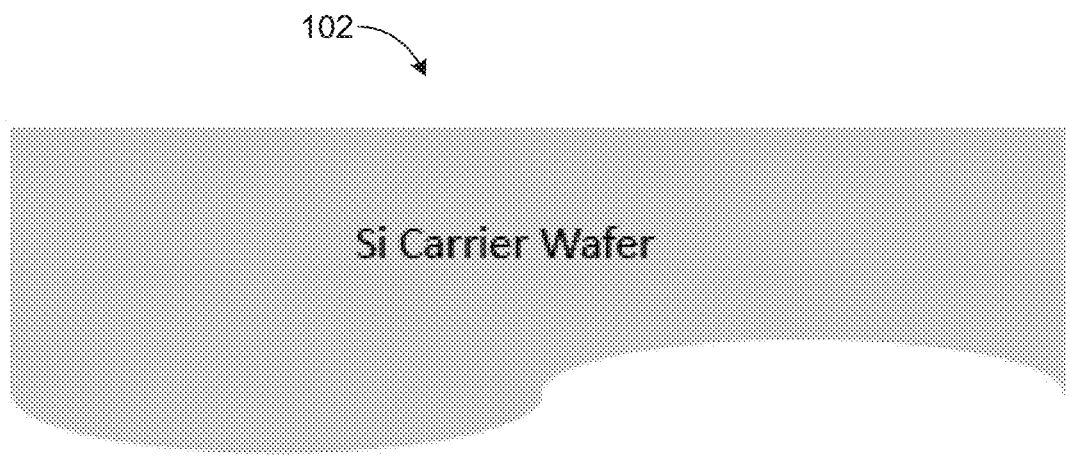
Figure 1C:
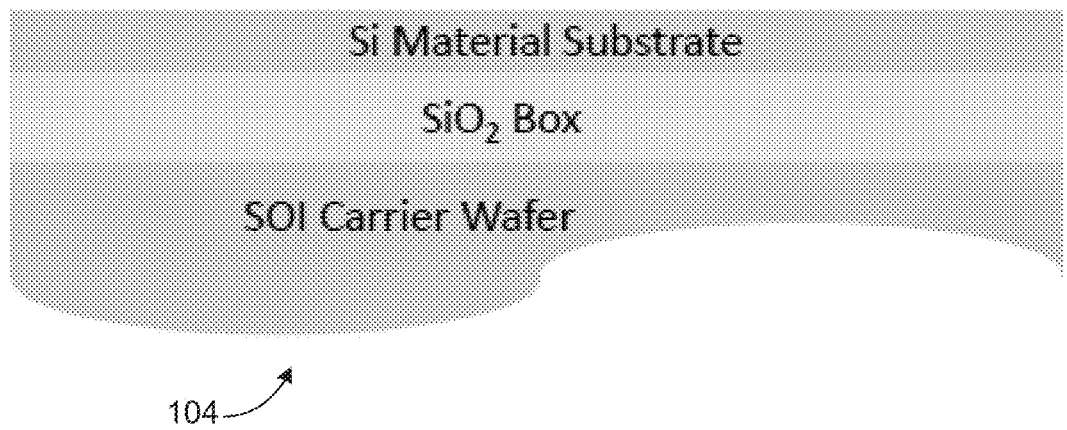

FIGS. 1A-1C are cross-sectional views of embodiments 100, 102, and 104 of a carrier wafer. To reduce or even completely avoid the aforementioned leakage current issue caused by the dense defect layer, one approach is to first prepare high quality Si$_x$Ge$_{1-x}$ on a substrate of a donor wafer (may also be referred to herein as a transfer wafer), and then transfer the high quality material to a separate Si material substrate via "wafer bonding" to a carrier wafer. The introduced fabrication technique involves wafer bonding of at least two wafers: a donor (transfer) wafer, and a carrier wafer. The donor wafer is a substrate wafer with the high quality photosensitive material layers to be transferred. The carrier wafer is a substrate wafer to which the desired transfer material is be transferred. Note that the term "donor wafer" and "carrier wafer" are used in a relative sense. It is possible to combine the pre-PD wafer bonding techniques (e.g., pre-PD homogeneous wafer bonding or pre-PD heterogeneous wafer bonding) with other suitable wafer bonding techniques (e.g., the post-PD wafer bonding) introduced here; therefore, there may exist multiple carriers wafers if multiple wafer bonding steps are implemented in a certain application.

In FIG. 1A, the prepared carrier wafer 100 is a silicon (Si) wafer. The carrier wafer 100 can be doped with N-type dopants 110 at the surface of the wafer 100. The doped layer 110 can be accomplished by various known methods, such as implantation, or in-situ doping and diffusion. In one or more examples, the carrier wafer may not be doped with impurities, such as the carrier wafer 102 shown in FIG. 1B. Alternatively, as shown in FIG. 1C, the carrier wafer 104 may be of a silicon-on-insulator (SOI) type. Each carrier wafer can be doped differently, in terms of the doping profile and the impurity type, according to a desired photodiode design.

Figure 2A:
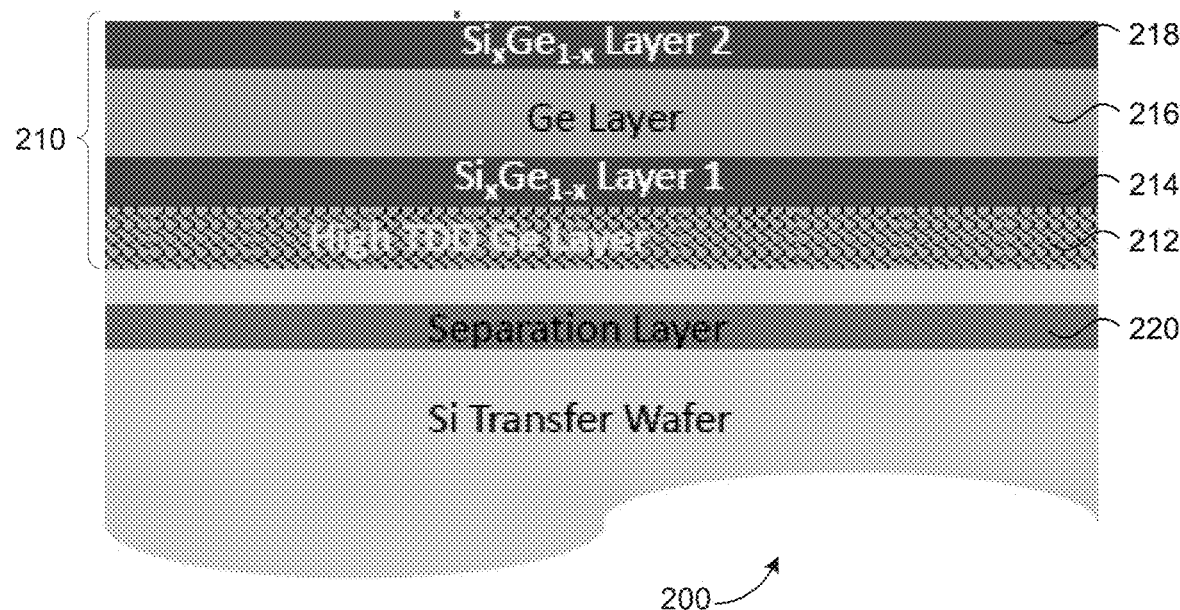
FIGS. 2A-2B are example processes that can be performed on a donor wafer (also referred to as a transfer wafer) for forming photosensitive materials on the donor wafer.
Figure 2B:
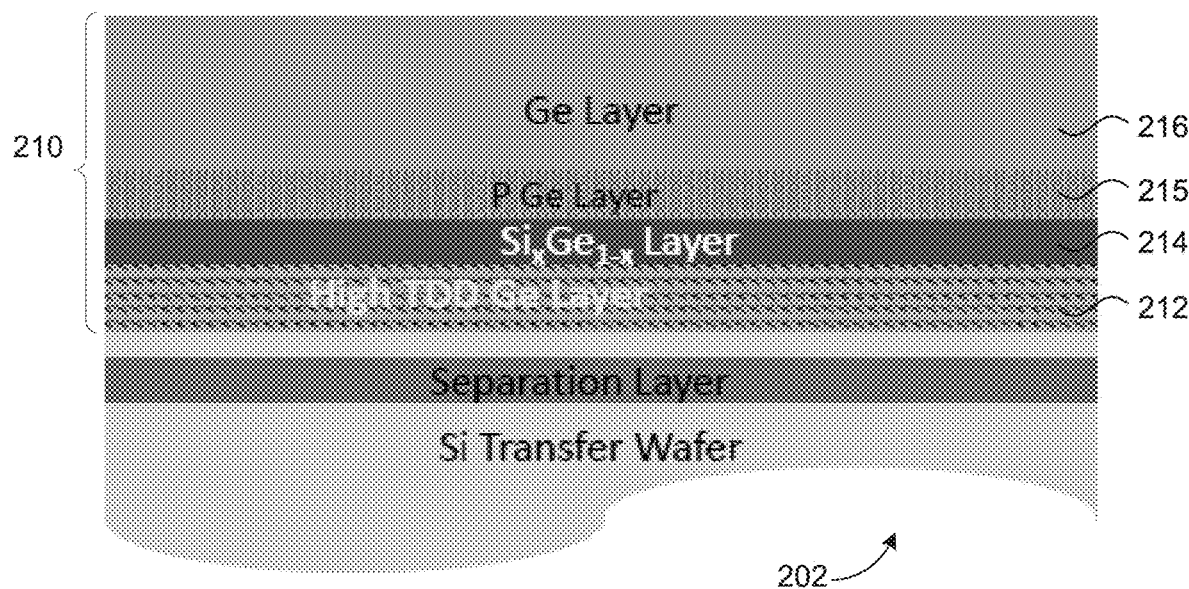

FIGS. 2A-2B are example processes that can be performed on a donor wafer 200 for forming photosensitive materials 210 on the donor wafer 200.

In the embodiment shown in FIG. 2A, the donor wafer 200 includes an optional separation layer 220 within the Si donor wafer 200. The exact depth of the separation layer 220 may vary according to the PD design. The separation layer 220 may be created by, for example, hydrogen implantation and/or impurity implantation. The doping profile of the donor wafer 200 can be customized to a specific PD design. Note that if a hydrogen implantation approach is used to form the separation layer 220, then the hydrogen implantation approach should be applied after the photosensitive materials are formed.

Then, the photosensitive material layer 210 that contains the main target of the transfer can be formed by epitaxial growth. In this example, the photosensitive material includes germanium (Ge). The Ge layer 210 can be formed by blanket epitaxy growth or selective epitaxy growth. As discussed above, a direct epitaxial growth of Ge on top of Si may result in a defect layer 212 high in threading dislocation density (TDD) due to a 4% lattice mismatch between Si and Ge materials. This dense defect layer 212 is typically at least 30 nm in thickness. As the material continues to grow above the high TDD Ge layer 212, the Ge material quality typically improves significantly.

In accordance with a number of embodiments, the layers that are the actual target of the transfer in the photosensitive material layer 210 include a pure Ge layer 216 and two $Si_xGe_{1-x}$ layers 214 and 218. The $Si_xGe_{1-x}$ layers may be formed unintentionally by thermal-induced intermixing or intentionally for various purposes including, for example, as an etch/polish stop, a diffusion barrier, a TDD blocking layer, a quantum well, and/or for bandgap engineering purposes. The dimension and other properties of the photosensitive material layers 214, 216, and 218 may be configured according to the photodiode device design of choice. Additionally, the epitaxially grown layer 210 may be annealed at a high temperature (e.g., between 700° C. to 900° C.) after the growth to improve crystal quality. Note that the definition of $Si_xGe_{1-x}$ (where $0 \leq x < 1$) layer naturally include the pure Ge layer; therefore, it should be understood that the term $Si_xGe_{1-x}$ layer should encompass all Ge layers that are grown on Si. However, for purposes of easier illustration, $Si_xGe_{1-x}$ layers having different Si/Ge ratios are shown as different layers. Therefore, a person having ordinary skills in the art should understand that these layers are illustrated in a relative sense, and that there may not be an exact boundary between given two consecutive $Si_xGe_{1-x}$ layers.

In the embodiment of donor wafer 202 shown in FIG. 2B, the photosensitive material layer 210 include only one $Si_xGe_{1-x}$ layer 214, but include a P doped Ge layer 215 between the $Si_xGe_{1-x}$ layer 214 and the Ge layer 216. As discussed, the $Si_xGe_{1-x}$ film(s) may be doped to certain doping profiles according to desired device designs. It is noted that, in some variations, the high TDD Ge Layer 212 may not necessarily exist. In other variants, the separation layer 220 and the one or more $Si_xGe_{1-x}$ layers may not be present. Additionally or alternatively, there may be more than one $Si_xGe_{1-x}$ layer of various "x" values present, and/or the $Si_xGe_{1-x}$ layer may be a film of continuously graded "x" value. In yet some other embodiments, the photosensitive material layer 210 may be formed on or sourced from a germanium-on-insulator (GOI) wafer or a Ge substrate wafer.

Figure 3A:
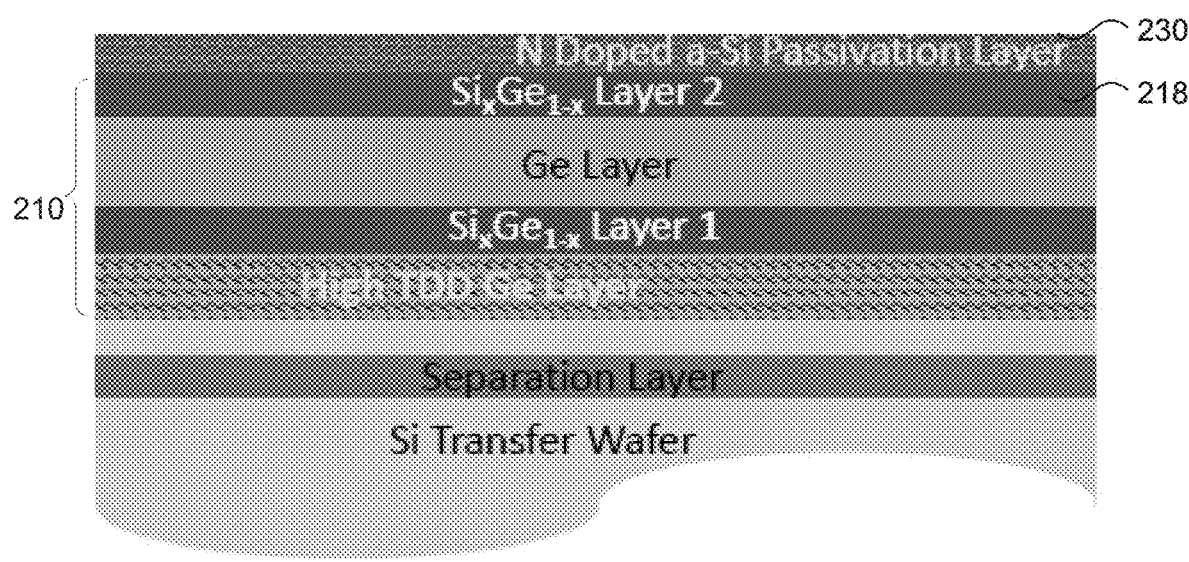
FIGS. 3A-3C are example processes that can be performed on the donor wafer for passivation bonding layer preparation.
Figure 3B:
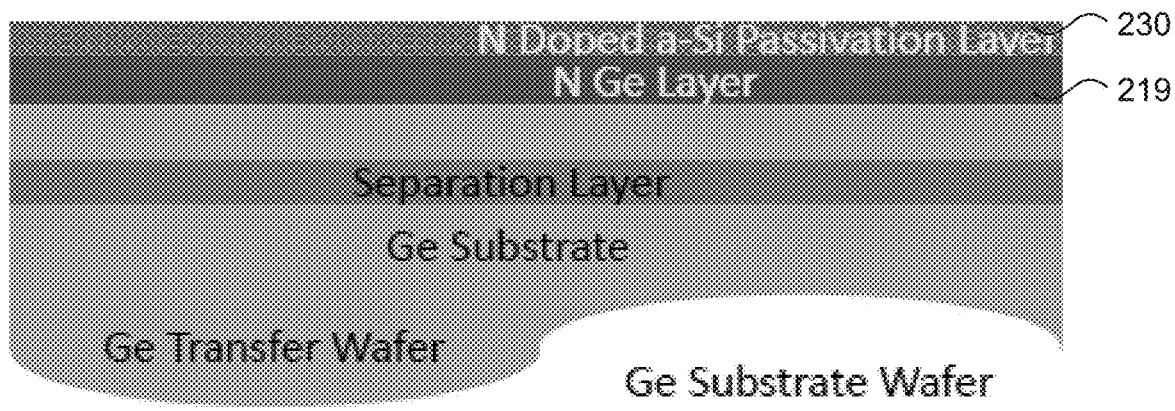
Figure 3C:
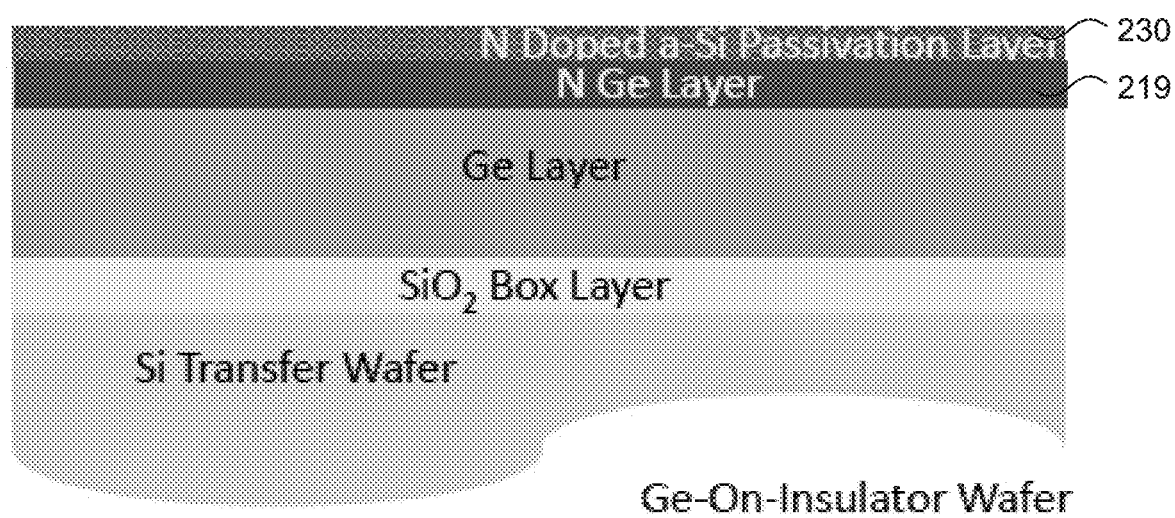

FIGS. 3A-3C are example processes that can be performed on the donor wafer for passivation bonding layer preparation.

In the embodiment shown in FIG. 3A, an amorphous Si layer 230 ("a-Si") is deposited on the $Si_xGe_{1-x}$ film layer 218's surface as a passivation layer. Specifically, the a-Si layer 230 is to be formed on the separately prepared $Si_xGe_{1-x}$ layer 218's surface prior to the wafer bonding. Example thickness for this a-Si layer 230 can be from 20 nm to 2 μm. In one example, the thickness of the a-Si layer 230 is around 50 nm to 100 nm. Besides a-Si, other materials for the passivation layer 230 can include poly-crystalline Si, single-crystalline Silicon, or any suitable combination thereof. Note that depositing single or poly crystalline Si passivation layers over Ge could as well lead to TDD formation due to the 4% lattice mismatch. However, the formed TDD in this particular case would be located mainly inside the Si passivation layer 230 rather than the Ge photosensitive layer 210, and therefore the TDD formed here has a much less impact to the PD's performance compared to those defects located inside the Ge photosensitive layer 210.

Furthermore, this a-Si layer 230 and the $Si_xGe_{1-x}$ layer 218 can be both implanted with dopants, such as phosphorus (P), arsenic (As), antimony (Sb) for N-type dopants, or boron (B) for P-type dopants. The implantation depth of the dopants may vary as needed by the device design. The implanted dopants can be activated processes such as rapid thermal annealing (RTA). Note that the a-Si passivation layer 230 may change into poly-crystalline Si during doping activation.

After the passivation layer 230 is formed atop of the photosensitive material layer 210, the smoothness of the top surface of the a-Si passivation layer 230 should be maintained for a successful wafer bonding process later. Other processes can also be performed to the donor wafer prior to the wafer bonding process to improve the material quality and/or enhance the wafer bonding process if needed. For example, according to one or more embodiments, the bonding surface should be smooth for better wafer bonding results. These processes may include, but not limited to, impurity doping, wafer polishing, capping layer forming, laser annealing, and/or pattern etching.

With simultaneous reference to FIG. 1A, in the embodiment shown in FIG. 3A, the bonding surface material layer 230 is deliberately selected to be of the same doping type as the surface layer 110 of the carrier wafer 100, that is, "N-type" a-Si layer 230 to "N-type" Si layer 110 bond. This type of bonding is desirable because high level of common type doping can prevent a photodiode depletion region (or "quasi-neutral region") from extending into the defective interface-layer, which is a main reason for the detrimental device leakage current to incur at the defect sites.

There are several advantages of this passivation layer formation introduced here. It has been demonstrated that device leakage current can be reduced by applying passivating materials to $Si_xGe_{1-x}$ surface. Here, the a-Si layer 230 may serve as a passivation layer for the $Si_xGe_{1-x}$ material surface 218. This can generally reduce surface dangling bonds, thereby reducing device leakage current. The Si material is also more stable than the $Si_xGe_{1-x}$ material (especially for high Ge contents), and therefore the technique introduced here changes the bonding interface from "$Si_xGe_{1-x}$ to Si" to "Si to Si," thereby simplifying the wafer bonding process as well as improving the bonding results. In addition, the bonding surface (i.e., the resulting material interface layer after the bonding) will not be in direct contact with the $Si_xGe_{1-x}$ material layers that are critical to device performance, thereby reducing or avoiding common negative impacts to device performance, yield, and reliability, that are induced by interface layer bonded with heterogeneous materials.

In some alternative embodiments, the a-Si layer 230 may be partially or entirely replaced by any semiconductor material that is not $Si_xGe_{1-x}$ while possessing passivation effects to the $Si_xGe_{1-x}$ surface. An example of such semiconductor material is gallium arsenide (GaAs) with lattice matched to Ge.

FIGS. 3B and 3C show two additional embodiments. In FIG. 3B, the carrier wafer is a Ge substrate wafer and there is no $Si_xGe_{1-x}$ surface. Instead, the a-Si passivation layer 230 is formed on a N-doped Ge layer 219. In FIG. 3C, the carrier wafer is a GOI wafer and there is no $Si_xGe_{1-x}$ surface or separation layer. Similar to the embodiment shown in FIG. 3B, the a-Si passivation layer 230 is formed on a N-doped Ge layer 219. The buffered oxide (BOX) layer in the GOI wafer can serve as the separation layer. More specifically, in some examples, the BOX layer can serve as an etching stop layer during post-bonding material removal processes. Notably, in these alternative embodiments, there is no high TDD Ge layer 212 since there is no direct growth of Ge on Si.

Figure 4:
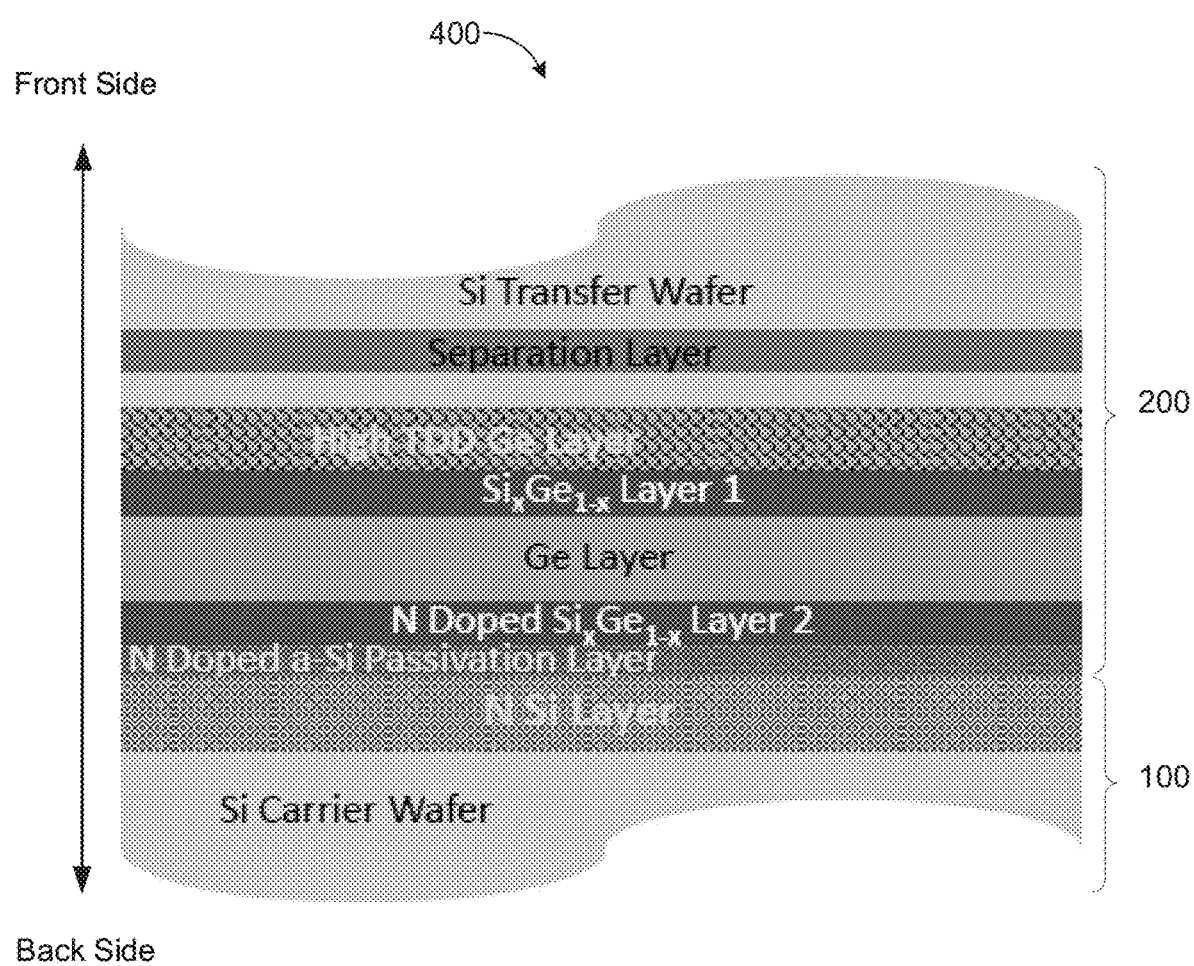
FIG. 4 is a cross-sectional view of an embodiment after a wafer bonding process, bonding the donor wafer and the carrier wafer together.

FIG. 4 is a cross-sectional view of an embodiment 400 after a wafer bonding process that bonds the donor wafer 200 and the carrier wafer 100 together. As illustrated in FIG. 4, the Si donor wafer 200 is flipped up-side-down, and then wafer bonded to the Si carrier wafer 100. In various embodiments, both the donor wafer 200's bonding surface and the carrier wafer 100's bonding surface should be smooth for successful wafer bonding. As discussed above, material layers similar to the passivation layer 230 may be deposited on the surface of the carrier wafer 100 if needed. The wafer bonding process may include, but not limited to, dry wafer bonding, wet wafer bonding, chemical wafer bonding, direct bonding, plasma activated bonding, or surface activated bonding. In some embodiments, a number of thermal or pressurized processes may be applied to enhance bonding strength of the wafers. In some embodiments, the Si carrier wafer may be patterned before the bonding, depending on the design.

It is noted that the technique introduced above may correspond to a set of unique structure orientations that include: a layer of Si material (e.g., amorphous Si, poly-crystalline Si, single crystalline Si, or a combination thereof) between a single-crystalline $Si_xGe_{1-x}$ layer and a single-crystalline Si material substrate; and/or a layer of semiconductor material that is not $Si_xGe_{1-x}$, between a single-crystalline $Si_xGe_{1-x}$ layer and a single-crystalline Si material substrate.

Figure 5:
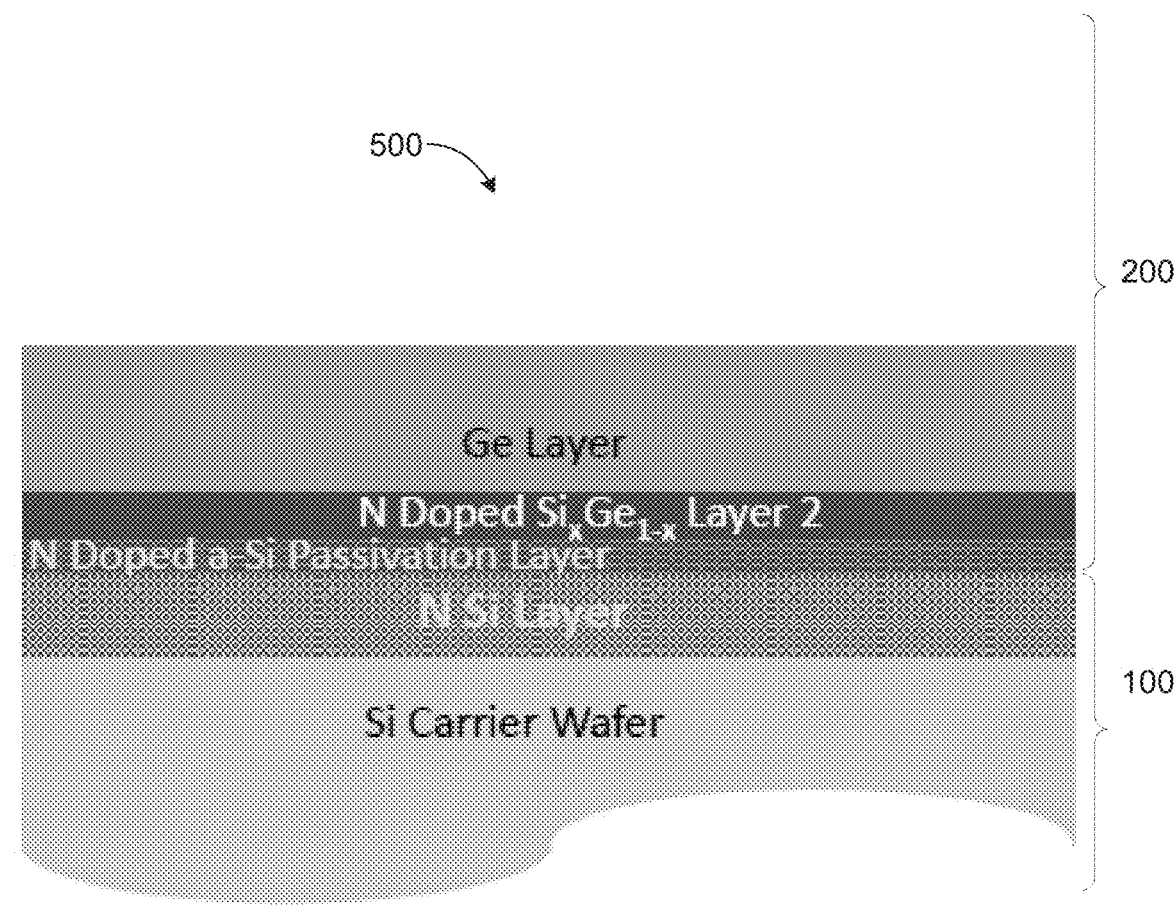
FIG. 5 is a cross-sectional view of an embodiment after a post-bonding material removal process.

FIG. 5 is a cross-sectional view of an embodiment 500, which is the embodiment 400 after a post-bonding material removal process.

In the embodiment shown in FIG. 5, the Si substrate from the donor wafer 200 has been removed. Material removal may be accomplished by, for example, wafer splitting, chemical etching, chemical-mechanical-polish (CMP) or wafer lapping. The separation layer 220 (see FIG. 2A) can function as a stop layer such that a faster but coarser-grain material removal process (e.g., CMP) can be first applied, and then a slower but finer-grain material removal process (e.g., chemical etching with high selectivity chemicals) can be used thereafter.

As shown in FIG. 5, the high TDD Ge layer 212 is also removed. This layer 212's removal is optional depending on the quality of the transfer film (e.g., generally, the photosensitive $Si_xGe_{1-x}$ material layers 210). It is noted, nonetheless, that the ability to remove the high TDD Ge layer 212 can alleviate the leakage current issue of the PD devices, and therefore is considered one of the major benefits that the current technique provides. For the removal of the high TDD Ge layer 212, the $Si_xGe_{1-x}$ layer 214 may be used as an etch/polishing stop layer. Optionally, the $Si_xGe_{1-x}$ 214 is removed, such as shown in FIG. 5. Whether to remove this layer 214 depends on device design. In some implementations, the high TDD Ge layer 212 may be removed, for example, by applying laser annealing techniques to recover this highly defective region.

Figure 6A:
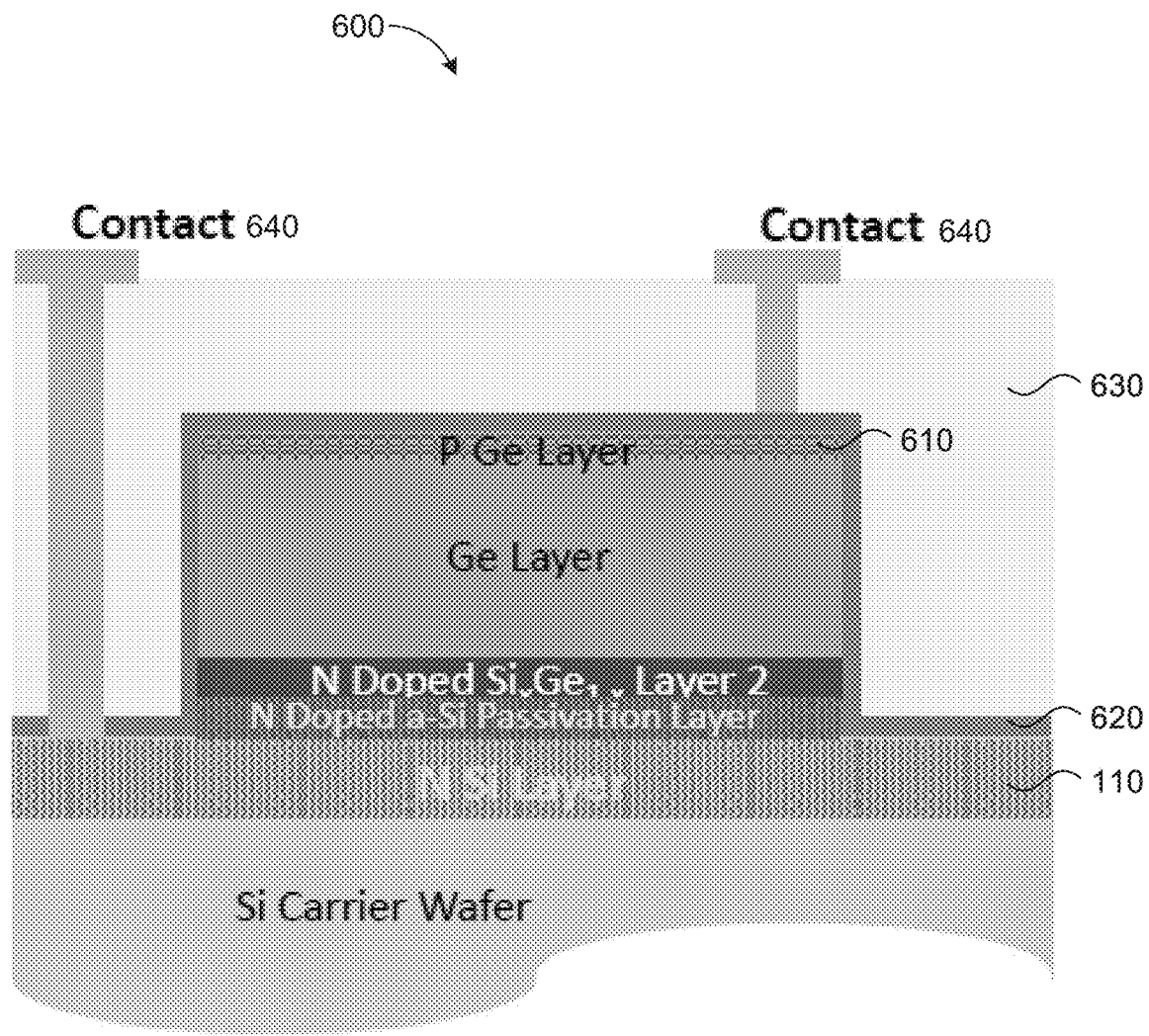
FIGS. 6A-6B are embodiments of photodetectors fabricated with components that are formed using techniques introduced here.
Figure 6B:
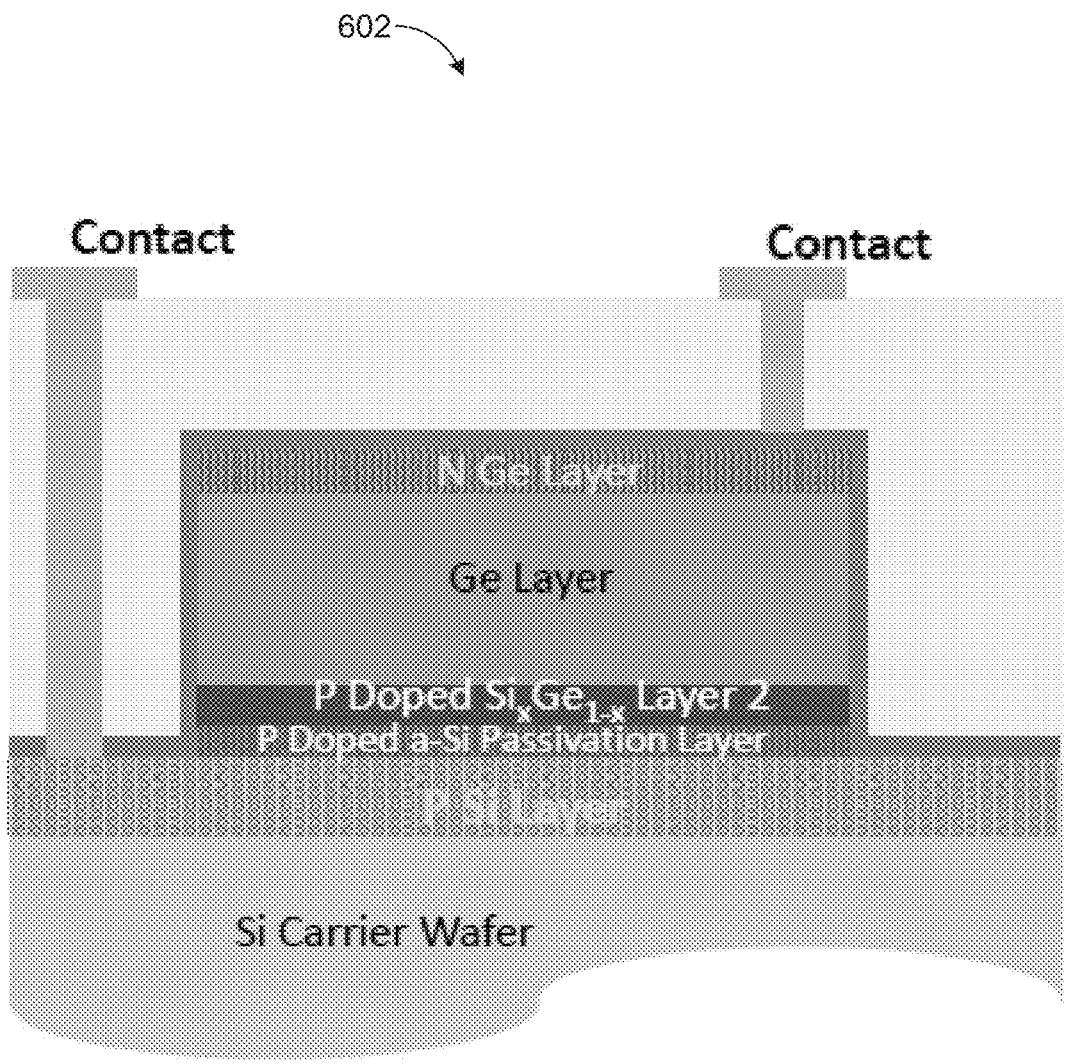

FIGS. 6A-6B are embodiments of photodetectors fabricated with components that are formed using techniques introduced here. With the structure created in FIG. 5, PD with high quality photosensitive materials and without the high TDD Ge layer 212 can be fabricated.

In the embodiment shown in FIG. 6A, an isolated "island" shape structure, called "mesa," is etched on the embodiment 500 to create the main photodiode structure for PD 600. P-type dopants are implanted into the top surface of the photodiode mesa forming a P Ge layer 610 for the P contact, thereby creating a P-I-N photodiode structure. As shown in FIG. 6A, a passivation layer 620 may be optionally applied to cover the PD 600's photodiode mesa. The passivation layer 620 can include, but not limited to, a-Si, poly-crystalline Si, single crystalline Si, silicon oxide, silicon nitride, aluminum oxide, or any combination thereof. Thereafter, a dielectric layer 630 is deposited and planarized. Contact vias 640 are then formed, filled with contact materials (e.g., metal). Next, one or more anti-reflection coating (ARC) layers (not shown for simplicity) may be formed on top of PD 600 to improve quantum efficiency. In some implementations, the passivation layer 620 can be formed after the formation of the dielectric layer 630. In these implementations, the dielectric layer 630 can be formed, for example, either before or after the wafer bonding process described above. Note that, in these examples, the passivation layer 620 may not exist between the interface of dielectric layer 630 and the N—Si layer 110.

Shown in FIG. 6B is an alternative PD embodiment 602 where the polarity of the photodiode is the opposite of PD 600. Other PD variants include different doping profiles and/or different layer structures within the transfer film.

Pre-PD Heterogeneous Bonding

Figure 7:
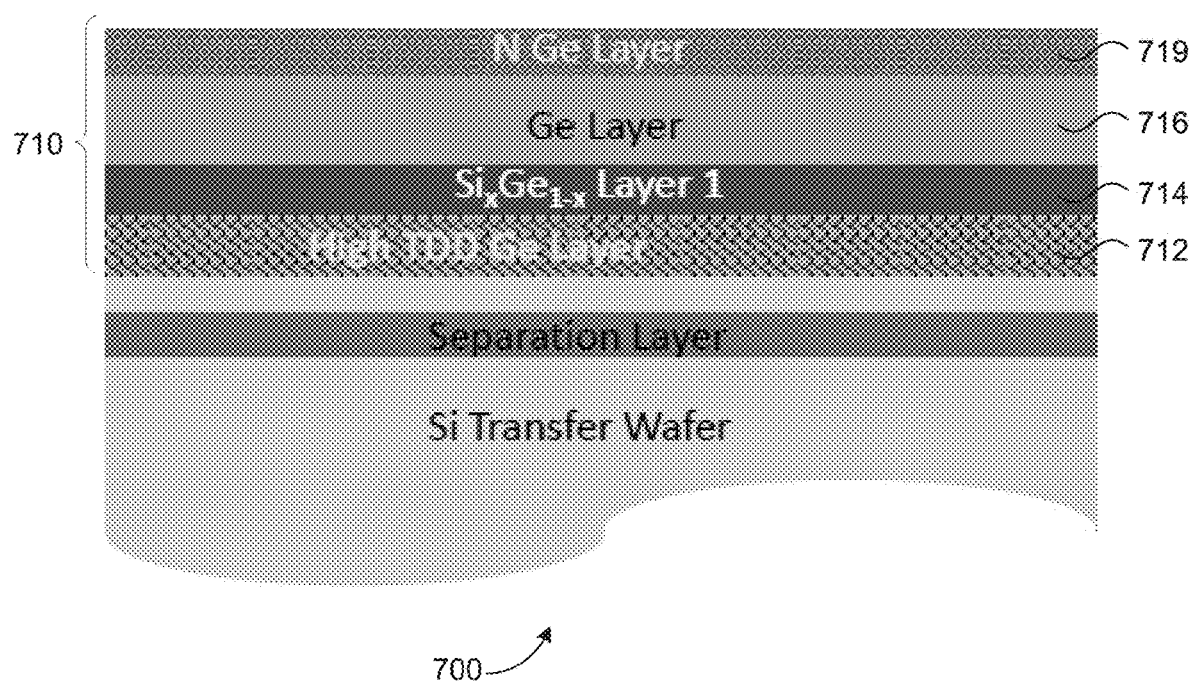
FIG. 7 is an alternative example process that can be performed on the donor wafer for forming photosensitive materials on the donor wafer.

FIG. 7 is an alternative example process that can be performed on the donor wafer for forming photosensitive materials on the donor wafer. In the alternative process, the carrier wafer preparation steps are the same as those introduced in FIGS. 1A-1C. The photosensitive material growth steps are also similar to those introduced in FIGS. 2A-2B, but with some variations. However, this alternative process does not include the passivation layer formation steps that are introduced in FIGS. 3A-3C above.

More specifically, after the hetero-epitaxial growth of photosensitive material Ge on a Si material donor wafer 700 (forming, in the growing process, the high TDD Ge layer 712, the thin film $Si_xGe_{1-x}$ layers 714 and eventually the pure Ge layer 716), this alternative process proceeds directly to the wafer bonding and the layer transfer of $Si_xGe_{1-x}$ films 710 to a separate Si material carrier wafer (e.g., carrier wafer 100).

The Ge material layer structure 710 may include different layer material composition, impurity doping profile and impurity dopant species. In some embodiments, the Si material donor wafer 700 may be of other types of wafer substrates, such as SOI wafers. The materials layers may be configured according to specific photodiode designs if needed. For example, the $Si_xGe_{1-x}$ films may be doped to specific doping profiles. Specific doping profiles may be used for purposes such as Ohmic contact formation, electric field control, and/or surface states passivation. In some embodiments, the transfer $Si_xGe_{1-x}$ film may consist of various $Si_xGe_{1-x}$ layers with different "x" composition values. Such layers may have specific effects such as, but not limited to, diffusion block, quantum well, TDD propagation blocking, bandgap engineering, and/or etch stop.

As shown in the embodiment of FIG. 7, the top surface of the $Si_xGe_{1-x}$ epitaxial layer is doped with N-type dopant to form an N-type Ge layer 719. In one or more embodiments, the doping concentrations is $5 \times 10^{18}$ cm$^{-3}$ within a depth of about 10 nm to 200 nm.

Specifically, it is noted that transferring high quality $Si_xGe_{1-x}$ from a transfer carrier substrate to a separate Si material substrate via "wafer bonding" techniques may have an adverse impact on the resulting PD's dark current characteristics. This is because such wafer bonding approaches often result in a heterogeneous interface layer (typically only a few nanometers in thickness) between bonded materials. However, this heterogeneous interface layer is often found to contain elements such as oxygen and carbon. It may also contain any contaminants present on the wafer surfaces prior to bonding, such as oxidized materials, compounds. These contaminants are detrimental to device operation if found within the active region of semiconductor devices.

With the technique introduced here, the bonding interface, where the heterogeneous interface layer is, is encompassed within high dopant concentration regions. According to the present disclosure, the bonding surface of $Si_xGe_{1-x}$ layers on wafer 700 and the surface of Si material carrier wafer 100 should not be of highly opposite doping polarity that can form an p-n junction. An p-n junction, if formed by and at the heterogeneous bonding interface, can be severely detrimental to the device performance. Such p-n junction can be avoided if the heterogeneous bonding interface is buried (implanted) within high doping levels of the same dopant types, because then the photodiode active region will terminate prior to reaching the highly doped heterogeneous bonding interface. For purposes of discussion herein, high opposite doping polarity is defined as both layers being doped with opposite dopant types at concentrations of $>1 \times 10^{17}$ cm$^{-3}$.

In some implementations, the $Si_xGe_{1-x}$ and Si material substrate surface are both doped as high N-type. As an alternative, they can be both doped as high P-type. In other examples, one of the two surfaces of $Si_xGe_{1-x}$ and Si material substrate is doped high as N-type and the other surface is intrinsic or unintentionally doped by either dopant types at less than a doping concentration level of $1 \times 10^{17}$ cm$^{-3}$. Note that the high level of N-dopants may diffuse over the heterogeneous bonding interface in the fabrication steps that are after the wafer bonding process. In variations, one of the two surfaces of $Si_xGe_{1-x}$ and Si material substrate is doped high as P-type and the other surface is intrinsic or unintentionally doped by either dopant types at less than a doping concentration level of $1 \times 10^{17}$ cm$^{-3}$. Note that the high level of P-dopants may diffuse over the heterogeneous bonding interface in the fabrication steps that are after the wafer bonding process.

Figure 8:
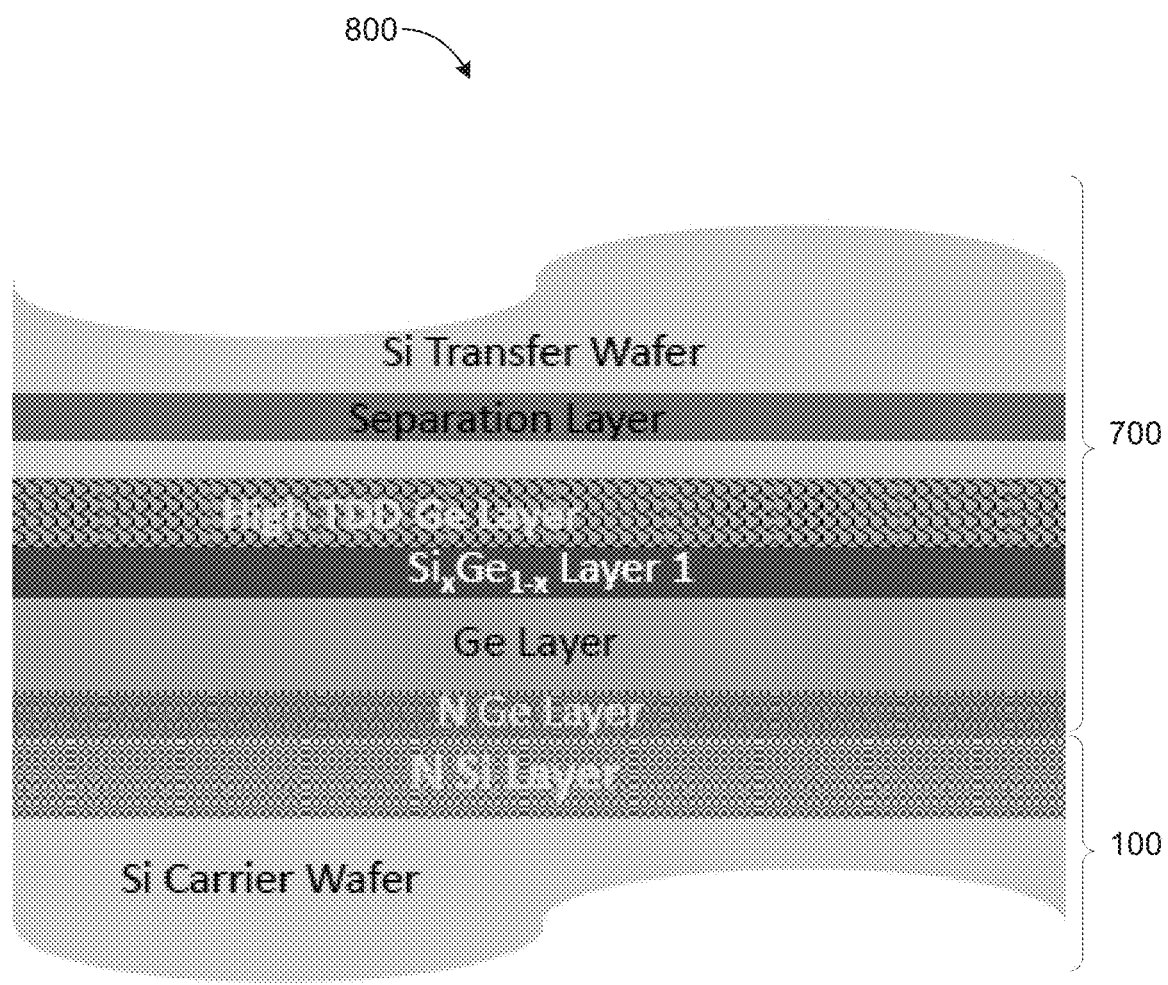
FIG. 8 is a cross-sectional view of an alternative embodiment after a wafer bonding process, bonding the donor wafer and the carrier wafer together.

FIG. 8 is a cross-sectional view of an alternative embodiment 800 after a wafer bonding process, bonding the donor wafer 700 and the carrier wafer 100 together. Specifically, in this example embodiment 800, the Si transfer wafer 700 is flipped up-side-down and wafer bonded to the Si carrier wafer 100. According to at least some embodiments of the present disclosure, the Si carrier wafer 100's surface should be smooth for successful wafer bonding. The wafer bonding process may be achieved by, for example, dry wafer bonding, wet wafer bonding, chemical wafer bonding, direct bonding, plasma assisted wafer bonding, or surface activated bonding. Thermal processes may be applied to enhance bonding strength of the wafers.

Figure 9:
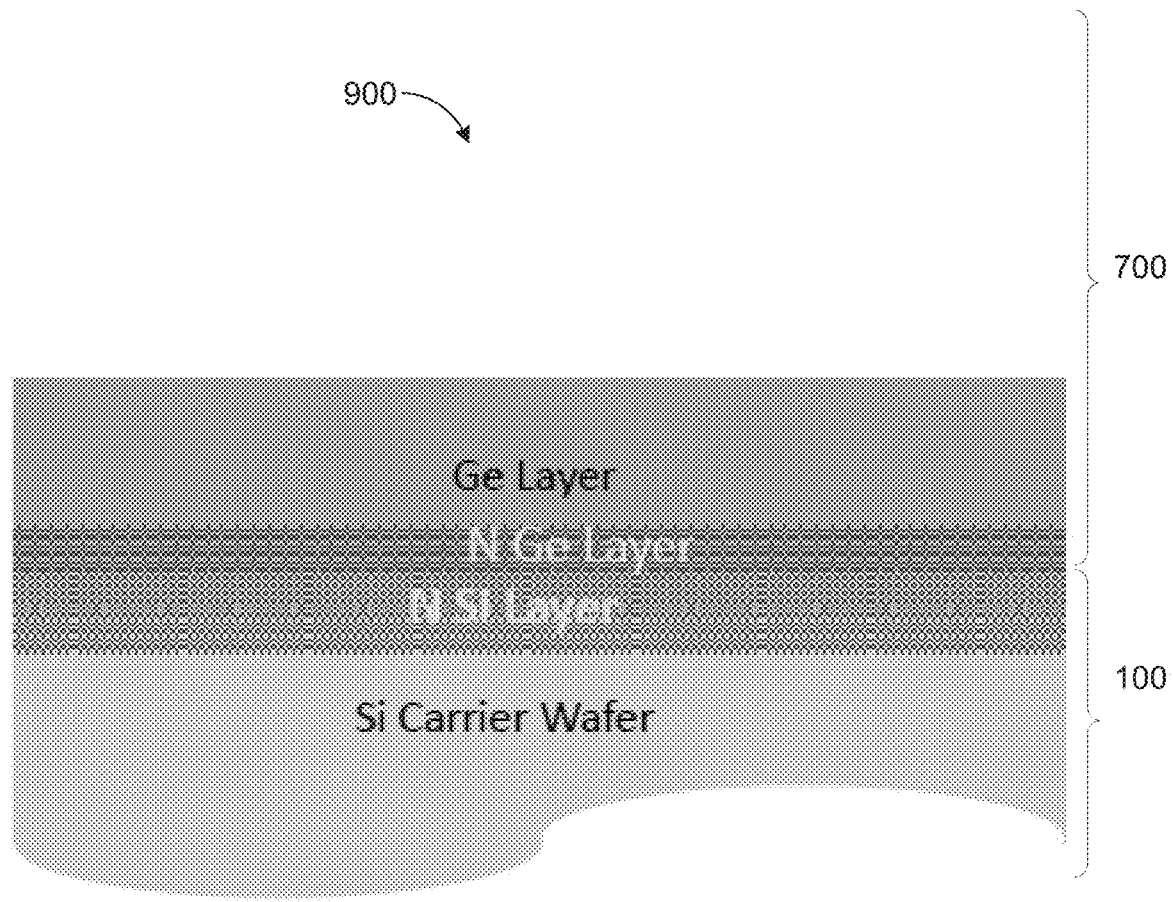
FIG. 9 is a cross-sectional view of the alternative embodiment of FIG. 8 after a post-bonding material removal process.

FIG. 9 is a cross-sectional view of the alternative embodiment of FIG. 8 after a post-bonding material removal process.

In the embodiment shown in FIG. 9, the Si substrate from the donor wafer 700 has been removed. Material removal may be accomplished by, for example, wafer splitting, chemical etching, chemical-mechanical-polish (CMP) or wafer lapping. The high TDD Ge layer 712 is also removed. This layer 712's removal may be optional depending on the quality of the transfer film. It is noted, nonetheless, that the ability to remove the high TDD Ge layer 712 can alleviate the leakage current issue of the PD devices, and therefore is considered one of the major benefits that the current technique provides. For the removal of the high TDD Ge layer 712, the $Si_xGe_{1-x}$ layer 714 may be used as an etch/polishing stop layer. Optionally, the $Si_xGe_{1-x}$ 714 is removed, such as shown in FIG. 9. Whether to remove this layer 714 depends on device design. In some implementations, the high TDD Ge layer 712 may be removed, for example, by applying laser annealing techniques to recover this highly defective region.

The technique may serve as a simplified version of the FIGS. 1A-5, and provide the benefits of (1) reduced leakage current (dark current) originated from the high threading dislocation defect density layer, which is originated from Ge and Si lattice mismatch during hetero-epitaxial $Si_xGe_{1-x}$ material growth; (2) reduced photo-generated carrier recombination loss from the high threading dislocation defect density layer; (3) mitigated negative performance impact to photodiode from wafer bonding hetero-interface layer by encompassing the hetero-interface layer within high impurity dopants; and (4) improved dopant diffusion control within photodiode from reduced thermal budget as a result of the wafer bonded photodiode fabrication.

It is noted that the technique introduced above may correspond to a unique structure that includes: the lacking of high TDD region within photodiode's $Si_xGe_{1-x}$ layer; the hetero-interface layer due to wafer bonding is buried under high levels of dopant concentration ($>1 \times 10^{17}$ cm$^{-3}$); and the fabricated photodiode becomes located in between the transferred material film and the Si substrate material. In other words, the resulting photodiode is not completely confined within the transferred material film.

Post-PD Bonding

Figure 10A:
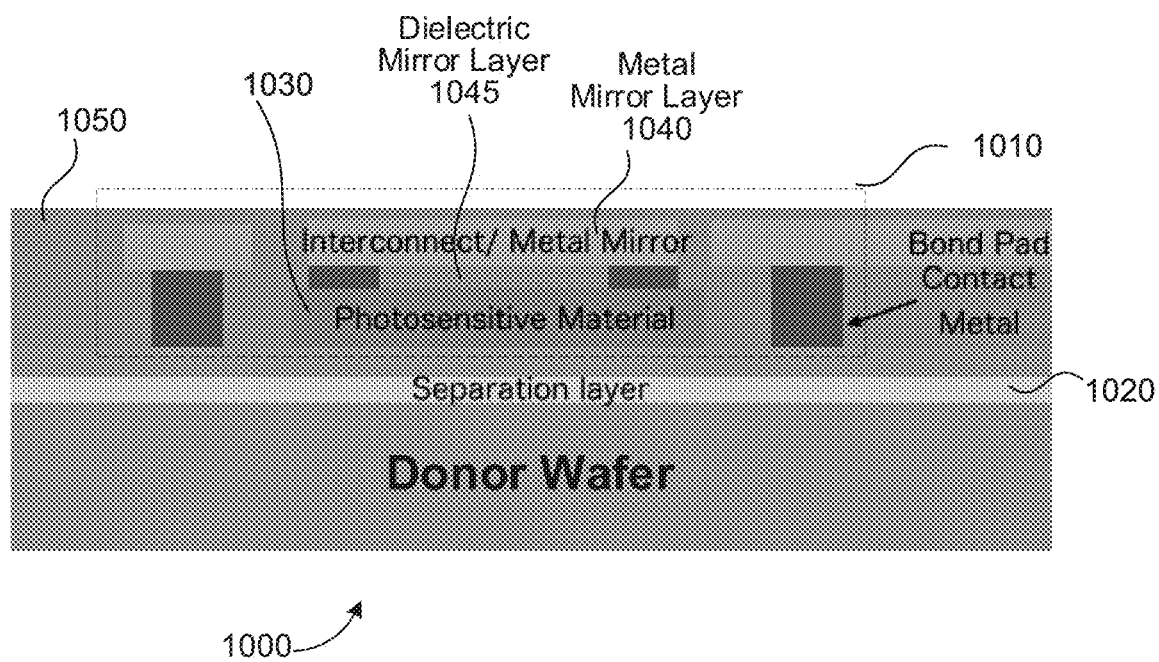
FIGS. 10A-10C are an example flow for bonding a donor wafer and a carrier wafer after forming the photodetectors on the donor wafer.
Figure 10B:
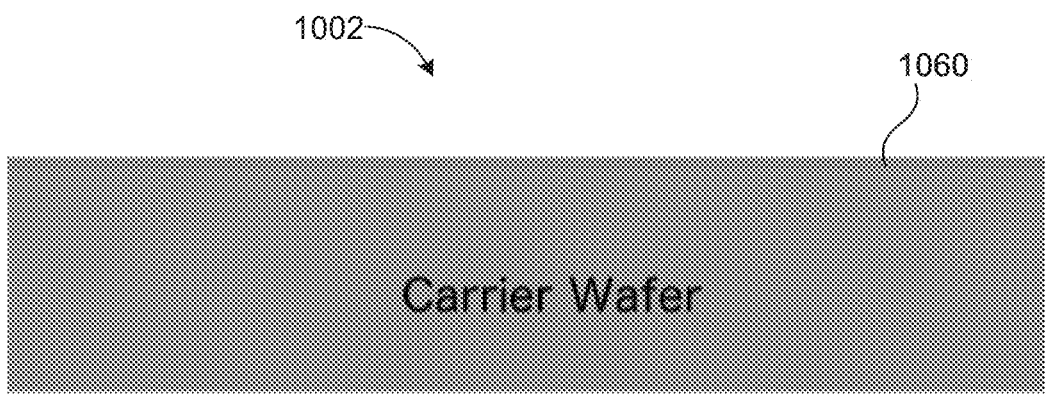
Figure 10C:
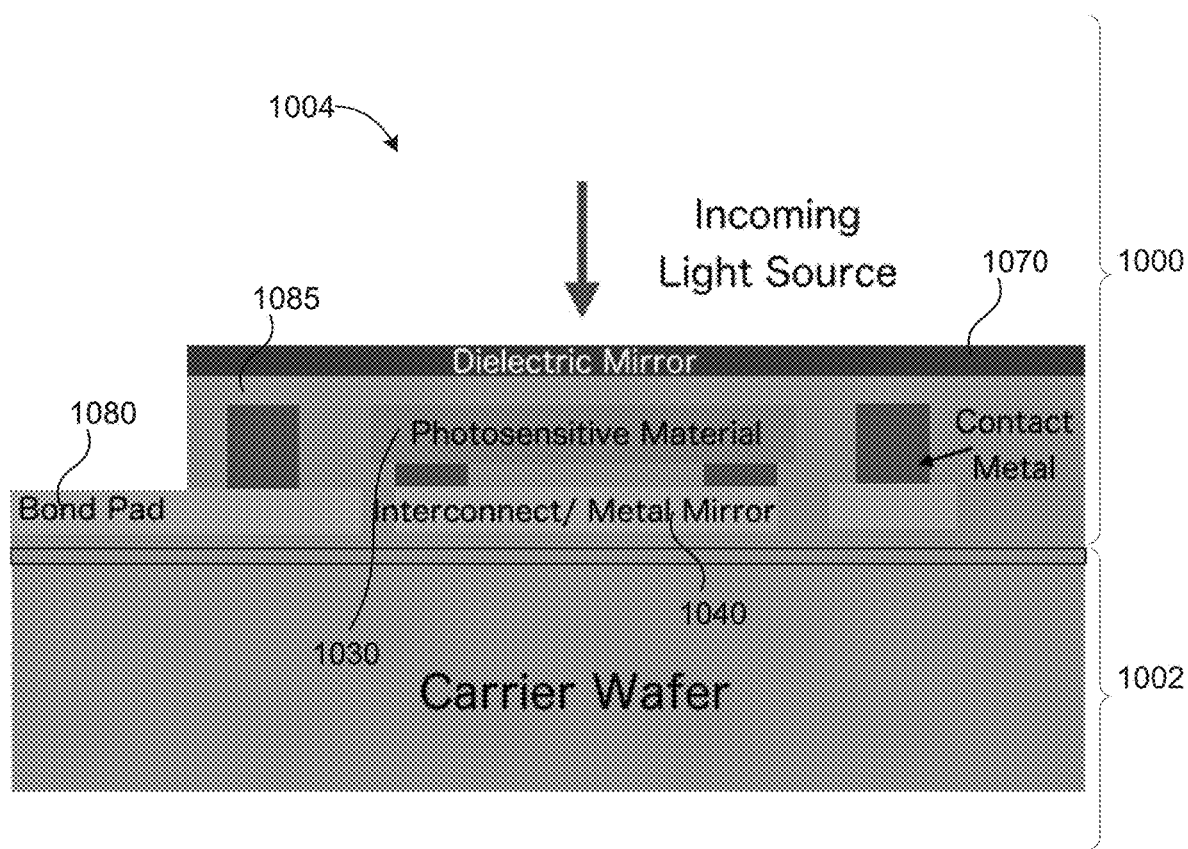

FIGS. 10A-10C are an example flow for bonding a donor wafer and a carrier wafer after forming the photodetectors on the donor wafer. For purposes of discussion herein, a high performance PD (or "multi-pass PD") includes one or more mirror structures for reflecting the incident light so as to create multiple passes of the incident light in the light absorption or photosensitive region of the PD. The mirror structure(s) can, therefore, generally increase the quantum efficiency of the PD. Some example HP-PD designs include, for example, a double mirror photonic lock PD, and single mirror multiple pass PD.

Aside from the dark current issue caused by the high TDD layer in Ge mentioned above, it is further observed that the design and fabrication of a normal incidence high performance PD (HP-PD) is generally limited by the following constraints.

First, back side incidence design. Due to process feasibility, a conventional, mirror-equipped PD may be inclined to adopt a back side incidence type of design (where light is incident from the back side of the wafer that carries the photodetector such that a reflective mirror can be formed on the front side of the photodetector). However, the back side incidence type PD is often limited in the spectrum range—the range is generally narrower because being limited by substrate absorption.

Second, semiconductor-on-insulator (SOI) wafer. In certain occasions, an SOI wafer is called for by the design of an HP-PD because the PD design may use the buried oxide (BOX) layer in the SOI wafer as a dielectric mirror. However, processing SOI wafers is generally more difficult in many semiconductor fabrication foundries due to reliability concerns, and hence having to use SOI wafers is not favorable for integration of normal incidence PDs and CMOS field effect transistors (FETs).

Accordingly, with the aforementioned pre-PD wafer bonding techniques in mind, a post-PD wafer bonding technique is introduced below. The disclosed HP-PD structure sand their associated technique can enable high performance PD designs with one or more mirror structures without the need to use SOI wafers. The technique introduced here utilizes a series of bulk substrate to implement high performance PD structures based on wafer-to-wafer bonding. Utilizing bulk semiconductor wafers instead of SOI wafers makes HP-PD designs easier to fit into mainstream CMOS processes. The aforementioned substrate absorption related issues for back side incidence HP-PDs can also be reduced or even avoided. Note that this technique is applicable to both discrete PDs and the integration of PDs and CMOS based ICs.

In FIG. 10A, a PD 1010 has been fabricated on a donor wafer 1000. Specifically, an optional separation layer 1020 and then a photon-absorption layer 1030 are formed on the donor wafer 1000. The separation layer 1020 can be, for example, a different doping layer, a proton implanted layer, or any layer with etching selectivity or mechanical property difference with respect to the rest of the substrate. A metal mirror layer 1040 can be deposited on top of the Ge photon absorption layer 1030 as a single optical mirror or a portion of a reflective region (i.e., one or more mirror layers that function together as one composite mirror). For example, an optional dielectric mirror layer 1045 can be formed in between the metal layer 1040 and the Ge photon absorption region 1030. The optional dielectric mirror layer 1045 can act as an additional optical mirror layer and function together with the metal mirror layer 1040 as a single reflective region. Optionally, the donor wafer 1000 can be covered by a dielectric material (e.g., SiO$_2$) layer 1050, and then prepared (e.g., polished) for wafer bonding. In some implementations, the dielectric mirror layer 1045 may include a single layer of silicon dioxide, silicon nitride, amorphous silicon, or poly silicon. Alternatively, the dielectric mirror layer 1045 may include a multi-layer structure having a combination of the aforementioned materials. In other implementations, a distributed Bragg reflector (DBR) mirror can be used to replace the metal mirror 1040.

In FIG. 10B, a carrier wafer 1002 is prepared (e.g., bonding layer 1060 formation followed by polishing, the bonding layer 1060's material including dielectric, metal, or other materials) for wafer bonding with one or more techniques described here. The optional bonding layer 1060 is preferably the same type of material and/or having the same doping profile as the layer 1050 for improved bonding results. For example, if a dielectric bonding process is used, then the bonding layer 1060 should include a dielectric layer. If a metal bonding process is used, then the bonding layer 1060 should include a metal layer. If a hybrid bonding process is used, then the bonding layer 1060 should be partially dielectric and partially metal. In some implementations, when hybrid bonding is used, at least a part of the metal layer 1040 can serve as an optical mirror, an electrical contact, or their combinations.

In FIG. 10C, the donor wafer 1000 and the carrier wafer 1002 are bonded together. After the bonding, the substrate layer of the donor wafer 1000 (which is originally beneath but now above the Ge absorption layer 1030) is at least partially removed, with its removal depth controlled by etching processes or marked by the optional separation layer 1020. Optionally, a surface clean-up process such as wet-etching or CMP can be performed. Then, to form a double mirror HP-PD 1004 as shown in the FIG. 10C's example, a dielectric mirror 1070 is formed above the photosensitive material layer 1030. The resulting HP-PD 1004 is a front side incidence double mirror PD system, with one metal mirror 1040 and one dielectric mirror 1070. The two mirrors can enhance optical absorption by confining the incoming incident light. In some implementations, the resulting HP-PD 1004 can be a front side incidence single mirror (i.e., mirror 1040) multi-pass PD system if an ARC layer is coated instead of a dielectric mirror 1070.

Optionally, the carrier wafer 1002 can include electronic circuits such as an amplifier, an analog to digital convertor (ADC), a serial-to-parallel interface (SerDes), or a digital circuit such as encoder or decoder. With the technique introduced here, the resulting PD 1004 can be integrated with the electronic circuits. More examples of integration are provided and discussed below.

FIGS. 11A-11E show an alternative embodiment for bonding a donor wafer and a carrier wafer after forming the photodetectors on the donor wafer. With simultaneous reference to FIGS. 10A-10C, in the first step (FIG. 11A), all the PD components 1010 and one side of the mirror 1040 are formed on the donor wafer 1000 before the wafer bonding. An optional separation layer 1020 is placed inside the substrate of the donor wafer 1000. The separation layer 1020 is located at the stopping position for the following substrate removal. In the second step (FIG. 11B), the donor wafer 1000 that has the PD 1010 is flipped over and bonded to a carrier wafer 1002. A photodetector structure with a single crystalline donor substrate on the top of and overlapping with a single crystalline photosensitive material in the bonded wafer. Corresponding to this technique, in one or more examples, the area of the single crystalline donor substrate is no smaller than the area of the single crystalline photosensitive material.

Figure 11A:
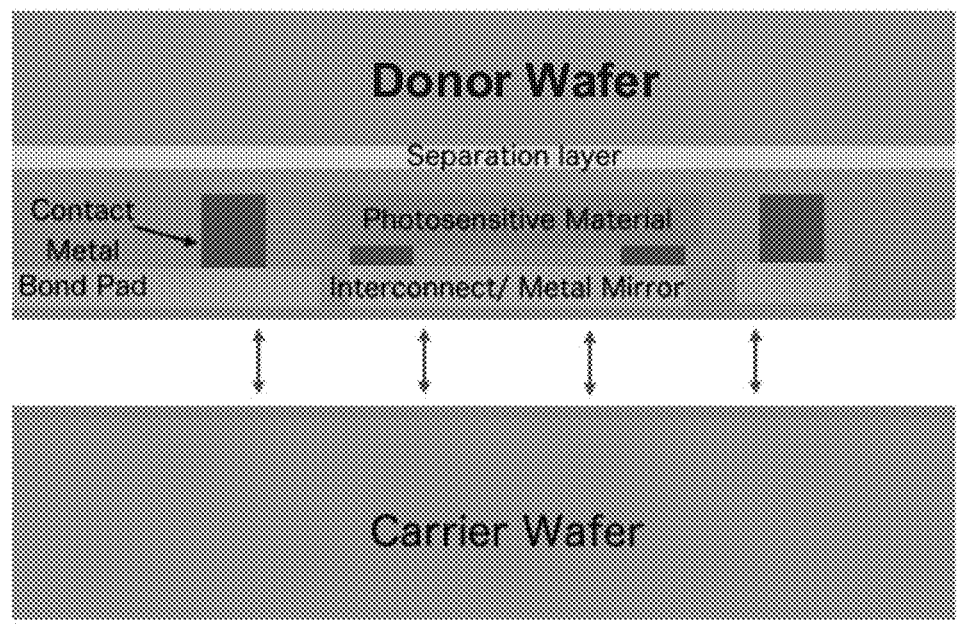
FIGS. 11A-11E show an alternative embodiment for bonding a donor wafer and a carrier wafer after forming the photodetectors on the donor wafer.
Figure 11B:
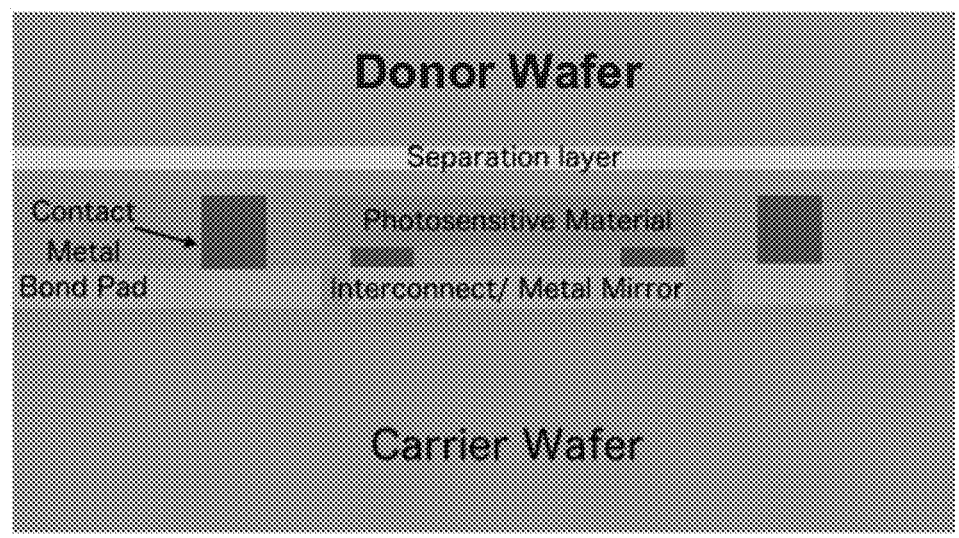
Figure 11C:
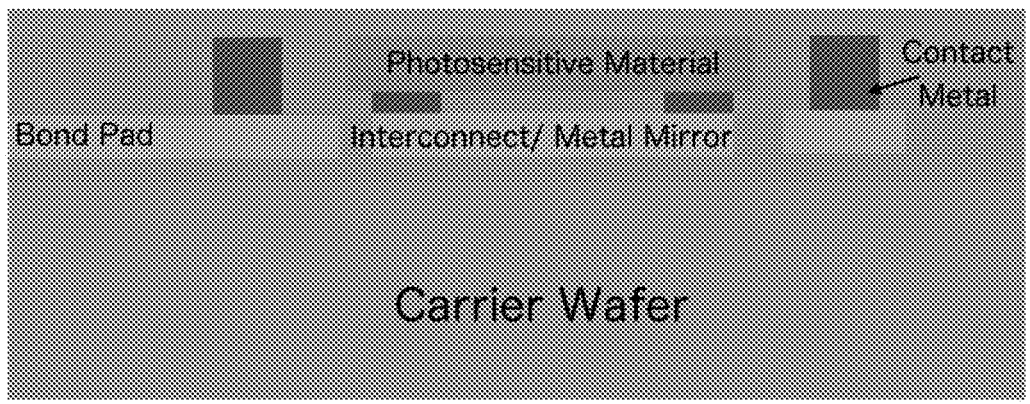
Figure 11D:
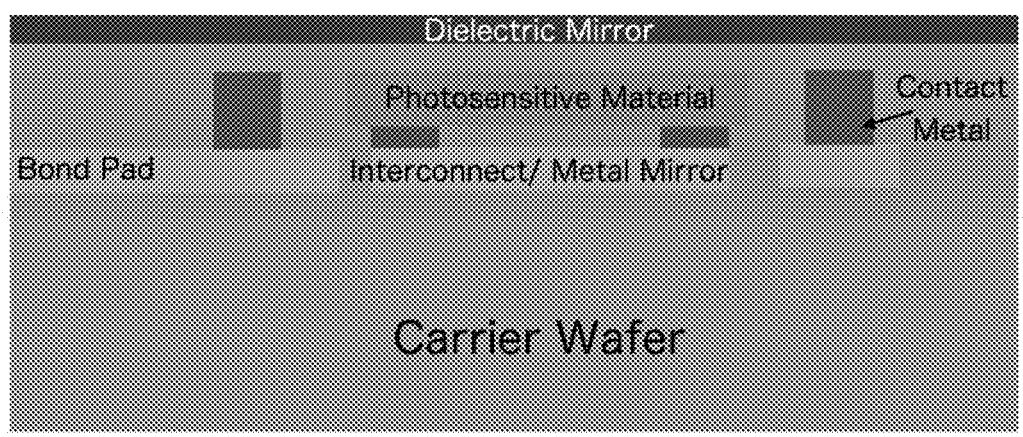
Figure 11E:
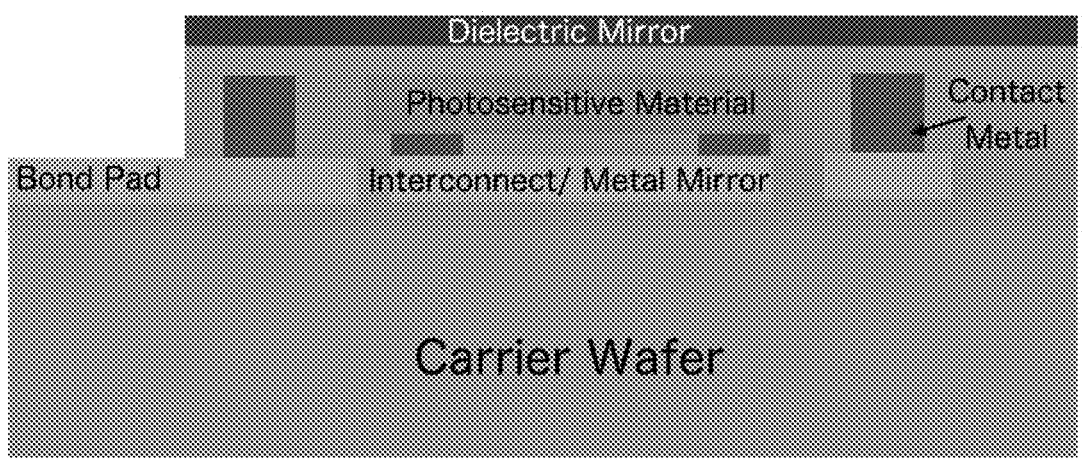

In the third step (FIG. 11C), the substrate of the donor wafer 1000 and the separation layer 1020 is removed. In the optional fourth step (FIG. 11D), a second dielectric mirror 1070 is deposited on the top of the PD 1010 to form a light absorption cavity between the two mirrors 1040 and 1070. In some implementations, the resulting HP-PD is a front side incidence single mirror (i.e., mirror 1040) multi-pass PD system if there no second dielectric mirror 1070 is formed, such as illustrated in FIG. 11C. Optionally, an ARC layer can be added onto the mirror 1040 to form a front side incidence multi-pass PD system. In the fifth step (FIG. 11E), bond pads 1080 are opened for the following packaging processes. Notably, the bond pad formation approach shown in FIG. 11E is merely an example; other suitable approaches may apply.

According to some examples, the single crystalline donor substrate can be Si. The photosensitive material can be Ge. A top contact area 1085 that is created for the PD 1010 can be Si, SiGe, or partially-doped Ge layer. In some implementations, the contact area 1085 of the Si or SiGe or partially-doped Ge layer can be larger than or overlapping the area of the Ge absorption layer, so that the Si, SiGe, or partially-doped Ge layer 1085 can partially be used as electrical contacts to provide the electrical field in the Ge absorption region. That is to say, the width of the top contact area 1085 can be larger than the width the Ge absorption layer 1030.

In some implementations, an anti-reflection coating (ARC) layer can be deposited on top of the front side reflector (e.g., the dielectric mirror 1070). Optionally, the bottom of the carrier wafer 1002 can be thinned as needed, for example, by etching or polishing. If the PD is a back side incidence PD, then an ARC layer can then be deposited on the back side (e.g., the carrier wafer's bottom) and the metal mirror 1040 can be replaced with an opening to allow incident light to travel through the opening into the photosensitive material. The electrical contact can be made on the bond pad 1080 from the donor side by etching through the now top surface of the bonded wafer, such as shown in FIGS. 10C and 11E. Additionally or alternatively, the electrical contact can be made by etching from the bottom surface of the bonded wafer, forming a TSV structure (e.g., in a manner similar to the TSV structure for the IC in FIG. 15B, discussed below).

FIGS. 12A-12D show a process of forming two alternative embodiments of a photodetector with mirror structures. Instead of resulting in a front side incidence double mirror HP-PD, such as the flow of FIGS. 10A-10C, the flow of FIGS. 12A-12C can result in a back side incidence double mirror HP-PD. Similar to the flow of FIGS. 10A-10C, a single or double mirror system may be used for HP-PD; however, the incident light now comes from the bottom of the PD (i.e., from the carrier wafer 1202's bottom). The PD device 1210 and an optional dielectric mirror 1240 (or a DBR mirror) may be formed on a donor wafer 1200 and bonded to a carrier wafer 1202. The substrate (of the donor wafer 1202) originally underneath but now above the PD structure is then at least partially removed, and a metal mirror 1270 (or DBR mirror) is placed to form the light absorption cavity for the PD 1210. A top contact area 1285 that is created for the PD 1210 can be Si, SiGe, or partially-doped Ge layer. In some implementations, the contact area 1285 of the Si or SiGe or partially-doped Ge layer can be larger than or overlapping the area of the Ge absorption layer, so that the Si, SiGe, or partially-doped Ge layer 1285 can partially be used as electrical contacts to provide the electrical field in the Ge absorption region. That is to say, the width of the top contact area 1285 can be larger than the width the Ge absorption layer 1230.

Figure 12A:
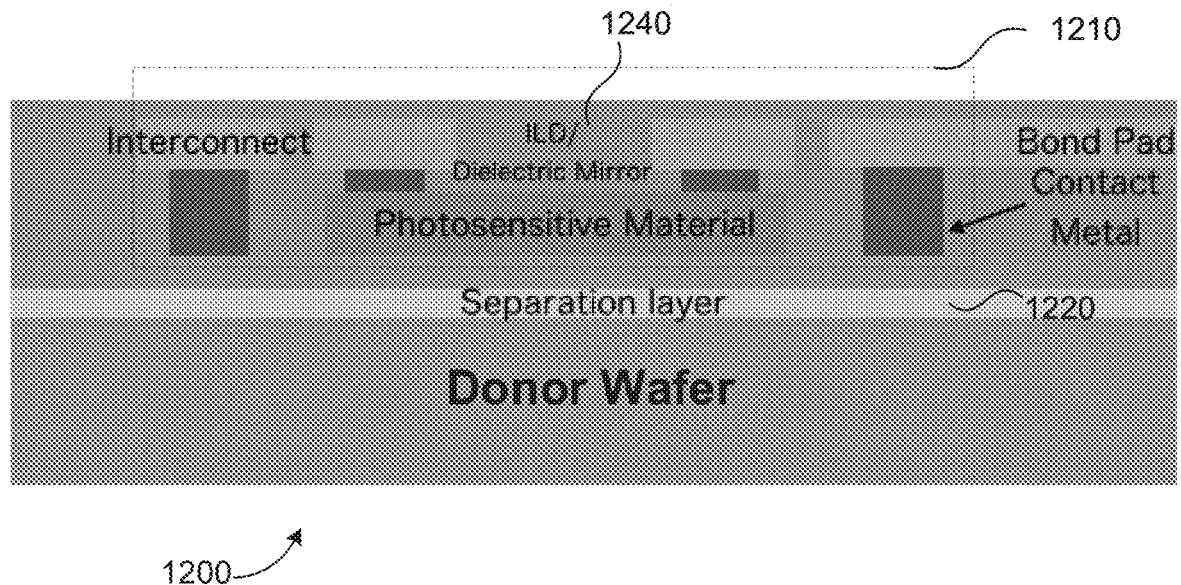
FIGS. 12A-12D show a process of forming two alternative embodiments of a photodetector with mirror structures.
Figure 12B:
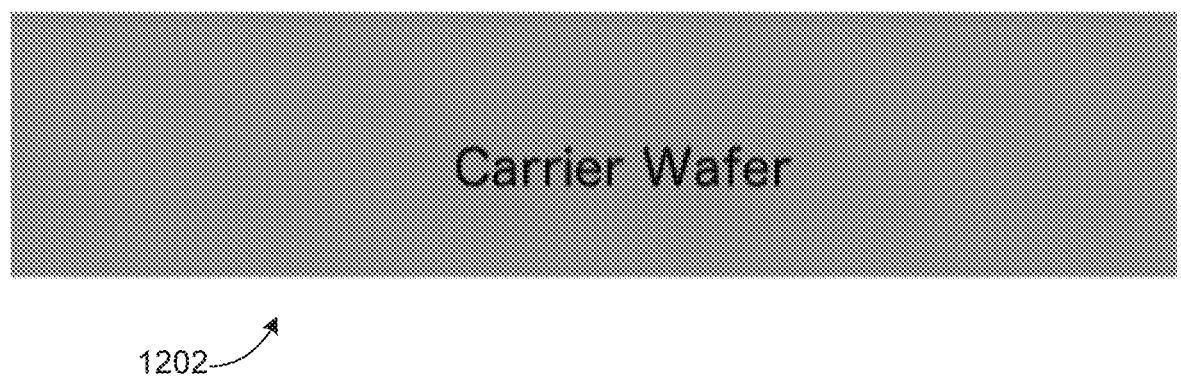
Figure 12C:
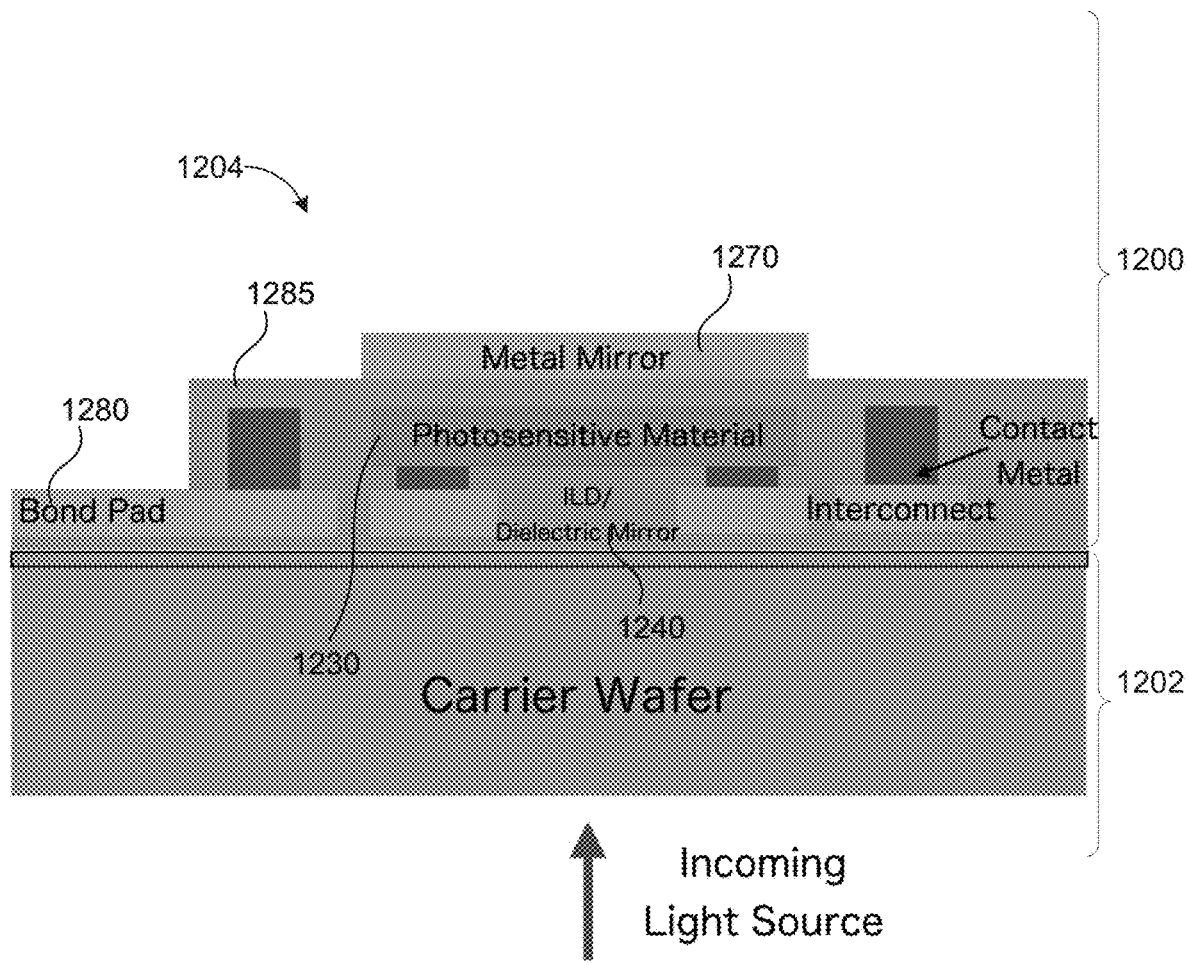
Figure 12D:
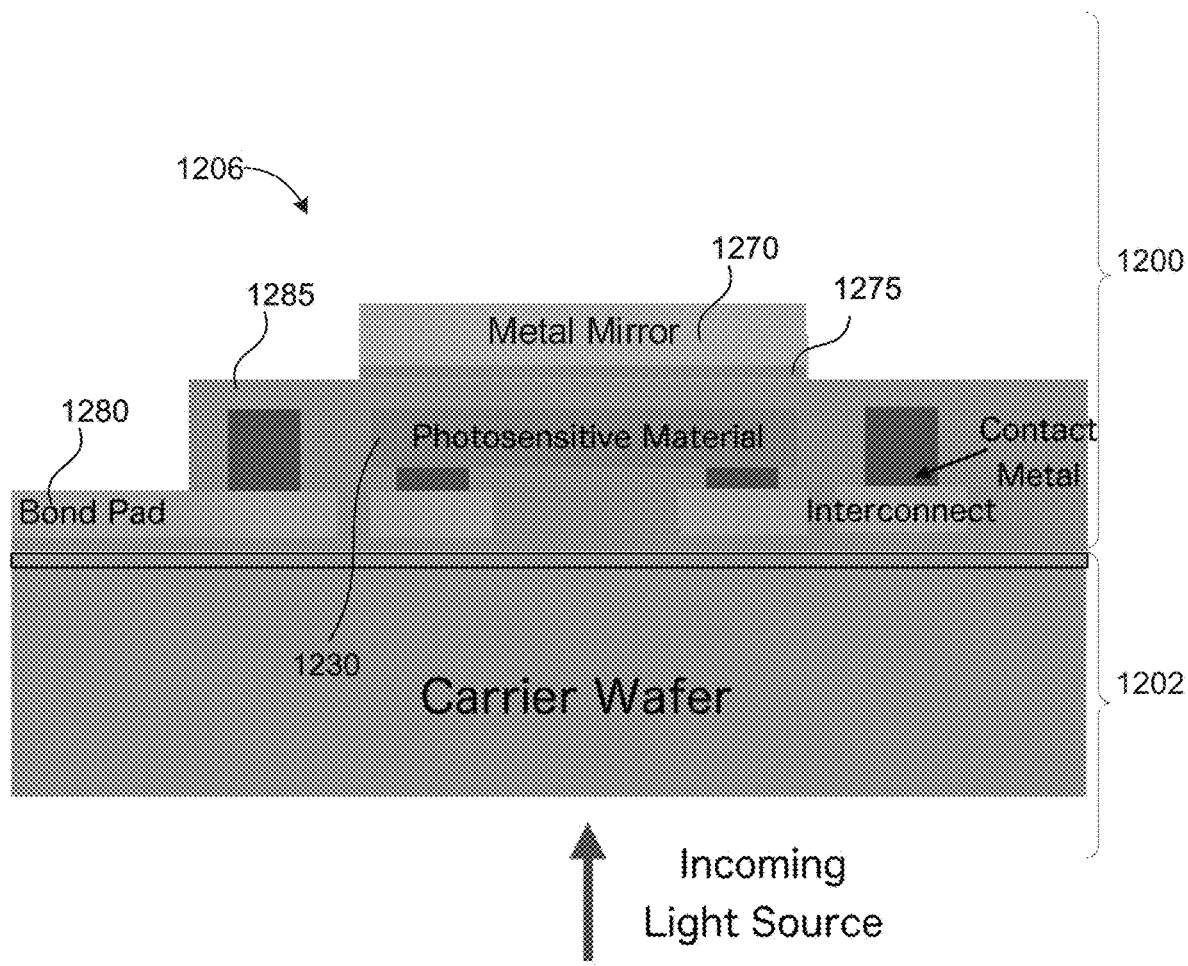

For FIG. 12D, as an alternative embodiment 1206 to having a double mirror structure as illustrated in FIG. 12C (i.e., mirrors 1240 and 1270), a single mirror structure can be implemented. The dielectric mirror 1240's function, which is illustrated and discussed with respect to FIG. 12C, is not implemented in FIG. 12D (e.g., which can be a simple opening instead) and may allow light to pass directly from the backside of the carrier wafer 1202 into the photosensitive material 1230. Thus, the embodiment 1206 constitutes a single mirror back-side incidence PD structure.

Also shown in FIG. 12D is an optional dielectric mirror layer 1275 that can be included between the metal mirror 1270 and the photosensitive material 1230. The dielectric mirror layer 1275 can function together with the metal mirror 1270 as a single composite mirror, which may improve and/or provide more process control over the overall mirror's reflectivity. In some implementations, the dielectric mirror layer 1275 may include a single layer of silicon dioxide, silicon nitride, amorphous silicon, or poly silicon. Alternatively, the dielectric mirror layer 1275 may include a multi-layer structure having a combination of the aforementioned materials. In some implementations, either an SOI or Si substrate may be used as the donor wafer.

Similar to what is described for the front side incidence double mirror HP-PD in FIGS. 10A-10C, wafer-to-wafer dielectric bonding, or hybrid bonding, can be used in this structure. The separation layer 1220 can be, for example, a different doping layer, a proton implanted layer, or any suitable layer with etching selectivity or mechanical property difference with respect to the rest of the donor wafer 1200's substrate.

Figure 13A:
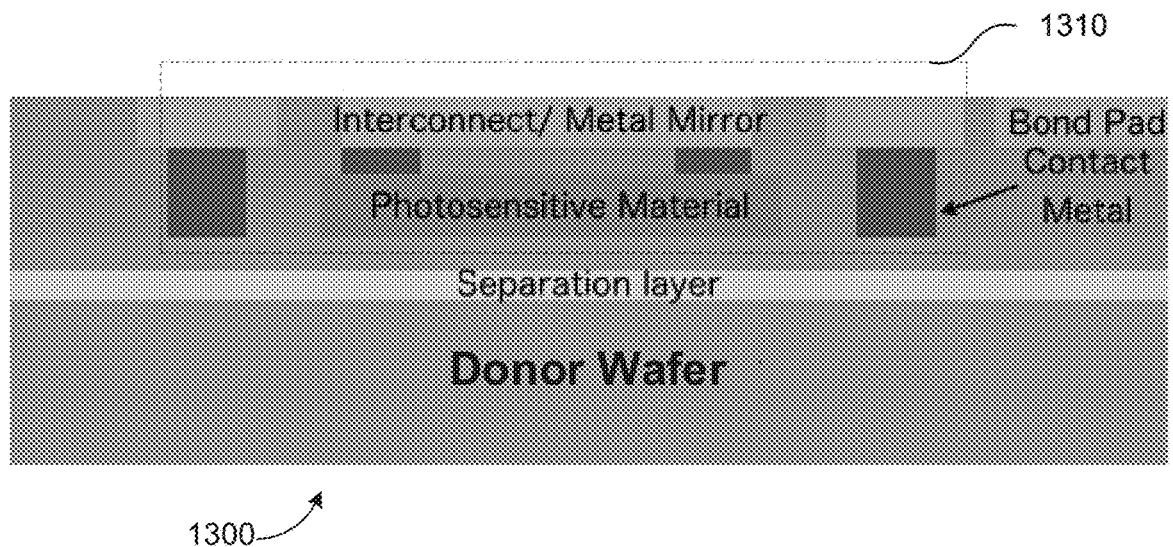
FIGS. 13A-13C show another alternative embodiment of a photodetector with mirror structures and integrated circuits (ICs).
Figure 13B:
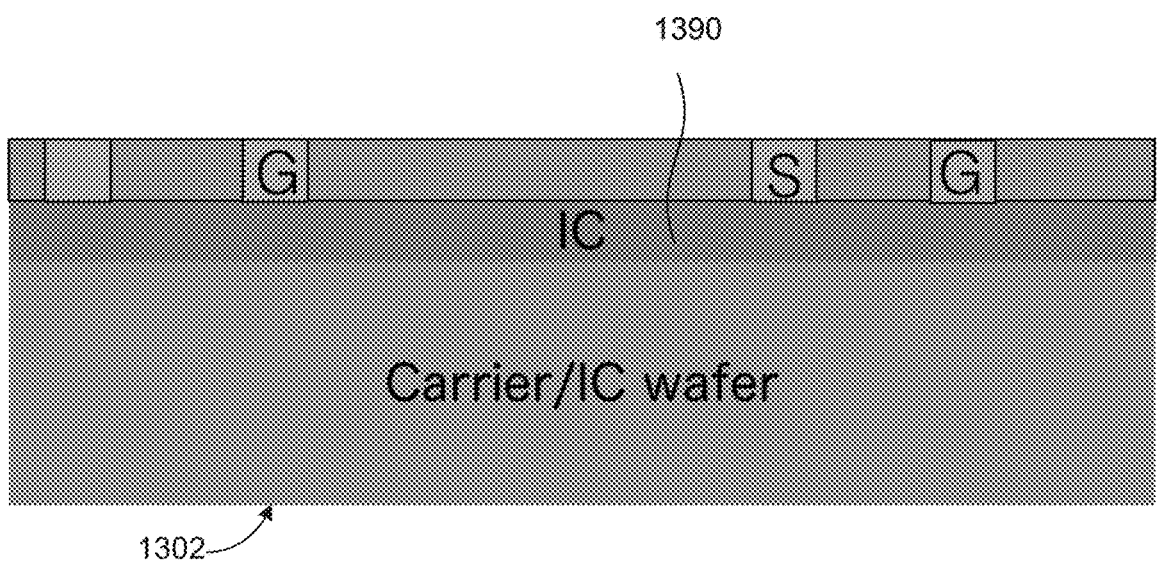
Figure 13C:
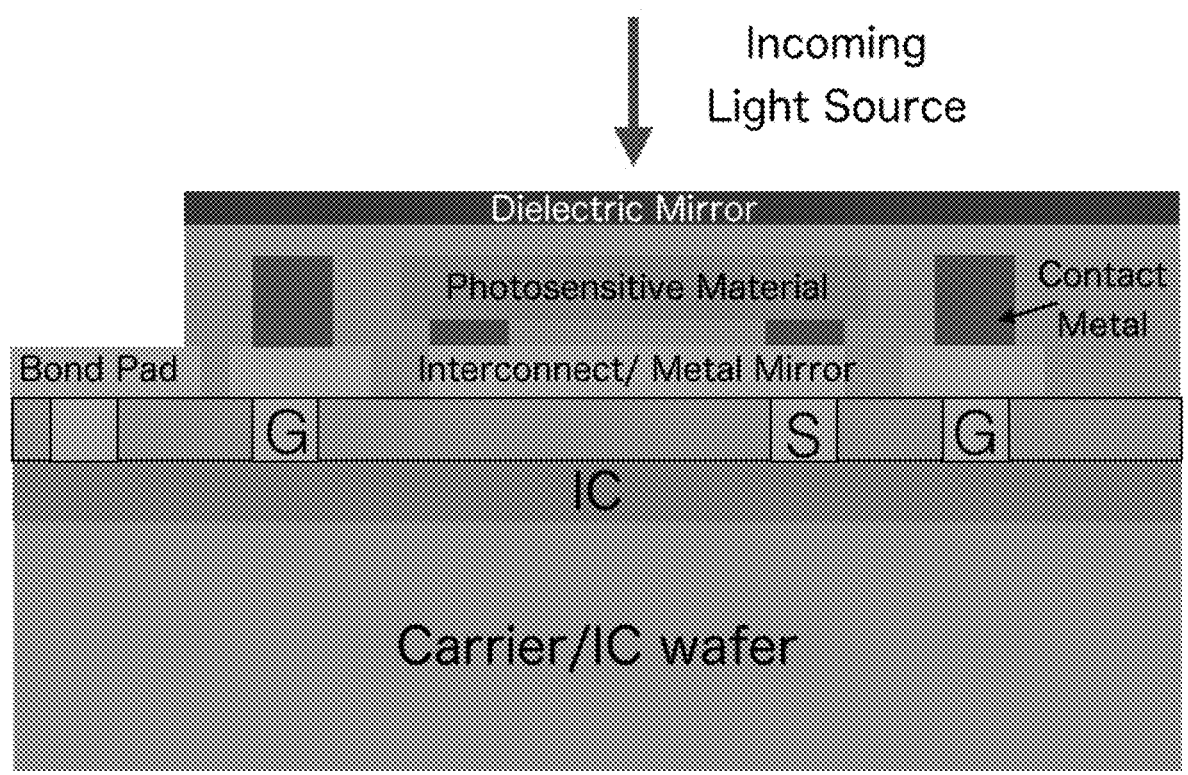

FIGS. 13A-13C show another alternative embodiment of a photodetector with mirror structures and integrated circuits (ICs). In this embodiment, the front side incidence double mirror HP-PD on a donor wafer 1300 is bonded to a carrier wafer 1302 that includes a CMOS IC 1390. The IC 1390 includes at least one CMOS transistor that is fabricated on the carrier wafer 1302. On the other hand, the PD 1310 is fabricated on the donor wafer 1300. A wafer-to-wafer hybrid bond process (metal-plus-dielectric bond) is used here to bond the donor wafer 1300 and the carrier wafer 1302 together, forming a structure 1304 shown in FIG. 13C. As shown in FIG. 13C, the electrical connection between the PD 1310 and the IC 1390 can be implemented by metal bonding. This technique can be applied in a similar way for a back side incidence single or double mirror HP-PD.

Figure 14:
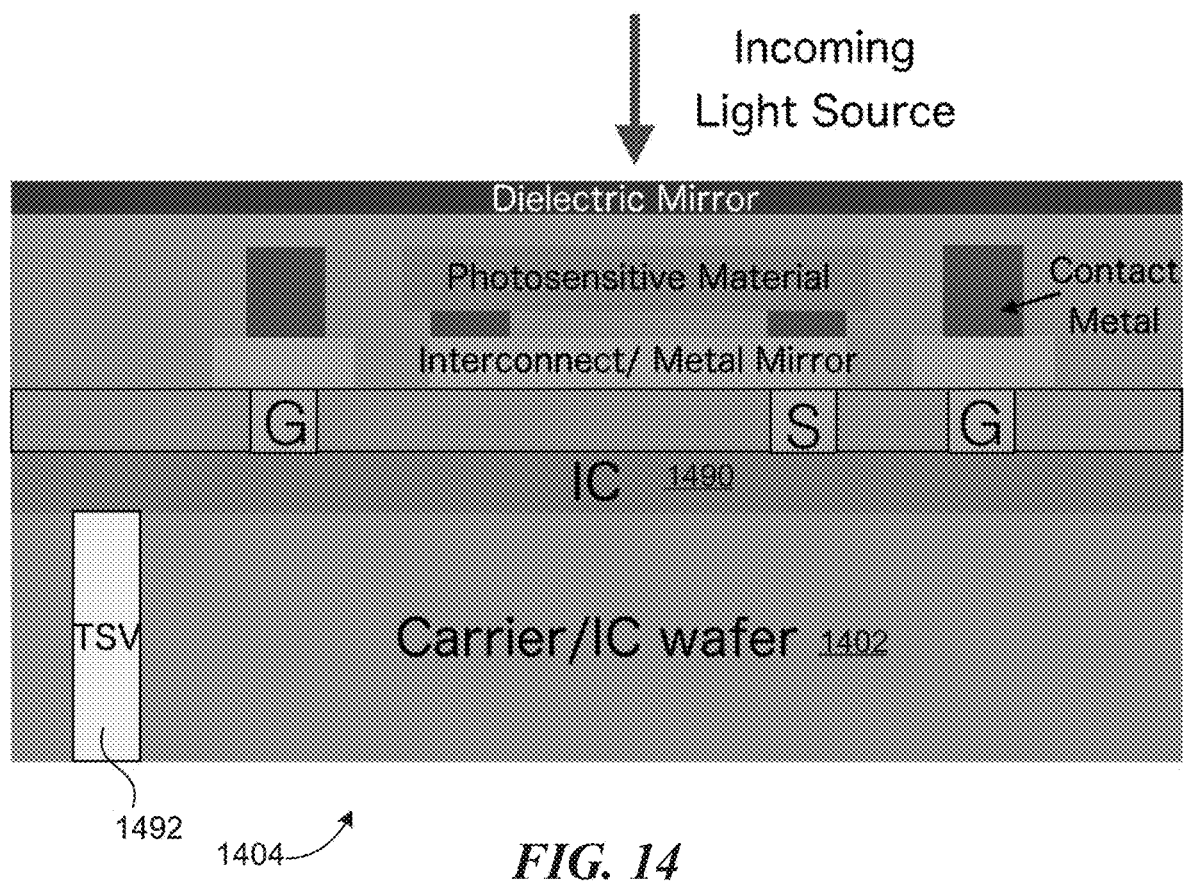
FIG. 14 shows yet another alternative embodiment that includes a through-silicon via (TSV) formed on the carrier wafer.

FIG. 14 shows yet another alternative embodiment 1404 that includes a through-silicon via 1492 (TSV) formed on the carrier wafer 1402. In the implementation shown, the IC circuit 1490's output is connected to the TSV 1492 on the side of the carrier wafer 1402. This technique can be applied in a similar way for a back side incidence single or double mirror HP-PD.

Integration with Other Electronic Circuits

Figure 15A:
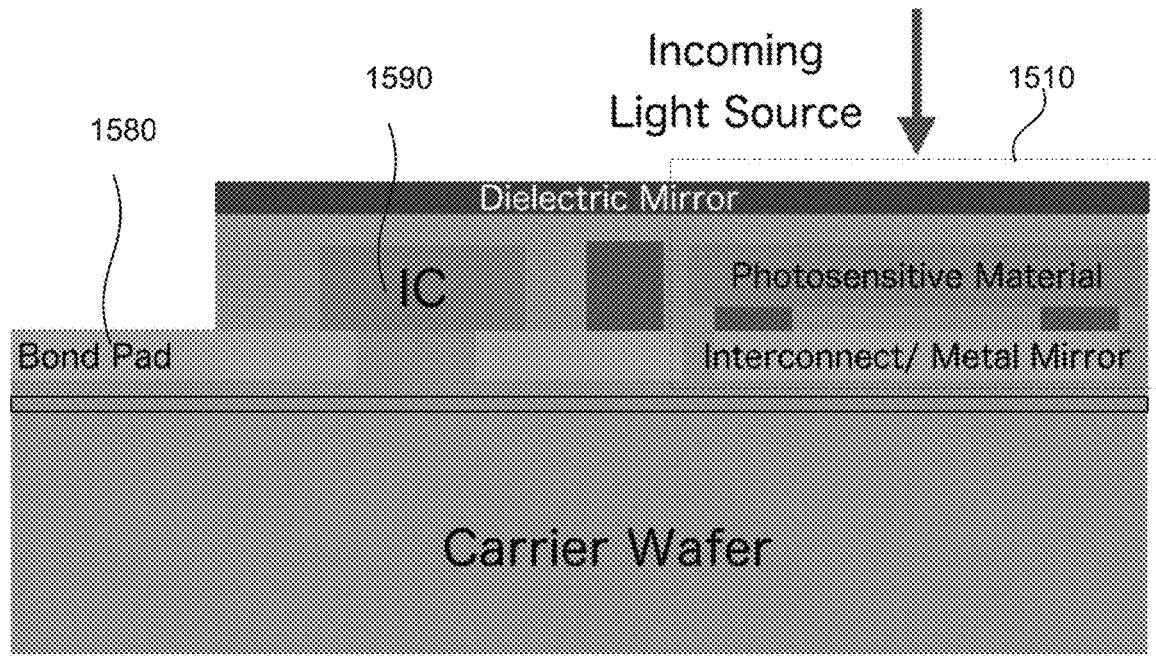
FIGS. 15A-15B show two example schemes of integration of front side incidence double mirror photodetectors and integrated circuits.
Figure 15B:
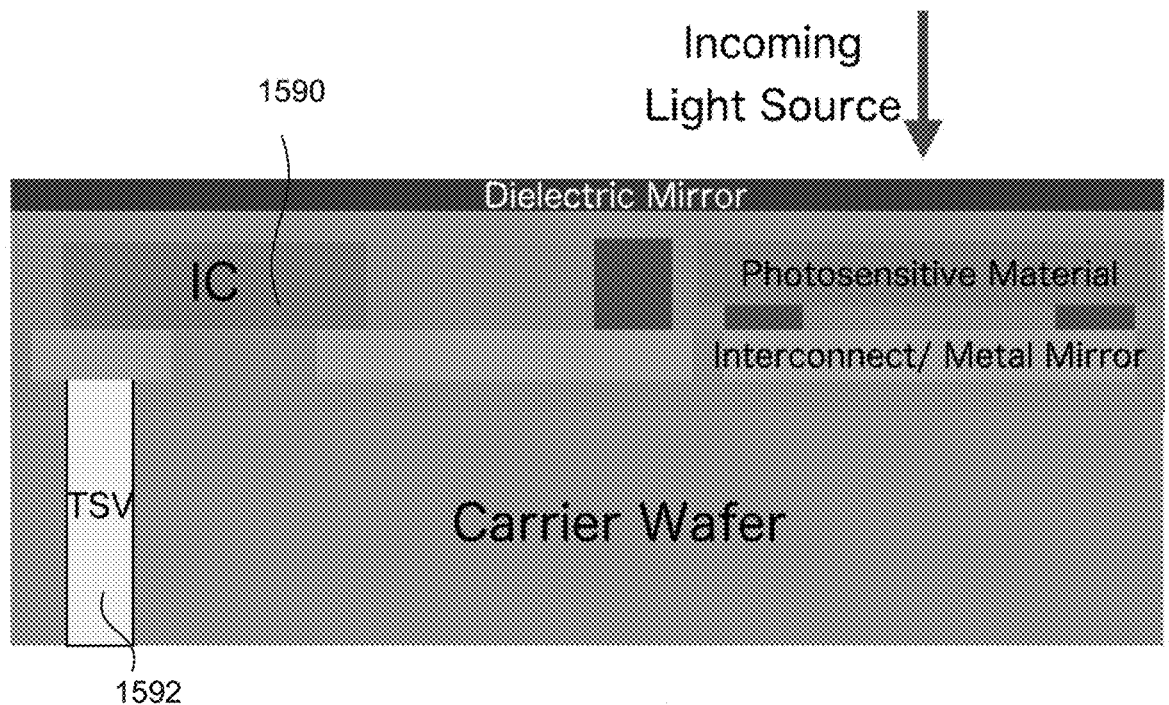

FIGS. 15A-15B show two example schemes of integration of front side incidence double mirror photodetectors and integrated circuits. As noted above, while a double mirror PD is shown in the figures, these techniques are generally applicable to a single mirror PD, for example, by eliminating the top mirror between the photosensitive material and the light source. A double mirror system including HP-PD 1510 is shown here as an example. An IC 1590 is integrated to the PD 1510 on the same wafer using the techniques introduced here. In FIG. 15A, the IC 1510's output is connected to a bond pad 1580 In some implementations, such as shown in FIG. 15B, the IC 1510's output is connected to a TSV 1592 on carrier wafer side. Note that these integration techniques introduced here are not limited to any specific kind of PD system; they can be applied in a similar way for other PD system including, for example, a back side incidence double mirror HP-PD, or a single mirror HP-PD.

Figure 16A:
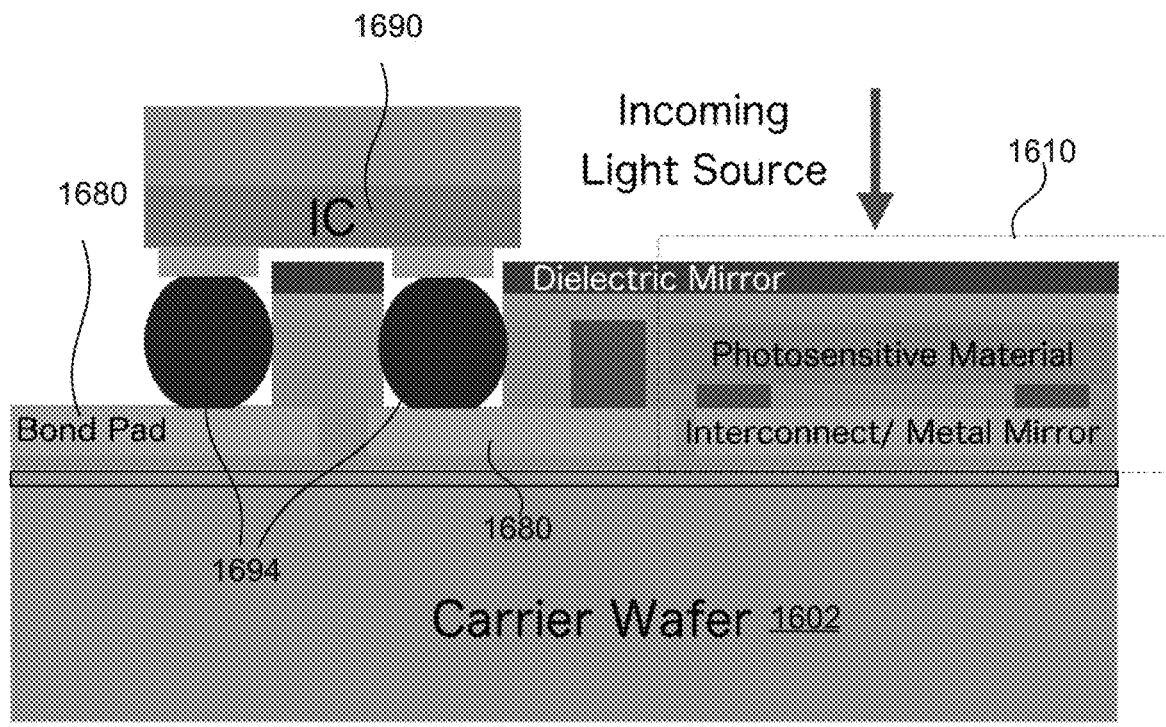
FIGS. 16A-16B show two alternative example schemes of integration, with integrated circuits bonded on front side incidence double mirror photodetectors.
Figure 16B:
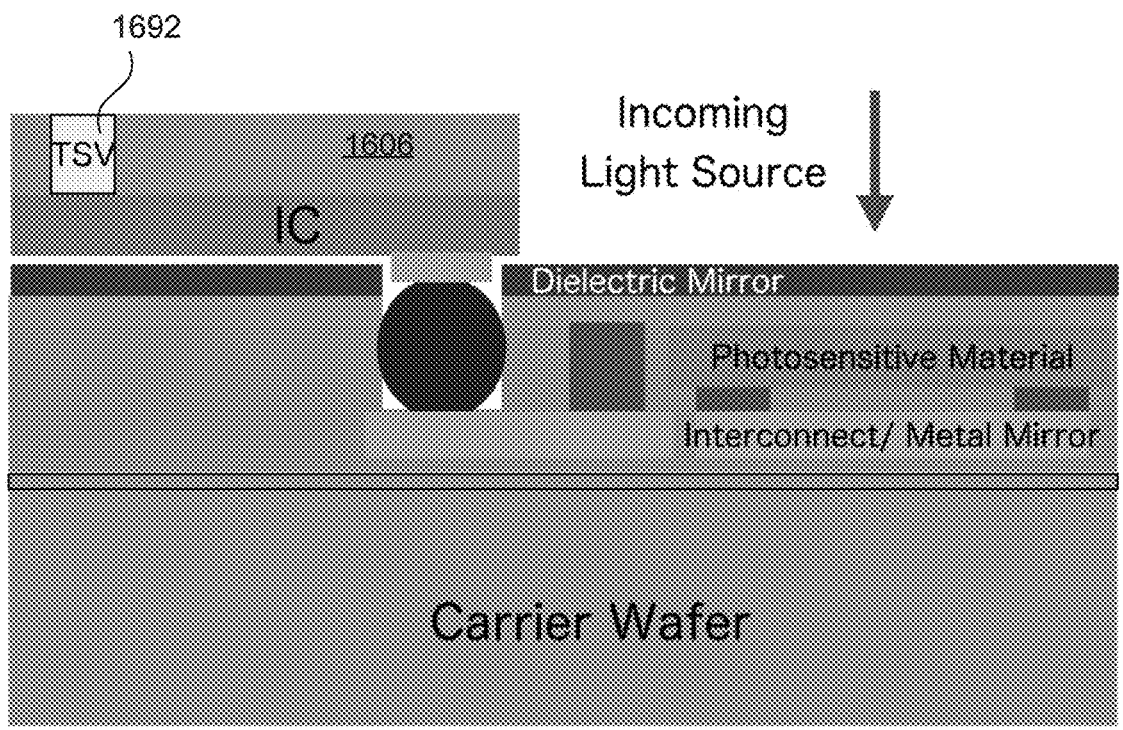

FIGS. 16A-16B show two alternative example schemes of integration, with integrated circuits bonded on front side incidence double mirror photodetectors. Here, the double mirror system is shown here as an example, and the PD 1610 is bonded on the carrier wafer 1602 using the techniques disclosed here. The IC 1690 is then bonded on the PD structure via a flip-chip bonding process. The flip-chip bonding process can be either chip-to-chip or chip-to-wafer. In FIG. 16A, the IC 1690's output is connected to bond pads 1680 via solder balls, copper (Cu) pillars 1694, or other similar techniques. In FIG. 16B, the IC 1690's output is connected to a TSV 1692 on the IC's wafer 1606.

Figure 17A:
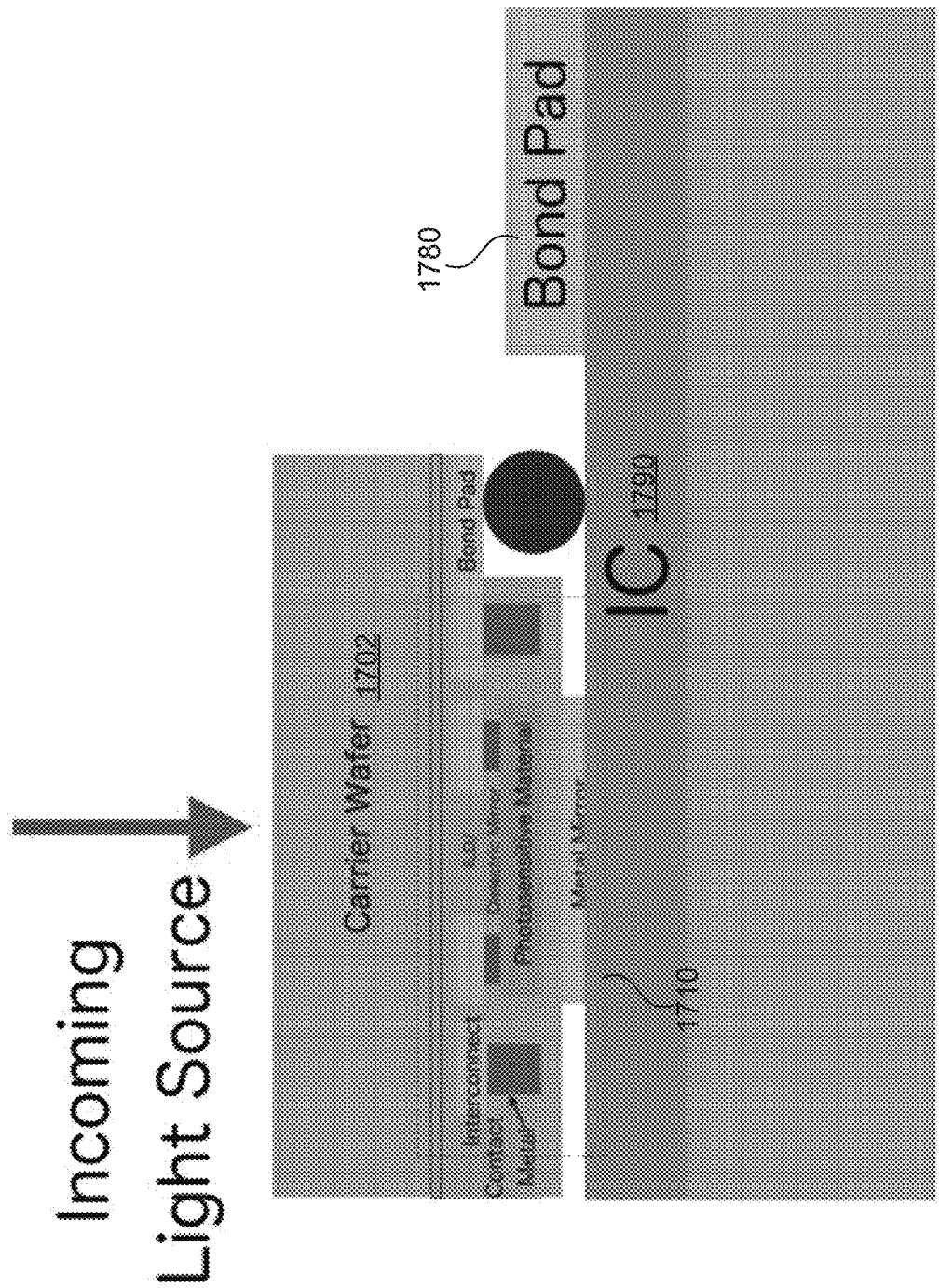
FIGS. 17A-17B show two alternative example schemes of integration, with back side incidence photodetectors bonded on integrated circuits.
Figure 17B:
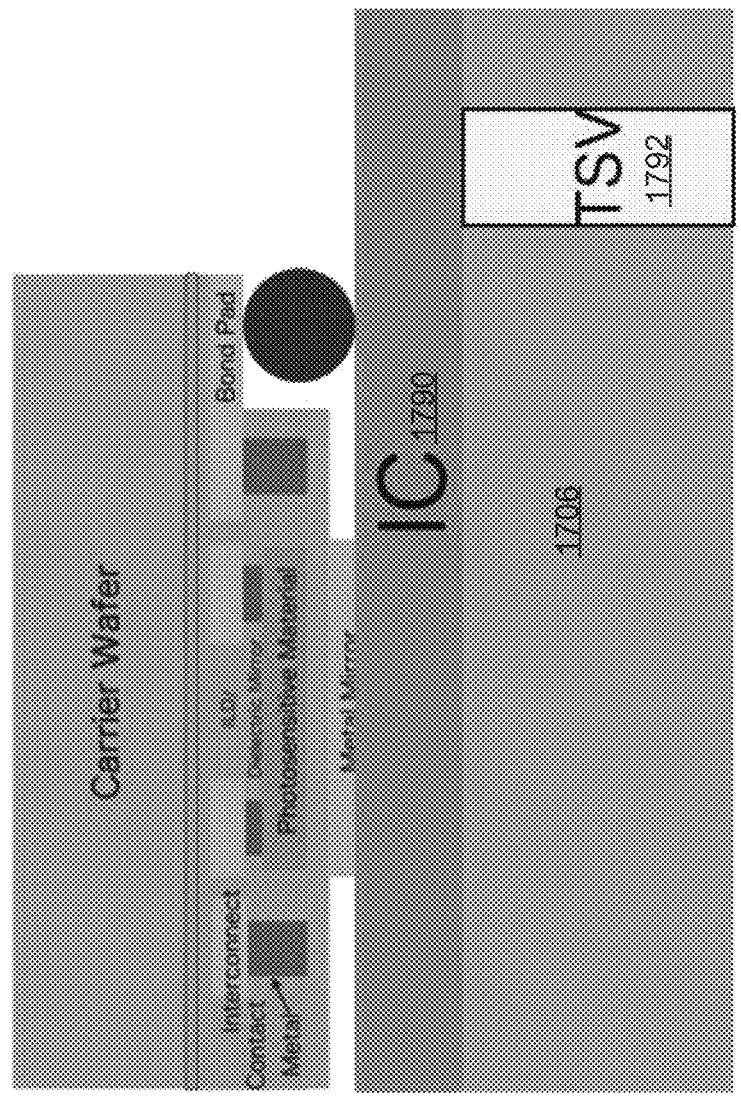

FIGS. 17A-17B show two alternative example schemes of integration, with back side incidence photodetectors bonded on integrated circuits.

The embodiments shown in FIGS. 17A-17B utilize a back side incidence HP-PD design (which can be, for example, single or double mirror), which is bonded onto the carrier wafer 1702. The PD 1710 is then diced into chips and bonded on the IC 1790 via a flip-chip bonding process. In FIG. 17A, the IC 1790's output is connected to a bond pad 1780 on IC side, which can be suitable for making electrical contact to other chips or printed circuit boards (PCBs). In FIG. 17B, the IC 1790's output is connected to a TSV 1792 on the IC's wafer 1706.

Figure 18A:
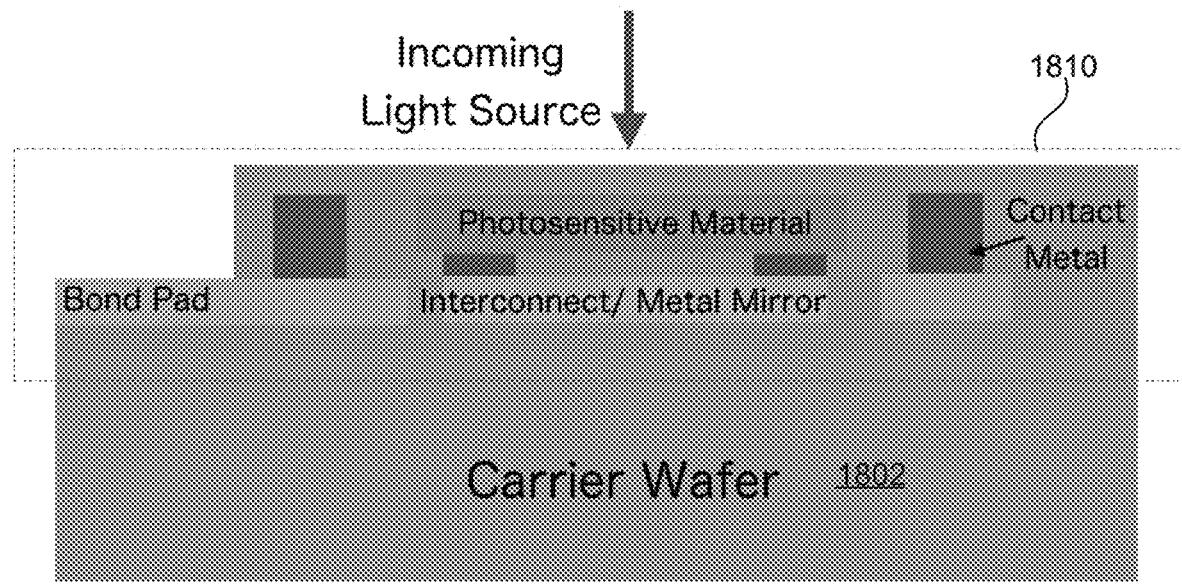
FIGS. 18A-18B show two additional examples of front side incidence single mirror photodetectors and their integration applications.
Figure 18B:
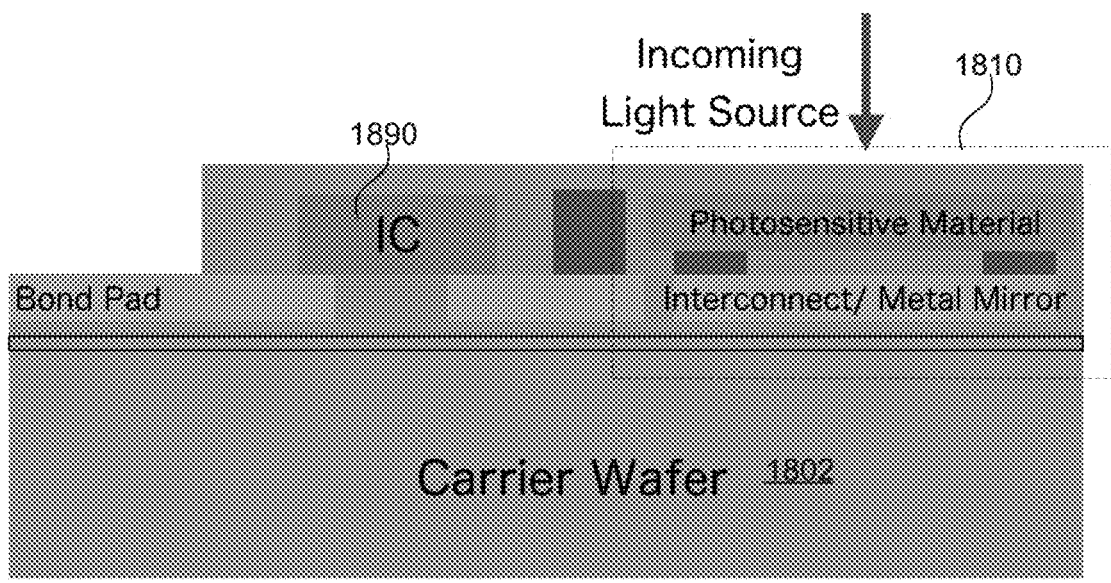

FIGS. 18A-18B show two additional examples of front side incidence single mirror photodetectors and their integration applications. The embodiments shown in FIGS. 18A-18B utilize a front side incidence single mirror system for the HP-PD design. Shown in FIG. 18A is a discrete PD 1810, in which the HP-PD is directly bonded to a carrier wafer 1802. Shown in FIG. 18B is an integration application of PD and IC, where the PD 1810 and IC 1890 are integrated on the same wafer, and then bonded on the carrier wafer 1802.

Generally speaking, for purposes of discussion here (especially with regard to the description and figures related to post-PD bonding techniques), it is optional to implement a dielectric layer that is located between a photosensitive materials and the initial light incidence source and acts as a mirror to partially transmit the incident light and partially reflect the light reflected by another mirror.

Furthermore, "back side incidence" and "front side incidence" are relative terms, typically used to describe where light is incident from relative to the PD device. For purposes of discussion here, because multiple wafers may be involved, the terms "back side incidence" and "front side incidence" are used based on the optical path of the incident light relative to the positions of carrier and donor wafers. Also, such terms used here may take reference to a particular PD's overall design, regardless of the actual existence of the donor wafer or the carrier wafer at the time of a particular described operation. Consequently, for example, if a PD's optical path of the incident light signal by design encounters the donor wafer prior to the carrier wafer, then the device may be referred to as a "front side incidence" type PD. Conversely, if a PD's optical path of the incident signal by design encounters the carrier wafer prior to the donor wafer, then the device may be referred to as a "back side incidence" type PD. It is worth noting that this usage may be different from the conventional notion of a "front side incidence" or a "back side incidence" photodetector, because conventional PD structures are not multi-wafer based.

Furthermore, an ARC layer or/and a lens structure may be included between the photo-sensitive materials and the initial light incidence source, or alternatively, between a dielectric partial mirror and the initial light incidence source if such dielectric partial mirror is included. The lens structure can be a curved silicon surface formed by etching, a number of polymer based materials shaped into a curved structure, or a number of photonic crystal structures with multiple layers of silicon and dielectric. In some implementations, the lens structure may be hemisphere-like. In some other examples, the lens structure may be photonic crystal-like, in which multiple holes, recesses, rods, rings, mesas are arranged inside. The lens can be made of suitable materials including, for example, crystalline, polymeric, organic or inorganic materials.

Waveguide and Multi-Channel Optical Transceiver Application

With the above-introduced techniques, a high speed hybrid waveguide-based multiple channel optical transceiver module may be further implemented. For example, a receiver module can include normal incidence PDs bonded to a waveguide-based multiple channel passive system. Pulse-amplitude modulation (PAM) or other modulation schemes can be used to boost up the communication speed. A transmitter module can also be implemented by replacing the PDs introduced above with vertical-cavity surface-emitting laser (VCSEL) diodes.

This approach provides some potential economic benefits as compared to fully integrated waveguide-based photodetector systems that traditionally are suitable for mid-range data communication applications. For long range links, avalanche PD (APD) bonded systems can be used. Using bonded APDs introduced here may have potential cost advantage than the traditional integrated waveguide-based APD systems.

Figure 19:
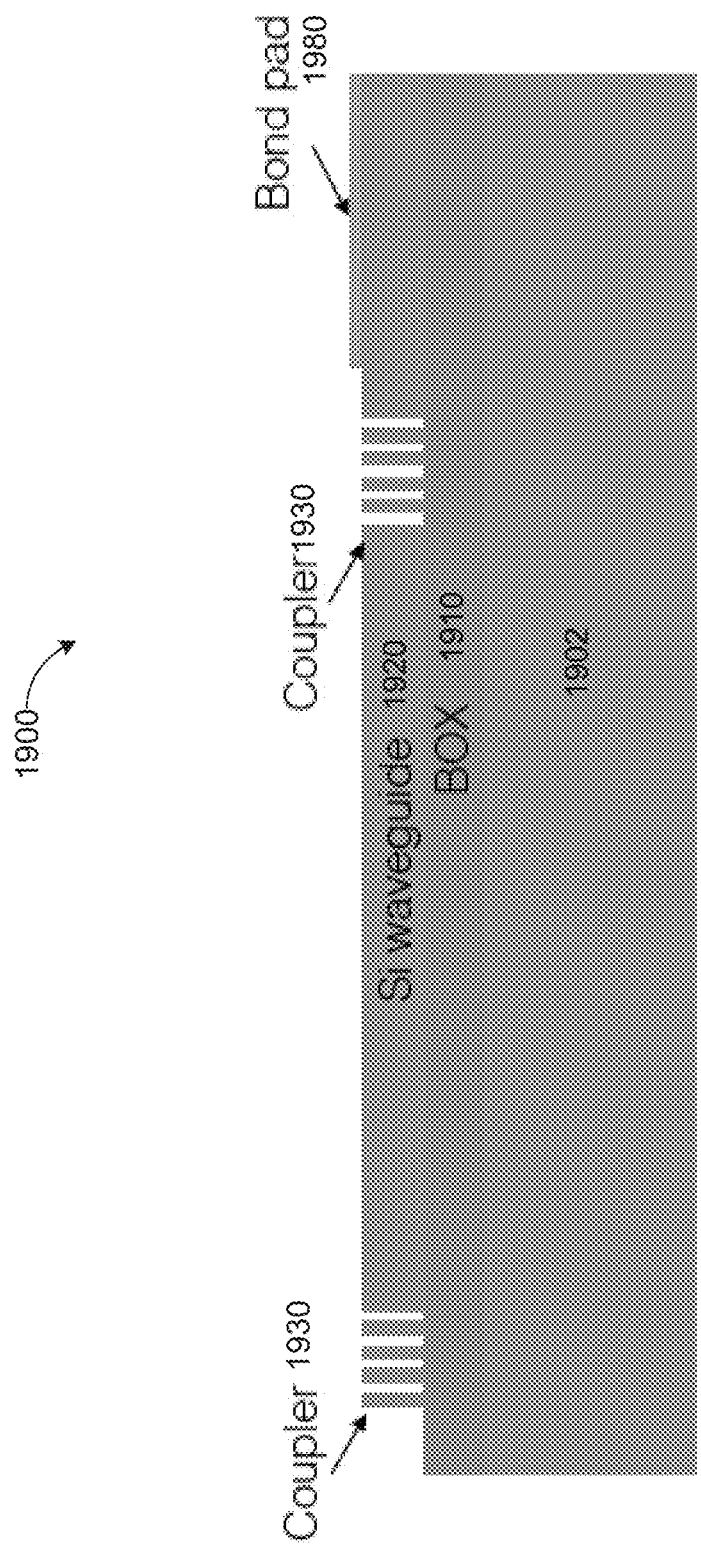
FIG. 19 shows a cross-sectional view of a waveguide structure that can be utilized with the photodetectors introduced here.

FIG. 19 shows a cross-sectional view of a waveguide structure 1900 that can be utilized with the photodetectors introduced here. The waveguide structure 1900 is implemented on an SOI wafer 1902. The SOI wafer 1902 includes a buried oxide (BOX) layer 1910. The silicon (Si) on the SOI wafer 1902 has been patterned to include Si waveguide 1920 and couplers 1930. Additionally, a bond pad 1980 is formed on a portion of the Si waveguide 1920. Note that the drawings are provided here for illustration purposes, and that other forms of optical components (such as other types of optical couplers) can be applicable.

Figure 20:
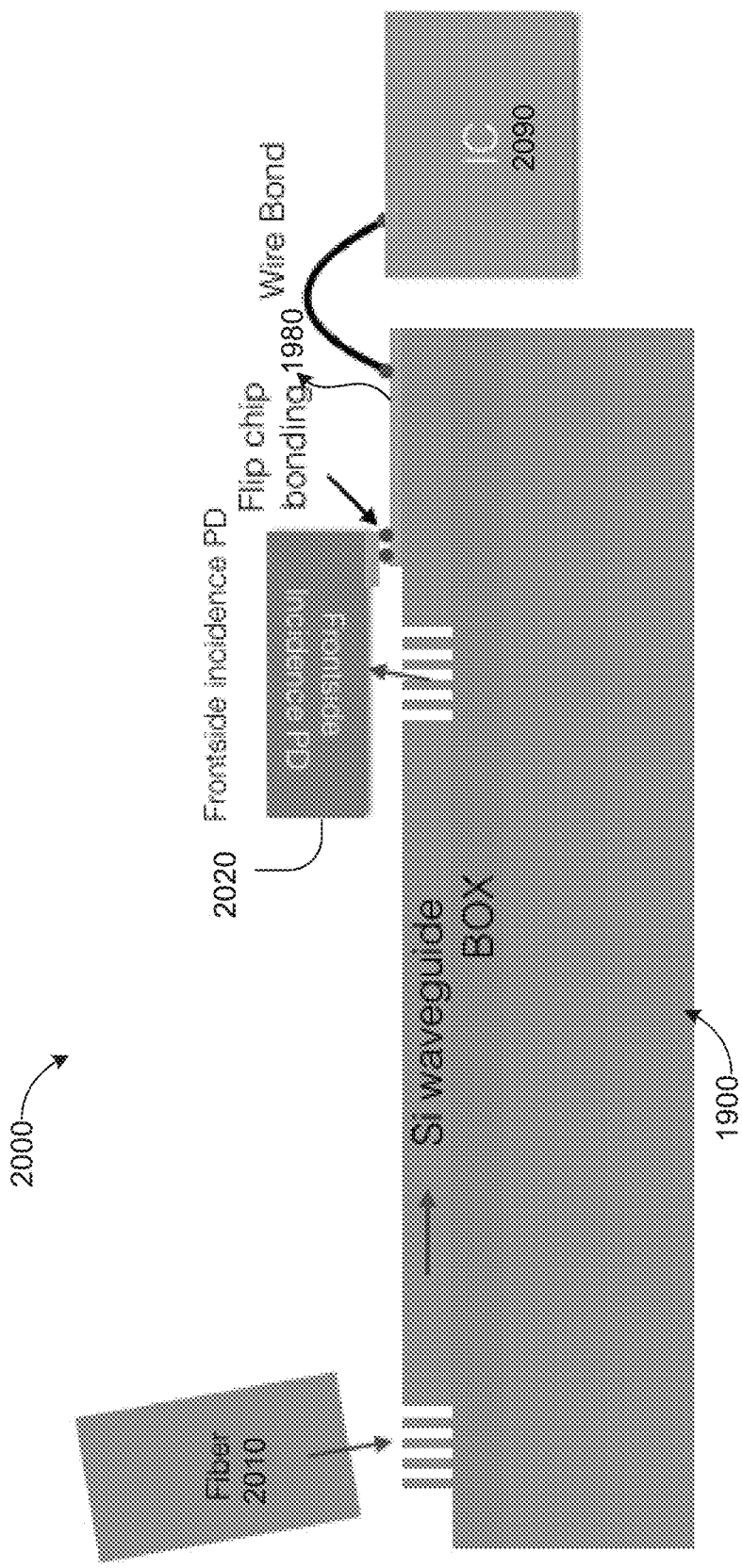
FIG. 20 shows an example schematic of a waveguide system embodying one or more techniques introduced here.

FIG. 20 shows an example schematic of a waveguide receiver system 2000 embodying one or more techniques introduced here. More specifically, the waveguide receiver system 2000 includes the waveguide structure 1900, as well as a fiber 2010 coupled to one of the couplers 1930. The waveguide receiver system 2000 also includes a front side incidence PD 2020 flip-chip bonded to the bonding pad 1980 and coupled to another one of the couplers 1930. The PD 2020 is positioned to receive and detect the optical signals transmitted from the fiber 2010. In other implementations, a direct fiber to waveguide coupling approach can be used to reduce the coupling loss from the waveguide to the fiber coupler. In addition, the waveguide receiver system 2000 includes an integrated circuit (IC) 2090, also bonded to the bond pad 1980 through wire bonding as shown in FIG. 20 or through flip-chip bonding (not shown for simplicity). The IC 2090 is configured to process the output from the PD 2020. In other implementations, the IC 2090 can be integrated with the PD 2020 on the same chip using techniques introduced previously.

Figure 21:
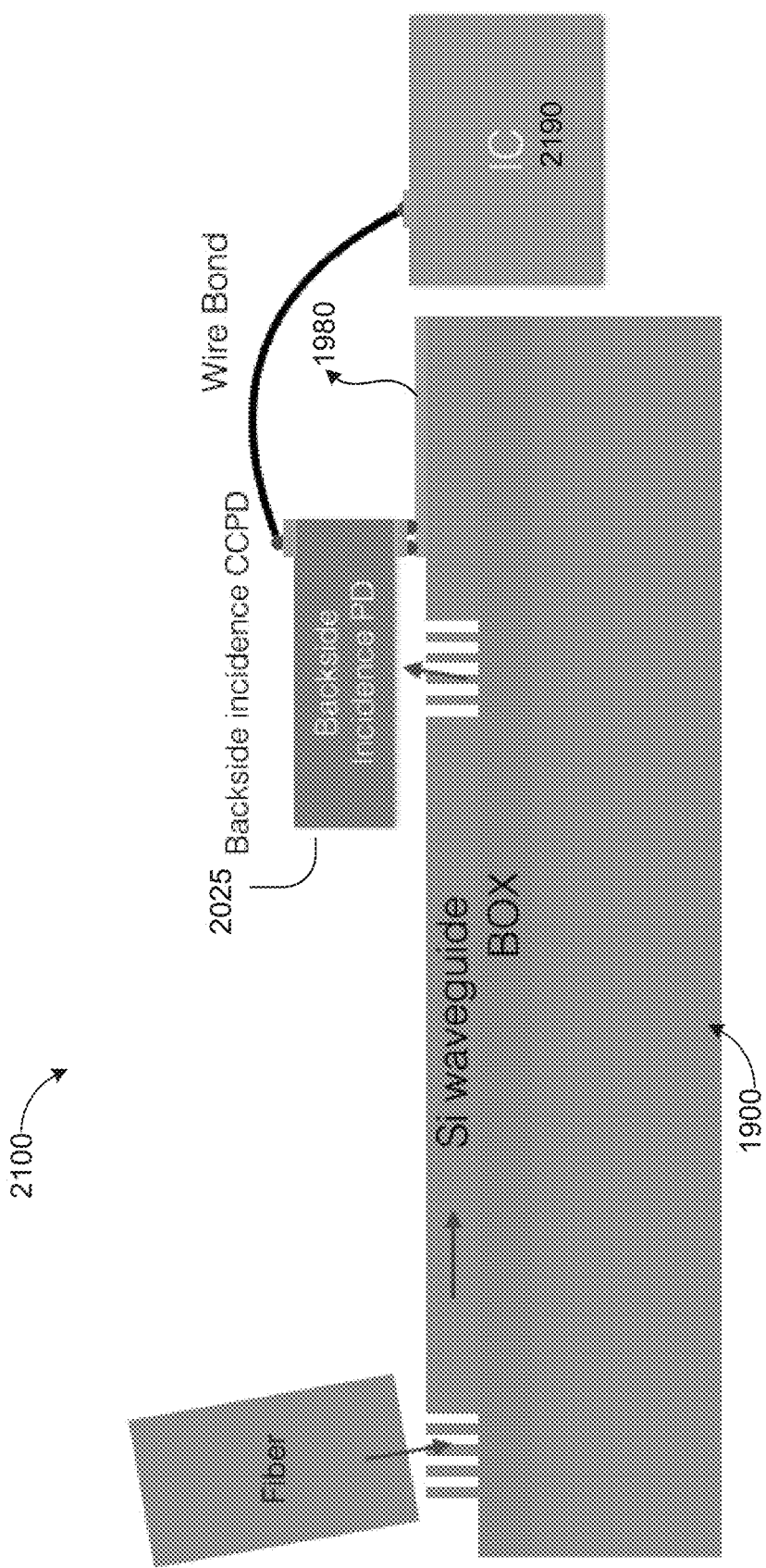
FIG. 21 shows an example schematic of another waveguide system embodying one or more techniques introduced here.

FIG. 21 shows an example schematic of another waveguide system 2100 embodying one or more techniques introduced here. Compared to the system 2000, system 2100 includes a back side incidence HP-PD 2025 (e.g., a single or double mirror PD). The HP-PD 2025 is bonded to the ponding pad 1980. Light signals are directed into the in-plane Si waveguide system 2100 though couplers 1930. Light signals travel in the Si waveguides 1900 and, in some examples, can split into multiple channels through a splitter such as demultiplexer (DeMUX). Each channel of light can be then re-directed out-of-plane to the bonded PD 2025 for signal collection. More examples of the multi-channel application are discussed in FIGS. 22A-22B.

The extracted electrical signals from the PD 2025 are sent to the IC 2190. The signal can be transferred through bond wire or flip-chip bonding pad. In the example shown in FIG. 21, the IC 2190 is wire bonded to another side of the HP-PD 2025. The IC 2190 is configured to process the output from the PD 2025.

Figure 22A:
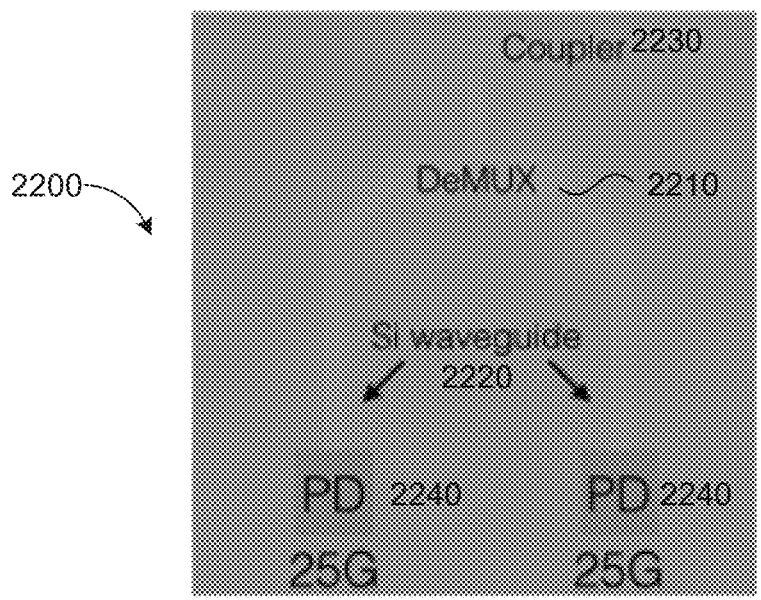
FIGS. 22A-22B show examples of multi-channel receiver modules that can be realized with embodiments of the present disclosure.
Figure 22B:
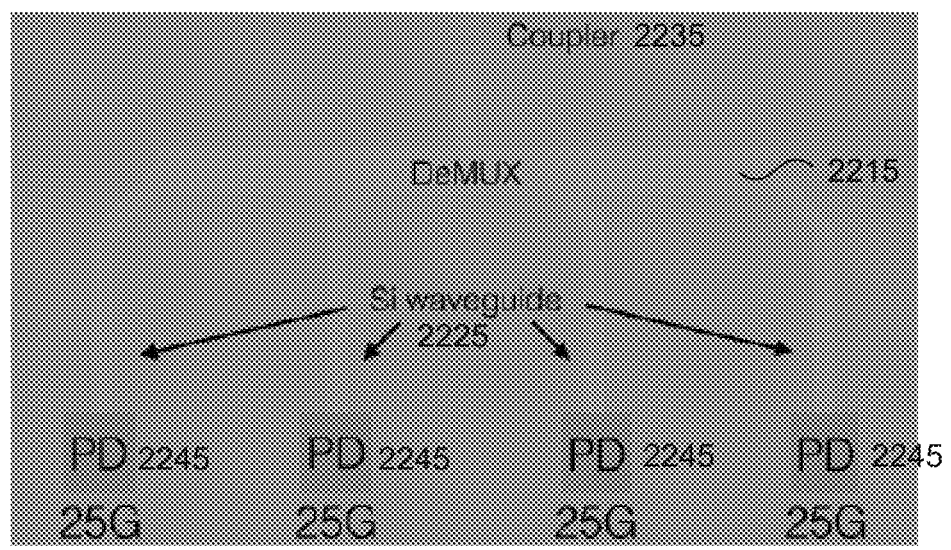

FIGS. 22A-22B show examples of multi-channel receiver modules that can be realized with embodiments of the present disclosure. Advantages of utilizing a waveguide-based wavelength-division multiplexing (WDM) system as disclosed here can include reduced fiber cost compared to traditional, non-WDM systems, noting that the fiber cost typically is a major factor for mid-to-long-range applications.

Shown in FIG. 22A is a top view of a dual-channel Si waveguide passive system 2200 with a DeMUX 2210, an Si waveguide 2220 and couplers 2230. Two 25 Gbps PDs 2240 are bonded on the top of their respective couplers 2230 (obscured by the PDs 2240) to enable a 50 Gbps receiver module. In some embodiments, with the implementation of four-level pulse-amplitude modulation (PAM-4) signal, the bandwidth of the receiver module can be boosted up to 100 Gbps. The PDs 2240 can be single or double mirror PDs. In some implementations, the target wavelength is single mode near 1310 nm or single mode near 1550 nm.

Shown in FIG. 22B is a top view of a quad-channel Si waveguide passive system 2205 with a DeMUX 2215, an Si waveguide 2225 and couplers 2235. Four 25 Gbps PDs 2245 are bonded on the top of their respective couplers 2235 to enable a 100 Gbps receiver module. With the implementation of PAM-4 signal, the receiver module's bandwidth can be boosted up to 200 Gbps. Other PAM schemes, such as PAM-8, PAM-16, and so forth, or other modulation and encoding/decoding schemes may also be applicable.

Modified Aluminum-Germanium Eutectic Alloy Bonding and its Application

In the art of microelectromechanical systems (MEMS) and complementary metal oxide semiconductor (CMOS) packaging, known bonding techniques include anodic bonding, metal diffusion bonding, eutectic alloy bonding, direct bonding, glass frit bonding, adhesive/polymer bonding, etc. Among them, eutectic alloy bonding generally has an overall bonding performance that is preferable over the other techniques when multiple factors are considered, such as bond force, bond temperature, alignment capability, hermetic seals, heterogeneous integration, and roughness requirement. Several materials systems have been known for use as the eutectic alloy bonding layer for wafer-to-wafer bonding. Examples of these materials systems include aluminum-germanium (Al—Ge), aluminum-silicon (Al—Si), aluminum-copper-silicon (Al—Cu—Si), gold-silicon (Au—Si), gold-germanium (Au—Ge), and so forth. For eutectic alloys, the eutectic temperature (i.e., the temperature at which a particular eutectic mixture freezes or melts) is generally lower than the melting temperatures of each individual pure elements in the eutectic mixture. Typically, the eutectic temperature is around 580 degrees Celsius for Al—Si alloy, around 420 degrees Celsius for Al—Ge, around 360 degrees Celsius for Au—Ge alloy, and around 370 degrees Celsius for Au—Si alloy.

In the integrated circuit (IC) chip fabrication industry, the process of fabricating a semiconductor wafer is divided into different stages or groups of steps. These stages are commonly known as front-end-of-line (FEOL), middle-of-line (MOL) and back-end-of-line (BEOL). The FEOL stage generally refers to the stage for forming devices (e.g., transistors) on or in a semiconductor wafer, e.g., forming doped regions, active areas, etc. The MOL stage is the stage where conductive structures are connected to the FEOL devices. The BEOL stage is the stage for final wafer processing where an active region is connected to outside circuitry. The BEOL interconnects are typically made of multiple low electrical resistivity metals; the bulk of the conductor is copper or aluminum. Aluminum generally costs less than copper and can be commonly found in modern ICs as the choice for CMOS BEOL metal interconnects.

With the above in mind, it is observed here that the eutectic temperature of known eutectic alloy materials systems can often exceed the typical thermal budget of CMOS back-end-of-line (BEOL) processes. (Note that bonding temperature, i.e., the temperature at which a eutectic alloy bonding is performed, can be even slightly higher (e.g., 10 to 20 degrees Celsius) than the eutectic temperature of the resulting alloy.) This issue presents a technical barrier for eutectic alloy wafer bonding on wafers that may have BEOL metal lines on them, because performing eutectic alloy wafer bonding at a bonding temperature higher than a tolerance temperature (which is usually around the melting point of the BEOL metal lines) can adversely impact the reliability and the electrical property of the formed BEOL metal lines. Take aluminum as an example for BEOL metal material. The thermal budget of such BEOL line is commonly around 400 degrees Celsius. Sometimes even when the BEOL metal material is copper, the thermal budget thereof can still be 400 degrees Celsius. Out of the four aforementioned examples, Al—Si, Al—Ge, and Au—Ge, and Au—Si, only Au—Ge and Au—Si alloy systems have a typical eutectic temperature that is below 400 degrees Celsius. However, Au—Ge and Au—Si contain gold, an expensive metal, and as such they are generally a less preferred materials systems because of their associated high cost. Al—Si's eutectic temperature is generally considered too high for Al—Si eutectic alloy bonding to be compatible with CMOS BEOL processes. Al—Ge eutectic alloy system presents a good candidate because it is of relatively low cost when compared to Au—Ge, and its eutectic temperature is lower than that of Al—Si. The Al—Ge alloy system is also a materials system that is compatible with manufacturing processes introduced here (e.g., with Ge-based photodetectors and CMOS transistors) and does not expose the process tools to additional potential contaminants. Having said that, a typical eutectic temperature of 420 degrees Celsius for conventional Al—Ge alloy system is still overly high for CMOS BEOL processes and can be undesirable for designs that need CMOS BEOL compatibility. The existing Al—Ge eutectic alloy system can also suffer from atomic Al grains forming uncontrollable spikes in the Al—Ge alloy, which can degrade the alloying bonding strength.

Accordingly, introduced here are techniques that can create a modified Al—Ge eutectic alloy system that has a eutectic temperature that is lower than the thermal budget commonly seen for CMOS BEOL aluminum metal interconnects. In many examples, the resulting modified Al—Ge eutectic alloy has a eutectic temperature that is lower than 400 degrees Celsius, and in some embodiments, between 350 degrees to 400 degrees Celsius. Further, through the control of different dopants (e.g., to the formed Ge layer) and optionally mixed with other treatment techniques (e.g., thermal or surface treatments), some embodiments provide the capability of selectively enhancing or suppressing the Al—Ge eutectic alloy formation (e.g., using a modified Ge material layer) based on design needs. Additionally, or alternatively, the selective enhancement or suppression of Al—Ge alloy formation can be performed to selective areas of design, thereby further achieving greater design flexibility. Moreover, according to one or more embodiments, grain spiking in the Al—Ge alloy can also be selectively suppressed (e.g., using a modified Al material layer).

Figure 23A:
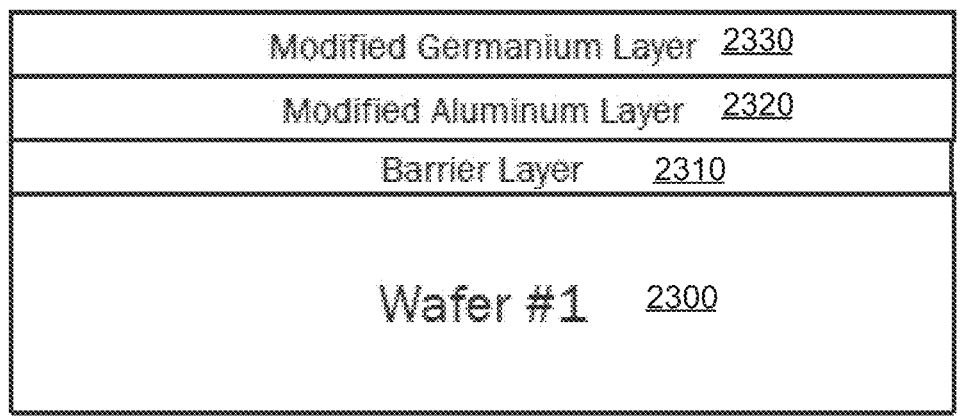
Figure 23A:
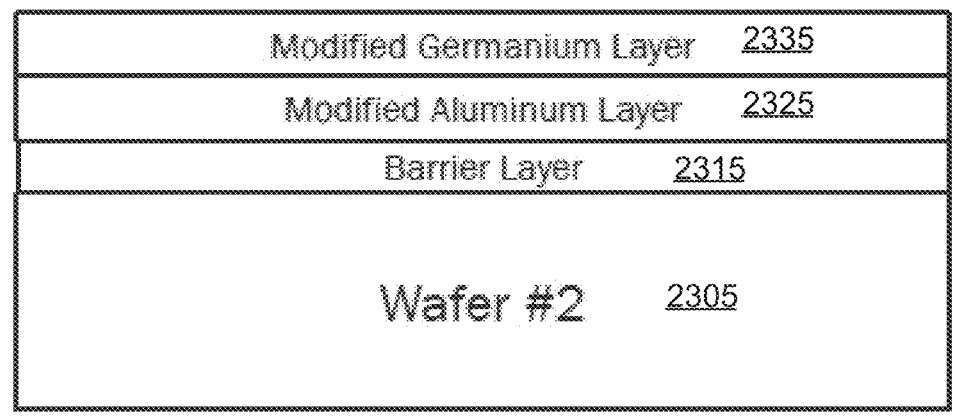

FIGS. 23A-23C illustrate an example modified aluminum-germanium (Al—Ge) eutectic alloy bonding scheme. FIG. 23A includes a first wafer 2300 and a second wafer 2305. According to the present embodiments, a modified Al—Ge eutectic alloy system that has a lowered eutectic temperature (e.g., 350-400 degrees Celsius) can be formed by forming one or more modified germanium layers and one or more modified aluminum layers onto the wafers. In a number of implementations, the modification includes impurity doping using select dopants. In the example shown in FIG. 23A, a modified aluminum layer 2320 and a modified germanium layer 2330 both are formed over the wafer 2300. However, the modified germanium and/or the modified aluminum layers described here can be formed on either wafers, or both, that are to be bonded together.

It is observed in the present disclosure that certain carefully selected pre-bonding treatment processes to the aluminum layer and/or the germanium layer can result in a reduction of the eutectic temperature of the resulting Al—Ge alloy. Specifically, the pre-bonding treatment processes disclosed herein can include impurity doping, and can further include other types of treatment, such as thermal pre-bonding treatments and/or surface pre-bonding treatments. Depending on the dopant selected, pre-bonding treatment processes can be used to either enhance or suppress formation of the Al—Ge eutectic alloy.

According to some embodiments, the pre-bonding treatment processes are performed to the germanium (Ge) layers (e.g., layer 2330, layer 2335) to either enhance or suppress the Al—Ge alloy formation. The enhancement type of dopant species for Ge can generally include group-III, group-IV elements, or transition metals. Specific examples of enhancement type of dopant include boron (B), tin (Sn), copper (Cu), gold (Au), or aluminum (Al). (Note that, cost wise, using Au as dopants is generally much less expensive than forming a full Au layer that may be 0.5-1.0 μm thick.) These enhancement type of dopants are found to significantly enhance the formation of the Al—Ge eutectic alloy. Not only so, the resulting Al—Ge eutectic alloy is found to have a eutectic temperature in the range of 350-400 degrees Celsius, which is meaningfully lower than 420 degrees of a typical Al—Ge eutectic alloy system. It is noted here that, although for simplicity of discussion, the suppression type of dopant species are discussed with respect to impurity doping to the Ge layer, these dopants are generally applicable to doping to the Al layer as well because as long as these dopants, when mixed with Al, do not become in some way suppressive to the Al—Ge alloy formation, they will be effectively mixed into the Al—Ge alloy during the eutectic alloy bonding process regardless of whether they are doped to the Ge or Al layer.

In accordance with some other embodiments, the suppression type of dopant species for Ge can generally include group-V elements. Specific examples of suppression type of dopant include phosphorus (P), arsenic (As), or fluorine (F). These suppression type of dopants are found to suppress the formation of Al—Ge eutectic alloy. Depending on the embodiment, the dopant impurity can be grown in-situ, by ion implantation (e.g., for applications that may require localized control of alloy formation, discussed further below), or pre-alloyed with Ge. The concentration of the impurity doping can be, e.g., less than 10% of the atomic weight in germanium. Note that, because of the above-mentioned enhancement or suppression properties of different impurity dopants, the area where the impurity is distributed (e.g., doped) may be used to define the area where has Al—Ge alloy formation.

Next, depending on the embodiment, thermal treatments and/or surface treatments can be performed to the modified (e.g., doped) germanium, such that the enhancement or the suppression properties of the dopant can be further increased/magnified. For example, for a wafer that has the modified germanium layer but does not have BEOL metals on it (whether it is a wafer without any circuitry, or before circuitry formation), pre-bonding thermal treatment (e.g., up to 800 degrees Celsius) can be performed to anneal the formed materials layer. In other examples, the thermal treatment may be performed under different conditions or parameters to achieve desired effects (e.g., to activate the dopants by making them active ions before bonding). For the embodiments with localized bonding control, where the impurities may be implanted locally, the thermal treatment can also be performed locally, such as laser annealing, to increase the effect of the dopants. In some embodiments, localized heating (e.g., laser annealing) can also be utilized to perform pre-bonding treatment to a wafer that has BEOL circuitry; for example, with laser annealing, the heated region can be generally limited to the depth of focus of the laser beam profile, thereby avoiding overheating the rest of the wafer (e.g., where BEOL metal wires may be located). Example pre-bonding surface treatments may include surface cleaning to remove native oxide, polymer, and/or other unwanted particles on the germanium surface. Other surface treatment examples include chemical soaking and rinse, or gas plasma sputtering. In some embodiments, chemical soaking may also be used to change the Ge surface texture on an atomic level. Plasma treatment may also be used to add additional types of atom on the Ge surface. Generally, plasma or chemical treatment can reduce the surface barrier energy state (e.g., by creating dangling bonds on Ge) to improve bonding quality and lower the needed bonding temperature. Plasma/chemical surface treatment can also be performed for purposes of removing undesirable atom contaminants, e.g., organic materials. Example plasma species may include: $H_2$, $NH_3$, Ar, $O_3$, $CF_4$, $SF_6$.

It is noted here that the thermal and/or surface treatments disclosed here should be applied with discretion, i.e., suitable for a selected dopant specie and for a particular design. For example, generally speaking, hydrogen containing plasma treatment can help remove native oxides, which may enhance the Al—Ge alloy formation; in contrast, again in general terms, oxygen containing plasma treatment can oxidize the surface, which may suppress the Al—Ge alloy formation. Although thermal and/or surface treatments can modify the Ge surface properties and microstructure, which may be used to suppress or to enhance the eutectic alloy formation, but generally speaking, the effect of surface treatments is much smaller than the impurity doping techniques described here, and therefore the purpose of such treatments should not be alter (or even counter) any enhancement or suppression effect from dopants. Rather, the surface treatments affect more on the Al—Ge surface microstructure and should be performed to assist the originally designed effect of enhancement or suppression of the dopants on the Al—Ge eutectic alloy formation. Also, note that a person having ordinary skill in the art should be able to understand and ascertain which plasma species are suitable for a particular field application.

In some implementations, the pre-bonding surface treatment may include additional surface layer deposition (not shown in FIG. 23A for simplicity). The additional surface layer can be used to further modify the eutectic temperature of the alloy and to define alloy formation location. According to some embodiments, the additional surface layer is less than 10% the atomic weight of the Al—Ge bonding layers. The additional surface layer may include: crystalline, polycrystalline or amorphous Si, Ge, Sn; elemental Ni, Ti, Al, W, Cu, Au, Sb, Te, Cd; compound material TiN, TaN, TiW; porous dielectrics $SiO_x$, $SiN_x$, or a suitable combination of the above. Depending on the implementation, the additional surface layer may be deposited during the previously mentioned plasma treatment or pre-alloyed with Ge as a source.

Further, according to some embodiments, the pre-bonding treatment processes are performed to the aluminum (Al) layers (e.g., layer 2320, layer 2325) to enhance the Al—Ge alloy formation. The enhancement type of dopant species for Al can include Si, Cu, Au, and Sn. Some more specific example materials can include a system having Al with 1% Si, or a system having Al with Cu and/or Si (e.g., <5% wt.) Similar to what is discussed above with regard to the modified Ge, surface and/or thermal treatments may be performed to the modified Al to enhance Al—Ge eutectic alloy formation. Specifically, surface cleaning methods can be performed to remove native oxide, polymer, and/or unwanted particles on the Al surface. Thermal treatment may also be used to modify the Al grain size.

An optional barrier layer 2310 is also formed on the wafer 2300. The barrier layer 2310 may be used to separate the eutectic alloy materials from the wafer 2300 (as well as circuitry that may be on the wafer 2300, e.g., semiconductor devices shown in FIG. 30). The barrier layer 2310 can also provide adhesion to the wafer. According to the present embodiments, the selection of the material and thickness should be suitable such that the barrier layer 2310 can remain intact after the eutectic alloy bonding processes. In some implementations, the total thickness of the barrier layer may be around or, depending on the application, even less than 50 nm. The material for the barrier layer can be titanium (Ti), titanium nitride (TiN), tantalum (Ta), tantalum nitride (TaN), or other suitable materials. In some examples, the barrier layer may be in itself layered (e.g., with multiple stacks of barrier materials).

After the formation of the modified aluminum layers 2320, 2325, and modified germanium layers 2330, 2335 over their respective wafers 2300, 2305, a wafer bonding process is performed to bond together the wafers 2300 and 2305. Shown in FIG. 23B is the wafers 2300 and 2305 in FIG. 23A, placed with their top sides having formed layers (e.g., modified germanium layers 2330 and 2335) facing each other and aligned, ready for bonding. Thereafter, the wafer pairs are heated to form the Al—Ge eutectic alloy bonding layer 2340, and the resulting structure after the bonding is shown in FIG. 23C. In some embodiments, additional force or pressure (e.g., 10 kilonewtons) may be applied to the two wafers during the eutectic alloy wafer bonding process. In accordance with the present embodiments, the eutectic temperature of the resulting Al—Ge alloy can be reduced down to 350 to 400 degrees Celsius, and therefore the bonding temperature at which the wafer bonding process is performed can be below a tolerance (e.g., melting) temperature of a CMOS BEOL metal line (e.g., aluminum-based metal line, 400 degrees Celsius). In some embodiments, the temperature range at which the wafer bonding process is performed can be from 350-400 degrees Celsius. The resulting Al—Ge eutectic alloy bonding layer 2340 bonds the two wafers 2300 and 2305 together.

Note that bonding formation and anneal conditions, including temperature, time and press force, can be adjusted in order to control the amount Al/Ge consumed in the eutectic alloy formation. As such, according to some embodiments, the Al—Ge layers after eutectic alloy formation may not necessarily consume all of the formed Al and Ge layers. The practical application of this technique is further discussed below with respect to FIG. 27A and after.

As mentioned previously, the disclosed modified Ge and/or modified Al layers can be formed on either the first wafer, the second wafer, or both. Even though the example shown in FIGS. 23A-23C have symmetrical stacking on the two wafers, it need not be so. Any suitable combinations, including one or more layers of modified Ge and/or modified Al on any given wafer, may be achieved. In other words, the top surface of the resulting Al/Ge stacks can be either modified Al or modified Ge. Although a Ge—Ge contacting surface is shown in the example of FIGS. 23A-23C, the contacting surfaces between the first wafer (e.g., wafer 2300) and the second wafer (e.g., wafer 2305) can be either Ge—Ge, Al—Al, or Al—Ge. The actual contacting surface can be determined depending upon the actual field application and manufacturing process (e.g., based on the characteristics of a particular equipment that performs the native oxide cleaning process).

Figure 24A:
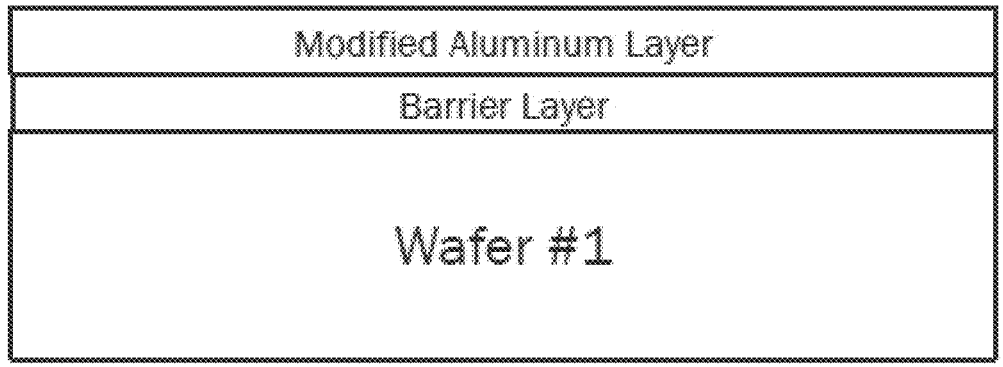
FIGS. 24A-24B illustrate another example of the modified Al—Ge alloy system introduced here.
Figure 24A:
Figure 24B:
Figure 25:
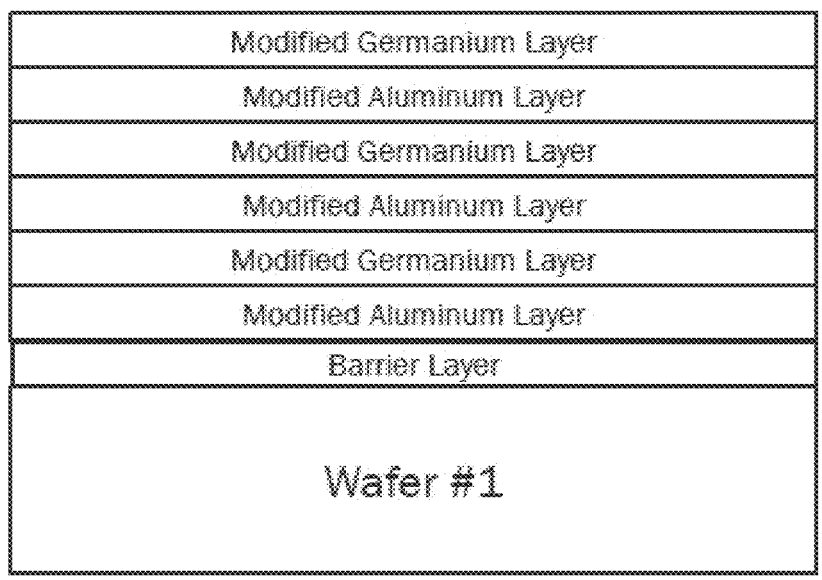
FIG. 25 illustrates yet another example of the disclosed modified Al—Ge alloy system.

FIGS. 24A-24B illustrate another example of the modified Al—Ge alloy system introduced here, and FIG. 25 illustrates yet another example of the disclosed modified Al—Ge alloy system. In the example shown in FIG. 24A, the first wafer only has a modified aluminum layer, and the second wafer has a modified germanium layer. In this case, the contact surface for the eutectic alloy wafer bonding becomes Al—Ge, such as shown in FIG. 24B. In the example shown in FIG. 25, six layers of modified germanium and modified aluminum layers are stacked over the first wafer in an interleaved manner. Depending on the application, the second wafer (not shown for simplicity) may have similar materials stacking, or it may have a different stacking. According to some embodiments, the thickness of the total Al/Ge stacks of can be approximately 1 μm on the first wafer, with each Al layer/Ge layer being approximately 0.167 μm. It is noted that, generally, the thinner each Al/Ge layer is, the easier it is for the Al—Ge alloy to form (because it is easier for the materials to diffuse), which usually translates to shorter bonding time and better alloy quality. However, the design can become more susceptible to manufacturing defects as Al/Ge layers becomes thinner, since depending on the size of a defect particle, a thicker design might be able to cover it while a thinner design might not. Manufacturing more layers of Al/Ge generally can be costlier as well. As such, care should be taken in choosing the number of Al/Ge layers for eutectic bonding purposes.

Figure 26:
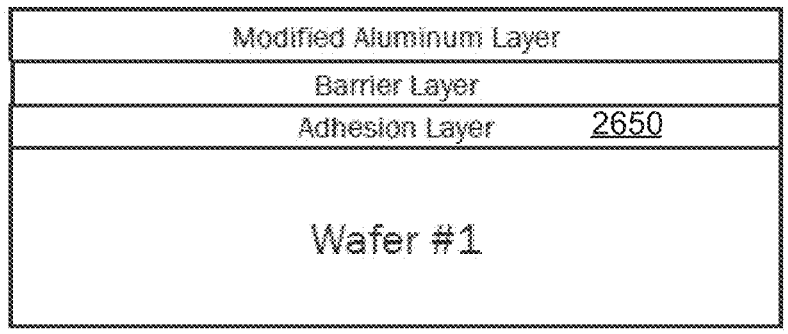
FIG. 26 illustrates an optional adhesion layer that may be employed together with the modified Al—Ge alloy system.
Figure 26:
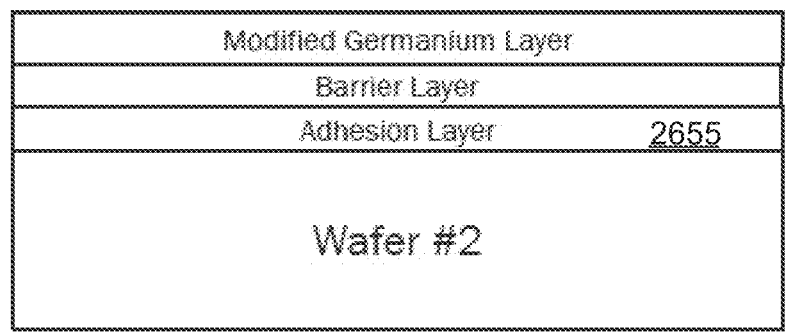

FIG. 26 illustrates an optional adhesion layer 2650/2655 that may be employed together with the modified Al—Ge alloy system. In addition to the barrier layers (e.g., barrier layers 2310 and 2315), the adhesion layers 2650 and 2655 can further improve the adhesion of the barrier layers themselves to the wafers.

Figure 27A:
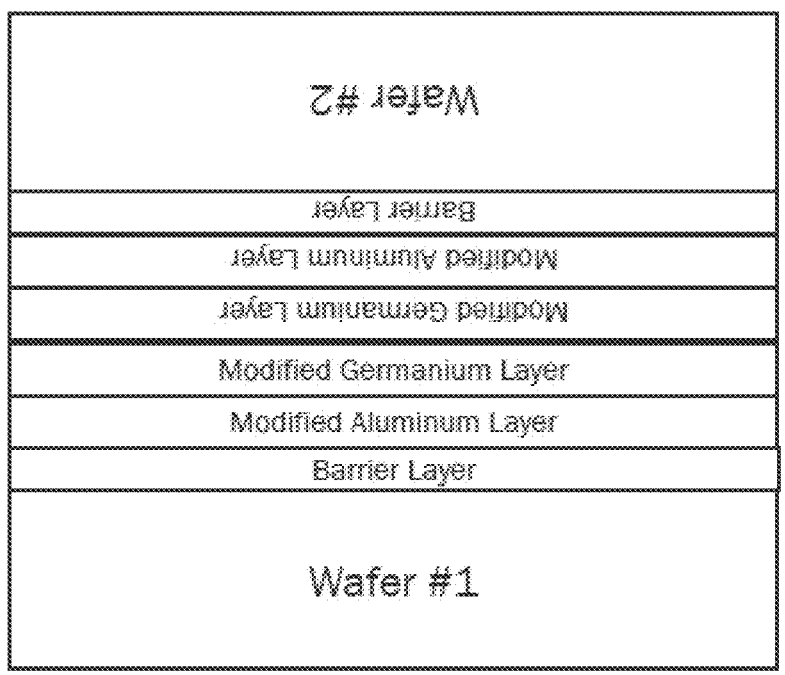
FIGS. 27A-27B illustrate a variant of the modified Al—Ge alloy technique, where the alloy formation only consumes a portion of the disclosed modified Al and/or Ge layers.
Figure 27B:
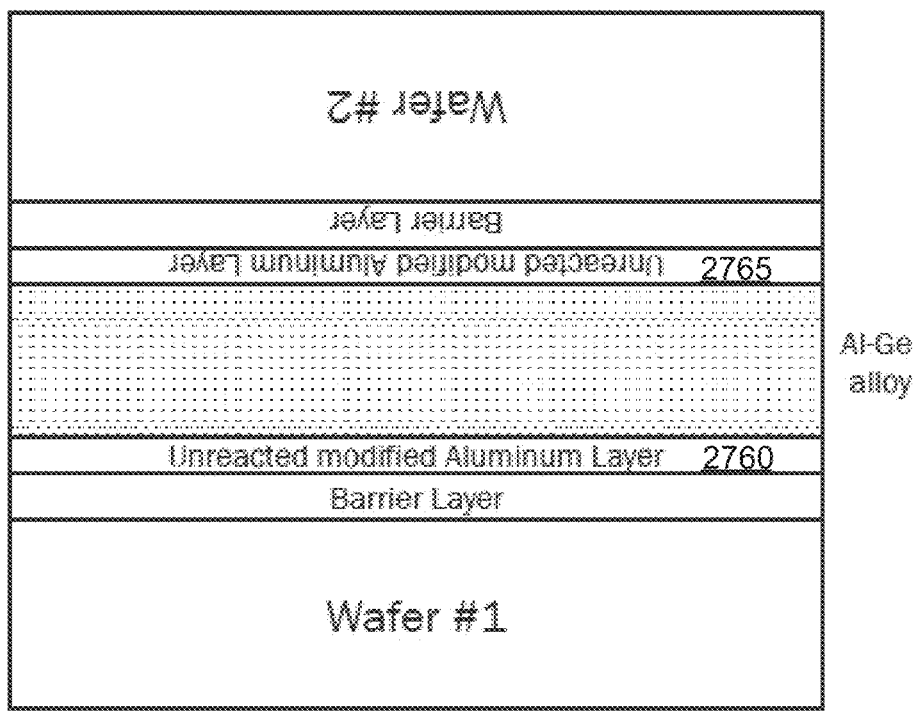

FIGS. 27A-27B illustrate a variant of the modified Al—Ge alloy technique, where the alloy formation only consumes a portion of the disclosed modified Al and/or Ge layers. As discussed above, the Al—Ge eutectic bonding techniques disclosed here include carefully designing the thickness of the Al and Ge materials layer for the bonding such that in some implementations, after bonding, there can be residual Al layer and/or residual Ge materials. One valuable application of the residual layer (e.g., residual Al layer) is that, if designed and manufactured properly, it can function as a mirror structure for the photodetectors. In the example shown in FIG. 27A, the Al—Ge stack sequence starts from Al then Ge. After Al—Ge eutectic alloy formation, the formed Ge layer is completely consumed in the alloy formation process, but there is residual Al left unused. The residual Al layers 2760 and 2765 are shown in FIG. 27B. This can be achieved by fine tuning Al and Ge layer thicknesses. Roughly speaking, the consumption ratio of Al and Ge in the Al—Ge eutectic alloy formation process is approximately 1:1, which can be used to control the existence and the thickness of the residual Al layer(s).

Figure 28A:
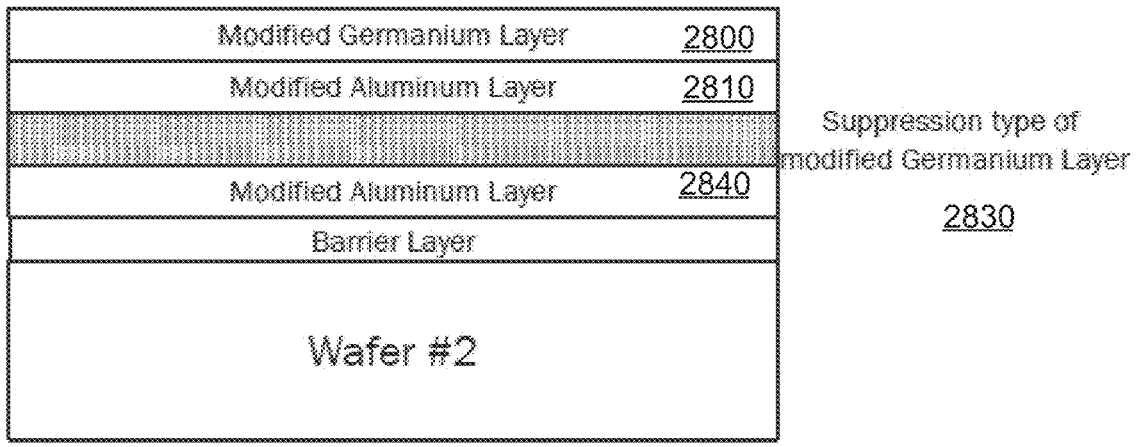
FIGS. 28A-28B illustrate another variant of the modified Al—Ge alloy technique, where a suppression type modification (e.g., via certain impurity doping) is used to more precisely control the amount of Al—Ge eutectic alloy layer formation.
Figure 28B:
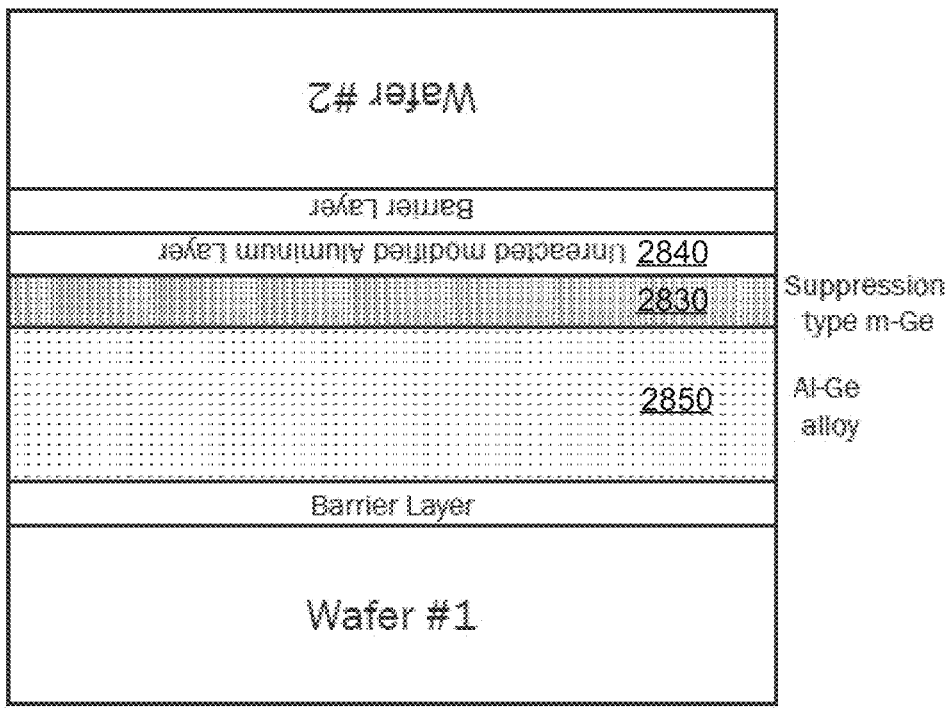

FIGS. 28A-28B illustrate another variant of the modified Al—Ge alloy technique, where a suppression type modification (e.g., via certain impurity doping) is used to more precisely control the amount of Al—Ge eutectic alloy layer formation. Utilizing the technique of suppression type of impurity doping (discussed above) and in view of what is discussed above with respect to FIG. 27A-27B, one can even more precisely control the location and/or pattern of the residual Al layer. In the example shown in FIG. 28A, an enhancement type of dopant is used in modified germanium layer 2800, while a suppression type of dopant is used in another modified germanium layer 2830. After eutectic bonding, as shown in FIG. 28B, the enhancement type modified Ge layer 2800, as well as a modified Al layer 2810, has mixed with other Al/Ge layers on the other wafer and formed the Al—Ge eutectic alloy bonding layer 2850 that bonds the two wafers together. However, both the suppression type Ge layer 2830 and the aluminum layer 2840 below the layer 2830 remain unreacted.

Figure 29A:
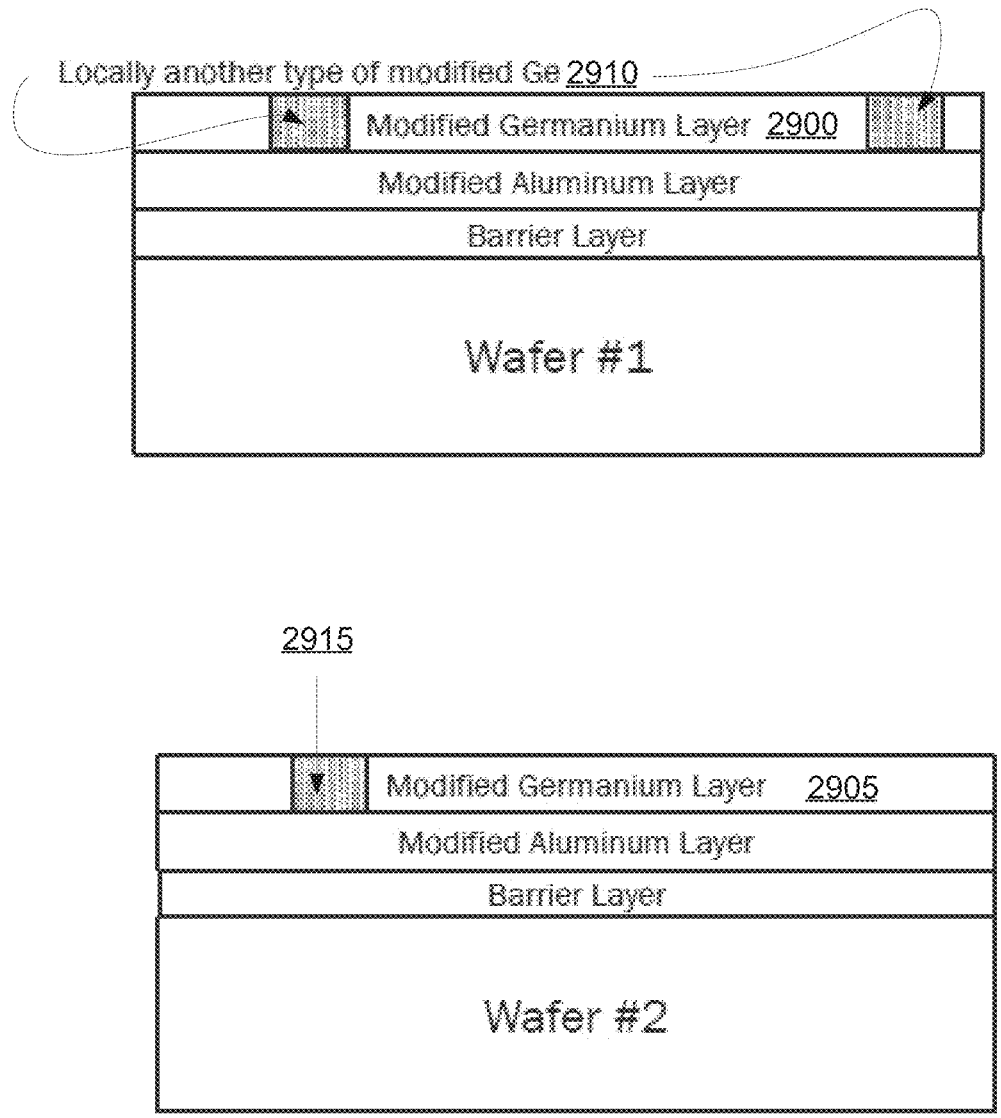
FIGS. 29A-29D illustrate an example method that utilizes different modified Al—Ge alloy techniques on selected areas to induce different effects (e.g., enhanced or suppressed) in eutectic alloy formation in those areas.
Figure 29B:
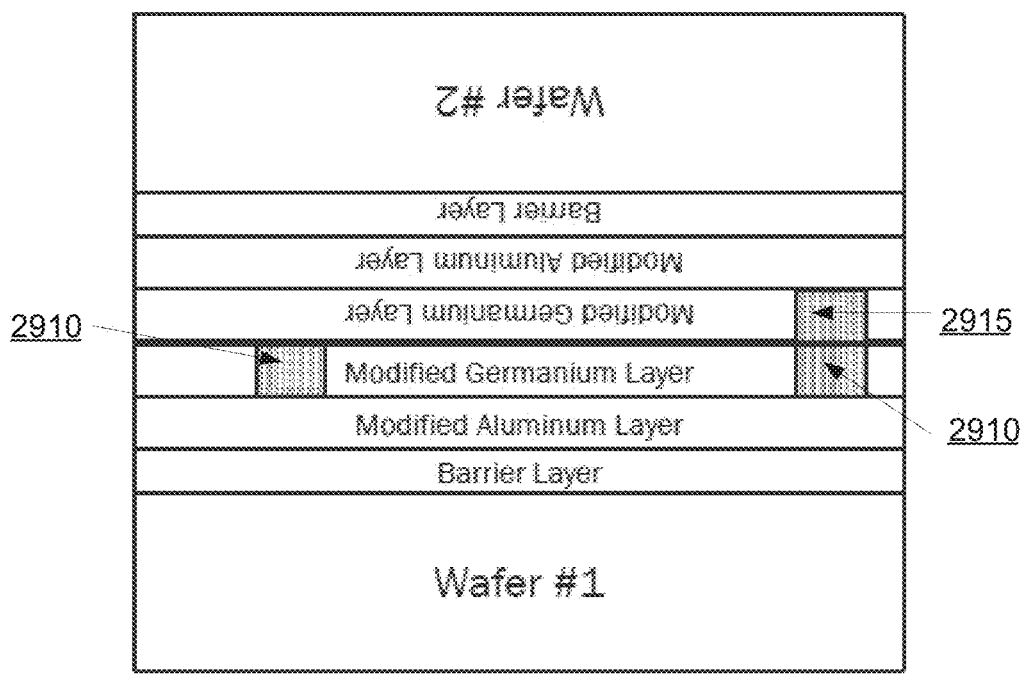
Figure 29C:
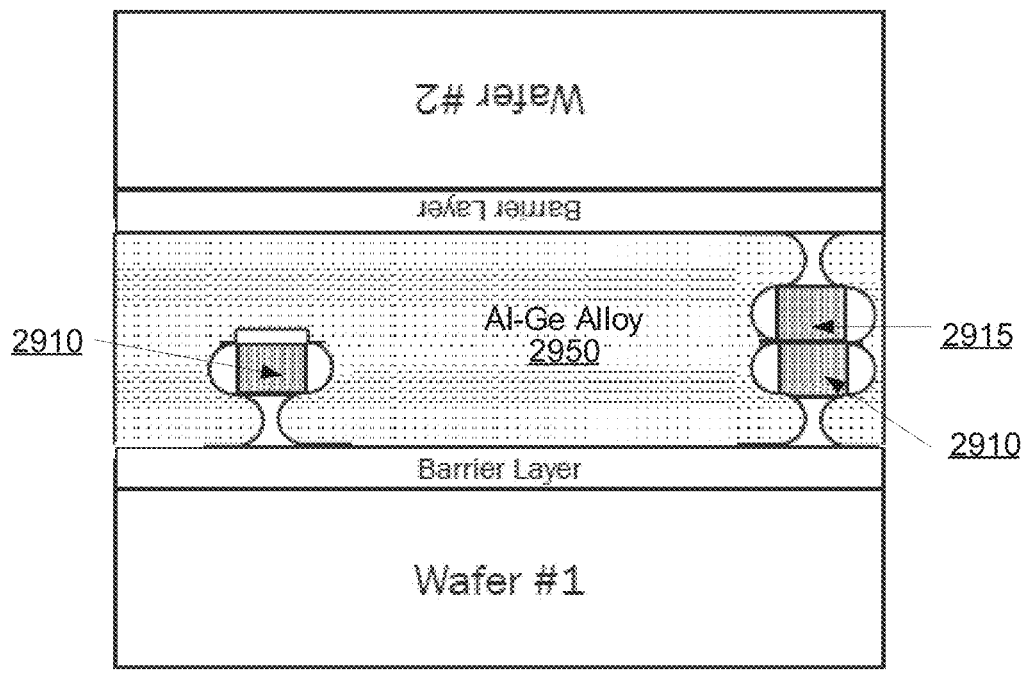
Figure 29D:
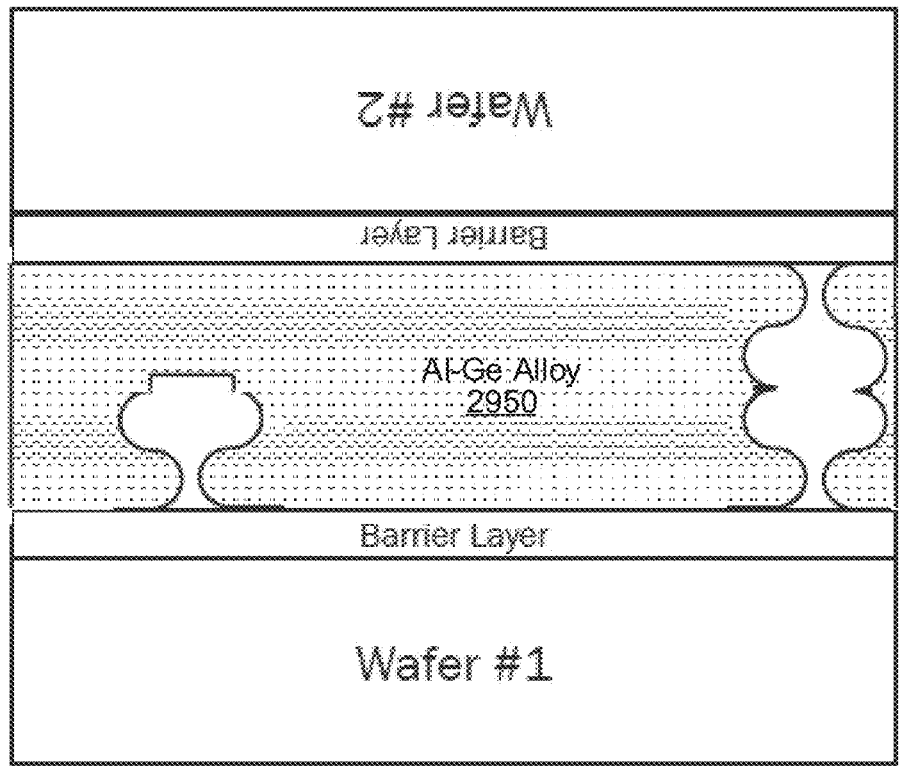

FIGS. 29A-29D illustrate an example method that utilizes different modified Al—Ge alloy techniques on selected areas to induce different effects (e.g., enhanced or suppressed) in eutectic alloy formation in those areas. In the illustrated example, the first wafer includes a modified (e.g., enhancement) type of Ge layer 2900, but in the same height level, there are two areas that have a different modified (e.g., suppression) type of Ge layer 2910. Similarly, on the second wafer, there is a modified (e.g., enhancement) type Ge layer 2905 but with a local area that has a different modified (e.g., suppression) type of Ge layer 2915. In some implementations, the different types of impurity dopants in layers 2900 and 2910 are implanted locally using ion implantation. Additionally, surface treatment may also be performed locally and on individual wafers. FIG. 29B shows the two wafers being aligned and ready for eutectic bonding, and FIG. 29C shows the structure after the bonding processes. As shown in FIG. 29C, not only are the suppression type local Ge layers 2910 and 2915 remain unused in the Al—Ge eutectic alloy formation, but their suppression effect also leaves partial, unreacted Ge and/or Al layers around them, creating a unique, cave like structure in the Al—Ge eutectic alloy bonding layer 2950. Thereafter, optionally, the unreacted Ge and/or Al layers may be removed, e.g., by submerging the resulting wafer into chemical etching liquid with suitable selectivity. An example of the resulting structure after removing unreacted Ge/Al layers is shown in FIG. 29D.

Figure 30:
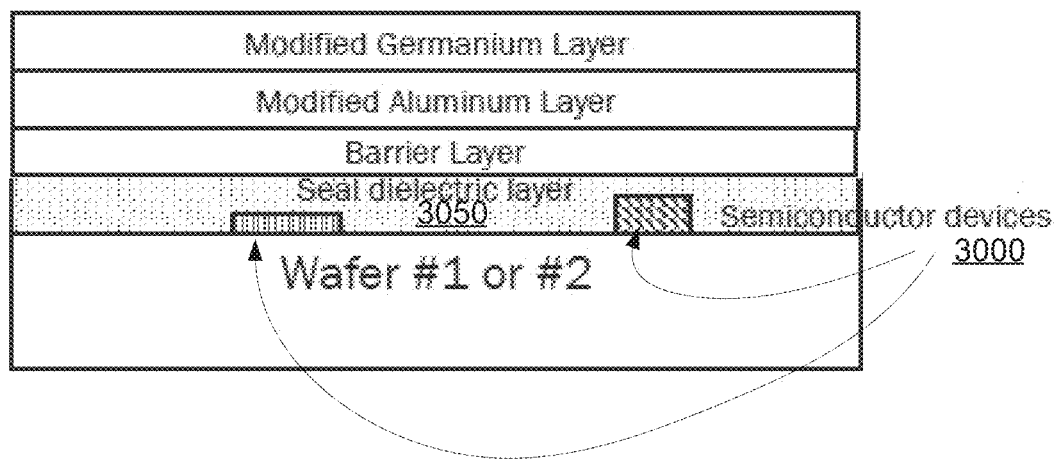
FIG. 30 illustrates an example application scenario in which the modified Al—Ge eutectic alloy bonding technique is applied on a wafer that includes formed semiconductor devices (e.g., photodetectors).

FIG. 30 illustrates an example application scenario in which the modified Al—Ge eutectic alloy bonding technique is applied on a wafer that includes formed semiconductor devices (e.g., photodetectors). As shown in FIG. 30, the CMOS or MEMS wafer (labeled as wafer #1 or #2) can include a number of semiconductor devices 3000 on the wafer's front side surface. According to one or more embodiments, applications of this technique may include CMOS logic devices, CMOS image sensors, photonics, MEMS, etc. Examples of the semiconductor devices 3000 (including optical devices) may include CMOS transistors, transducers, microelectromechanical devices, photodetectors, waveguides, optical-electrical modulators, light-emitting diodes and laser diodes, microfluid devices or sensors.

Figure 31A:
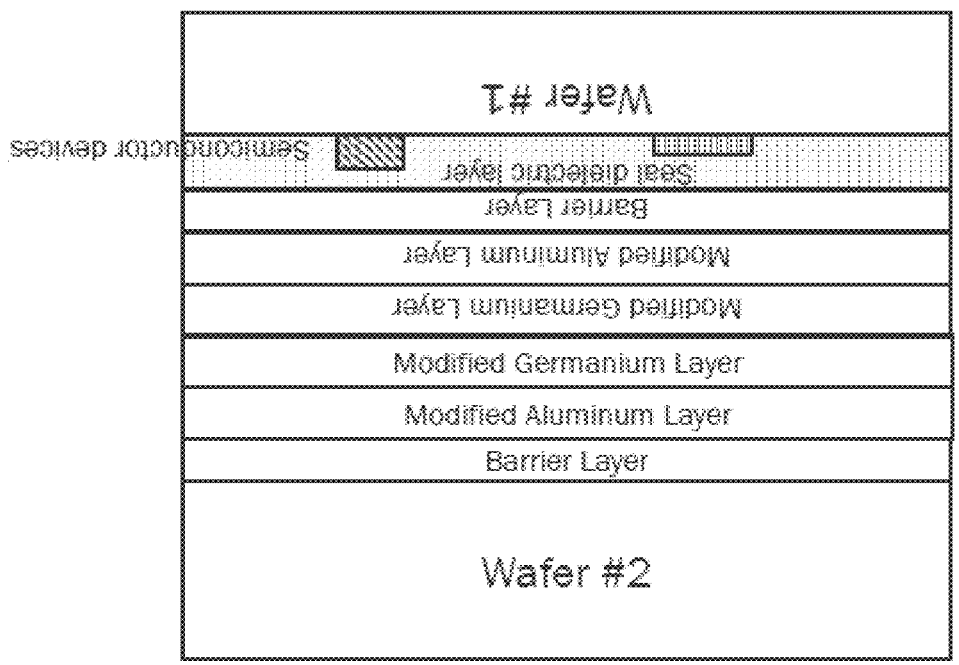
FIGS. 31A-31B illustrate the modified Al—Ge bonding techniques applied on a wafer with formed semiconductor devices, such as the one shown in FIG. 30.
Figure 31B:
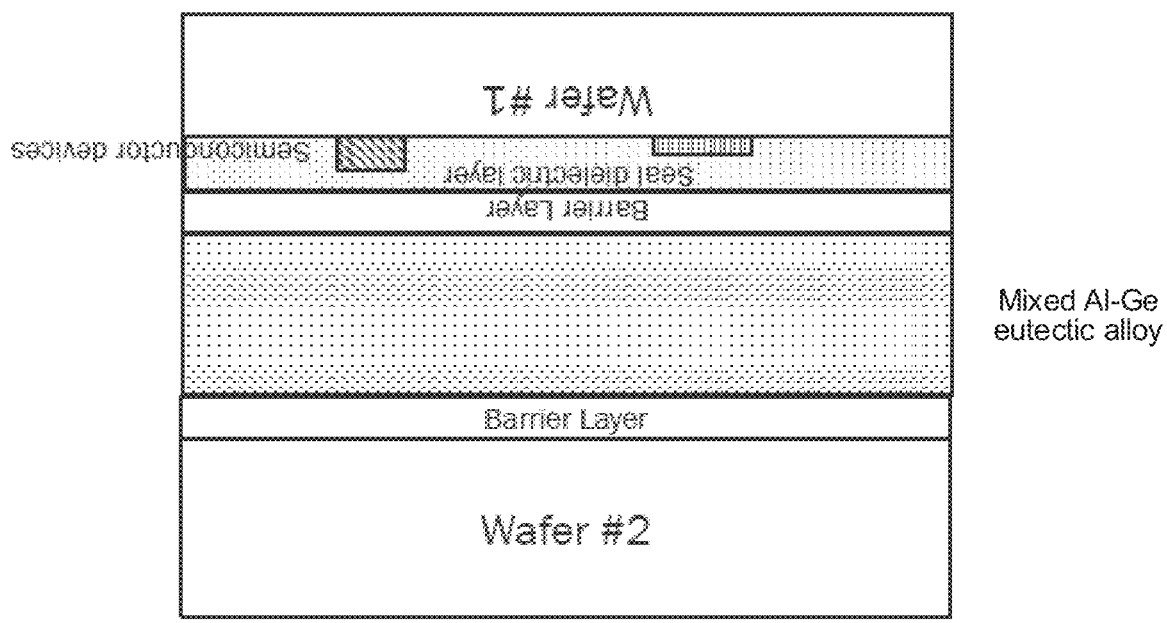

The devices 3000 may be enclosed and protected in, e.g., a dielectric layer 3050. The dielectric layer 3050 may be planarized before the bonding materials deposition (e.g., barrier layer, modified Al layer, and modified Ge layer) to reduce surface topology. Example materials for the dielectric layer 3050 can include silicon oxide, or silicon nitride. In some embodiments, there can be vias (i.e., vertical interconnects) in the dielectric layer 3050. In addition, depending on the application, the back surface of the substrate of the wafer may be thinned to a thickness below 100 µm after or prior to the eutectic bonding processes discussed here. FIGS. 31A-31B illustrate the modified Al—Ge bonding techniques applied on a wafer with formed semiconductor devices, such as the one shown in FIG. 30. In FIG. 31A, the wafer in FIG. 30 is aligned and ready for eutectic bonding with a second wafer that includes aluminum and germanium layers modified by the techniques (e.g., enhancement type impurity doping) disclosed here. FIG. 31B shows the resulting mixed Al—Ge eutectic alloy that bonds the two wafers.

Putting it all together, FIGS. 32A-32F illustrate various examples of photodetector circuitry formed using the bonding techniques disclosed here to form mirror or other optical structures. The first example shown in FIG. 32A includes at least a semiconductor device that is a photodetector (PD). In the specific example, the disclosed Al—Ge bonding technique can be used to control the amount of Al/Ge used in the Al—Ge eutectic alloy formation such that a residual layer of Al can remain after alloying. For example, to achieve the structure as shown, a stack including, in the top-down order, an enhancement type modified Ge layer, a modified Al layer, a suppression type modified Ge layer, another modified Al layer, and a barrier layer, on top of the first wafer. The second wafer can be the same second wafer as shown in FIG. 23A. The residual Al layer can function as a back reflector for the photodetector, thereby making the PD a double-pass type with increased quantum efficiency.

Figure 32A:
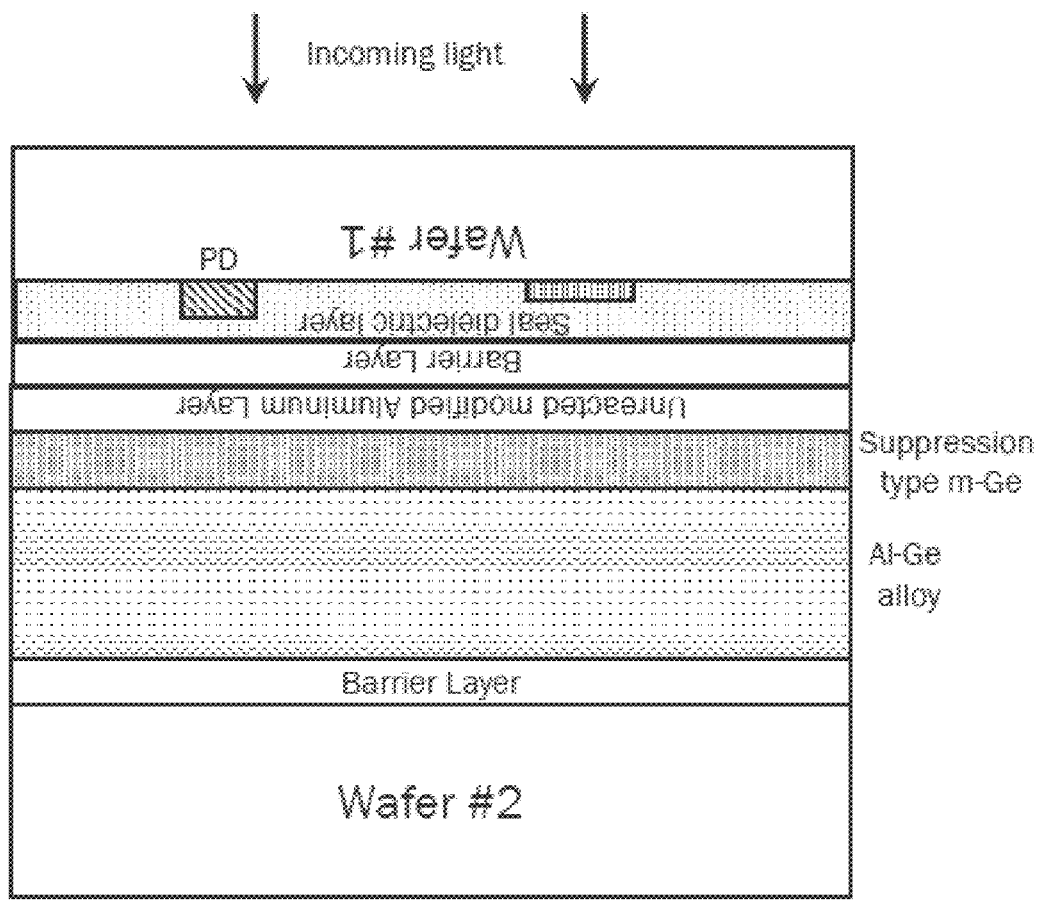
FIGS. 32A-32F-1 illustrate various examples of photodetector circuitry formed using the bonding techniques disclosed here to form mirror or other optical structures.
Figure 32B:
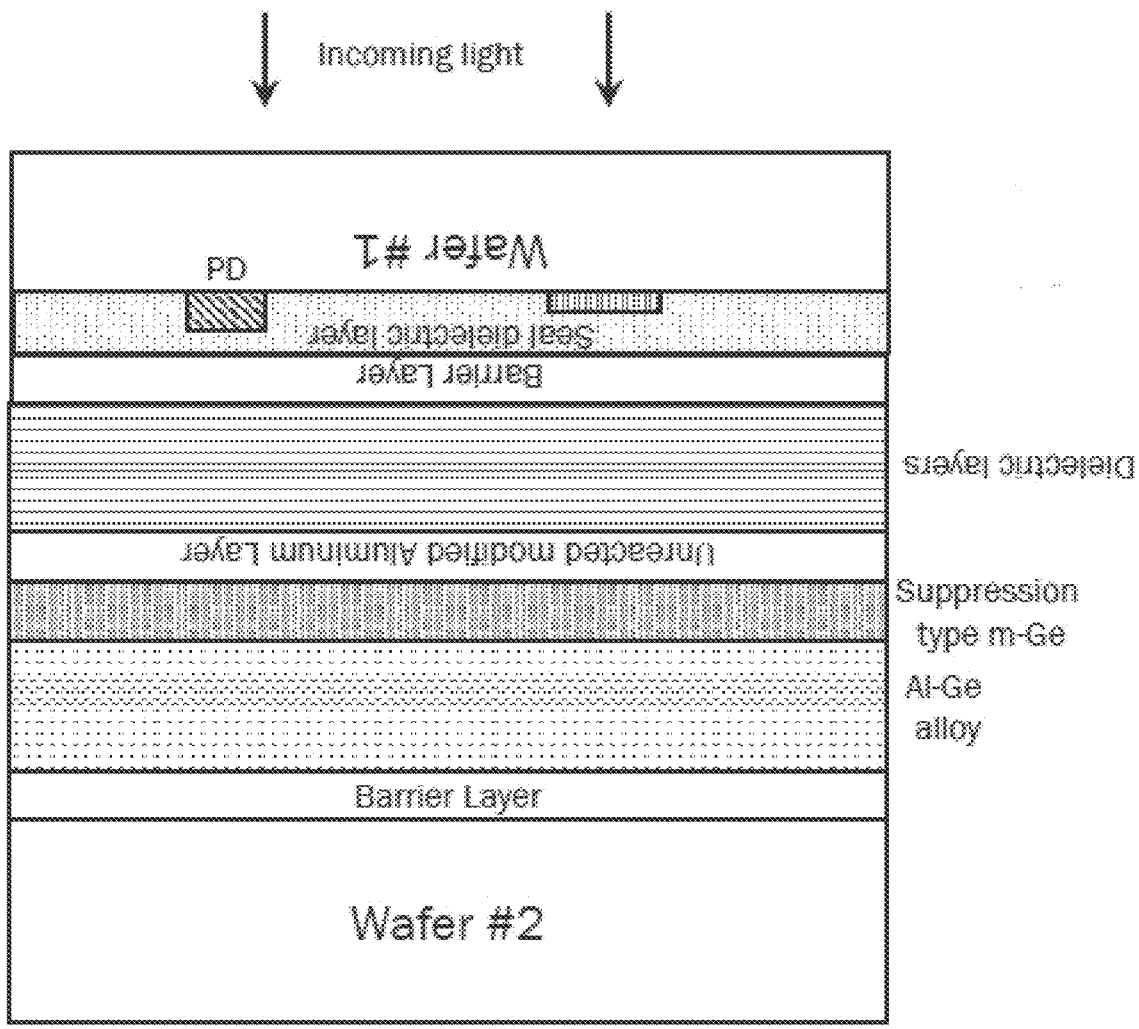

FIG. 32B shows another implementation of the example structure in FIG. 32A. In FIG. 32B's example, layers of dielectric material are inserted in between the discussed modified materials stack that includes the {enhancement type Ge/Al/suppression type of Ge/Al/barrier}. In this example, the top two Ge—Al layers are for eutectic wafer bonding formation, and the suppression type of modified Ge serves as a separation layer. Because the eutectic alloy formation terminates at the suppression type modified Ge layer, the additional dielectric layers are not affected by the eutectic alloy formation process. The thickness, material type, and the total number of layers of the dielectric layers here in FIG. 32B are selected to provide additional optical properties for the incident light for the photodetector. For example, the dielectric layers can be designed and implemented to function as a layered distributed Bragg reflector (DBR) mirror.

Figure 32C:
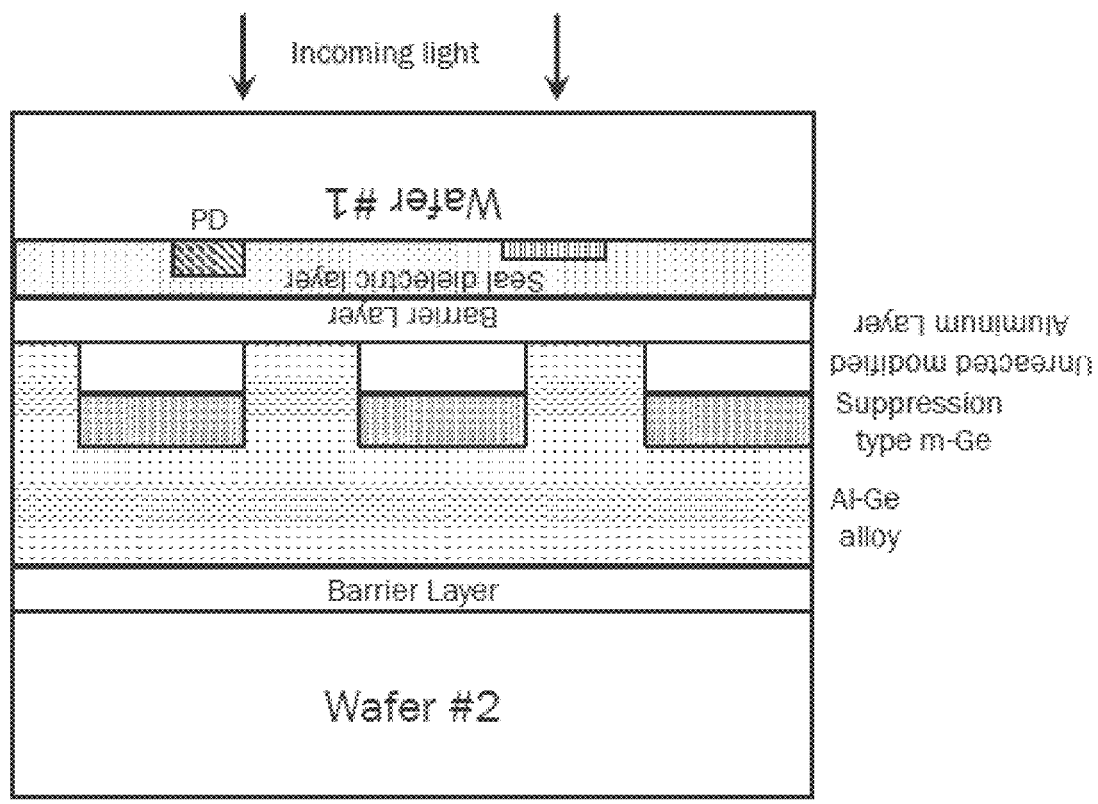

FIG. 32C is another example technique extended from the disclosed Al—Ge enhancement/suppression techniques. In this example, the aforementioned technique of localized suppression of alloy formation is used to define the shape and pattern of the unreacted Al regime. This pattern may be used for optical purposes, such as a Fresnel zone plate (FZP)

or reflective diffraction grating. Specifically, it is observed in the present disclosure that, because the unreacted Al will reflect light while the Al—Ge alloy will partially absorb light, there is a reflectivity difference in the resulting structure, and as such, it can be used as a way to create diffraction. Example applications of this phenomenon are shown in FIGS. 32D-32F.

Note that, for purposes of implementing Al—Ge eutectic alloy techniques disclosed here, the term "pattern" generally refers to the shape and geometry of a certain structure (e.g., of the resulting Al—Ge alloy); it may or may not involve a surface morphology change. Also note that, to easier control the difference in the reflectivity, which mainly comes from the Al—Ge alloy and the cavities, it may be desirable to have unreactive Al/Ge materials removed (e.g., such as discussed with respect to FIG. 29D), depending upon the application. For example, for a reflective mirror implementation, unreacted metallic Al is preferred because it is rather highly reflective, while unreacted Ge below the Al has no function, nor does it interfere with any function, and therefore it would not matter if the unreacted Ge is kept or removed. However, for some other designs such as a cavity resonator, a waveguide, or a microfluid channel, the removal of such unreacted portion may be necessary for the design to function properly. Note that the reflectivity difference between an empty space and Al—Ge alloy is larger than the reflectivity difference between an unreacted Al and Al—Ge alloy, and thus it is possible to form another grating design based on this difference in the reflectivity difference.

Figure 32D:
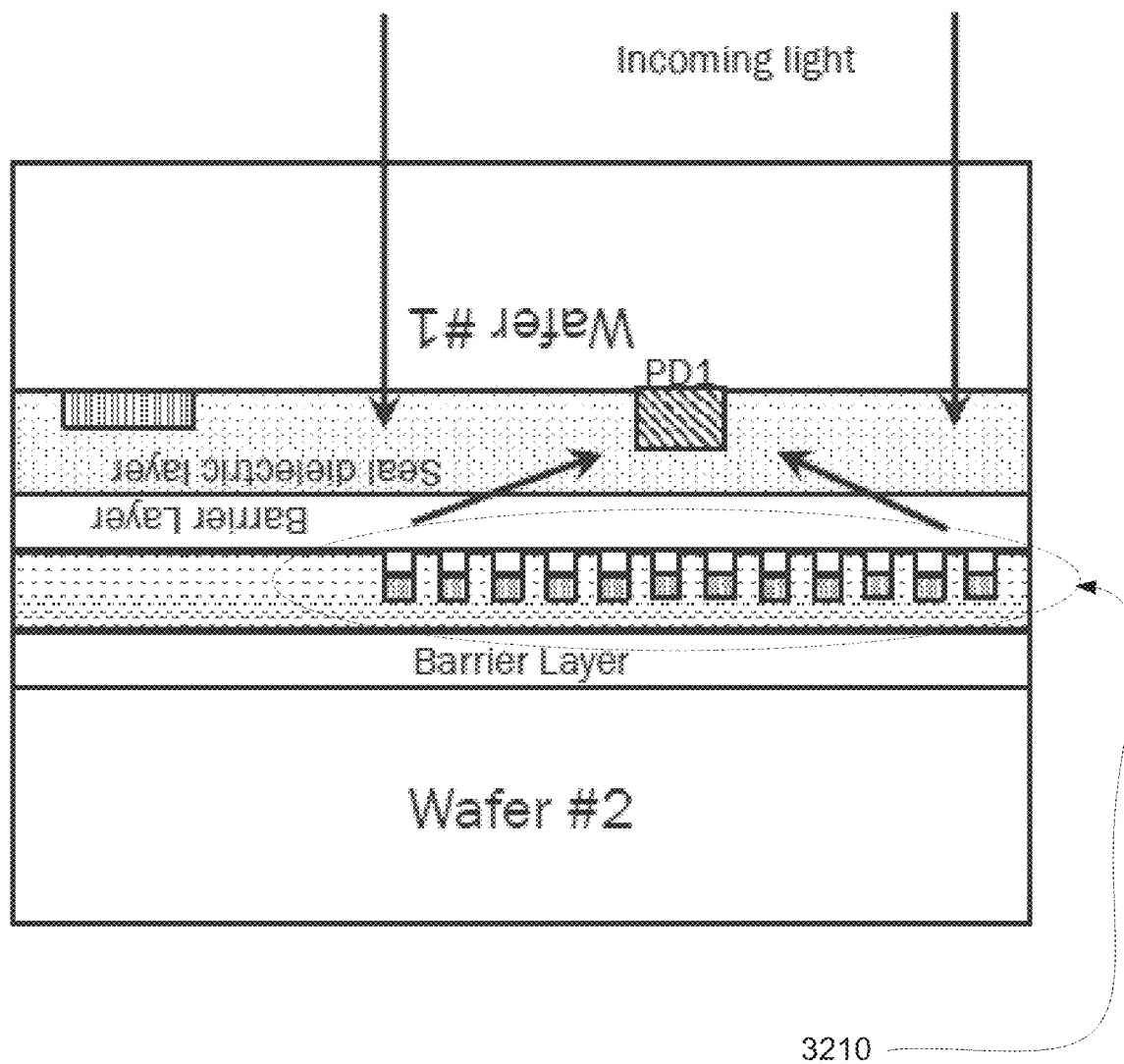
Figures 1, 32D:
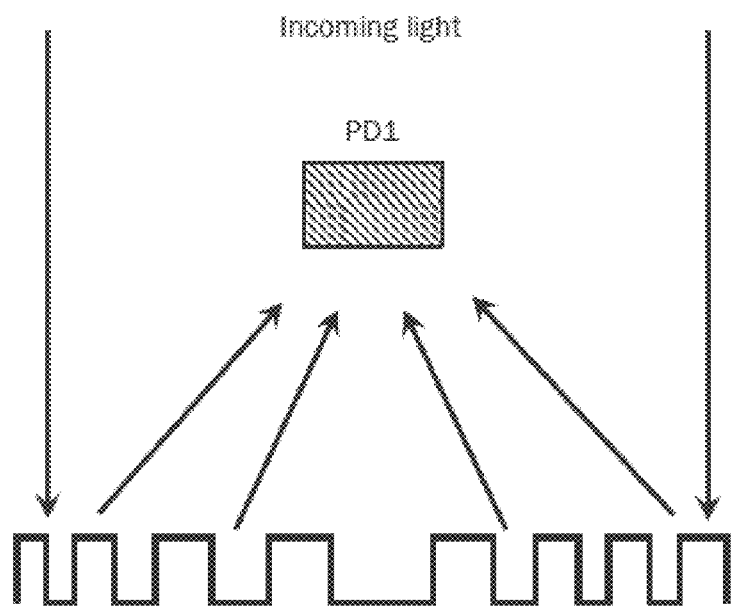

FIG. 32D shows a first example application of the technique discussed in FIG. 32C. A reflective type Fresnel zone plate (FZP) pattern 3210 is formed by the partially reacted Al—Ge bonding layer. As shown in FIG. 32D, the FZP pattern 3210 can function as a backside lens that can focus the backward reflected light. The diffracted light's direction can be controlled by the grating spacing and the wavelength of the incident light. According to one or more embodiments, the PD is placed at a corresponding location (e.g., where the focus of the FZP 3210 is) to collect the diffracted light. FIG. 32E-1 shows a diagram that further illustrates the focusing effect of the FZP pattern 3210.

Figure 32E:
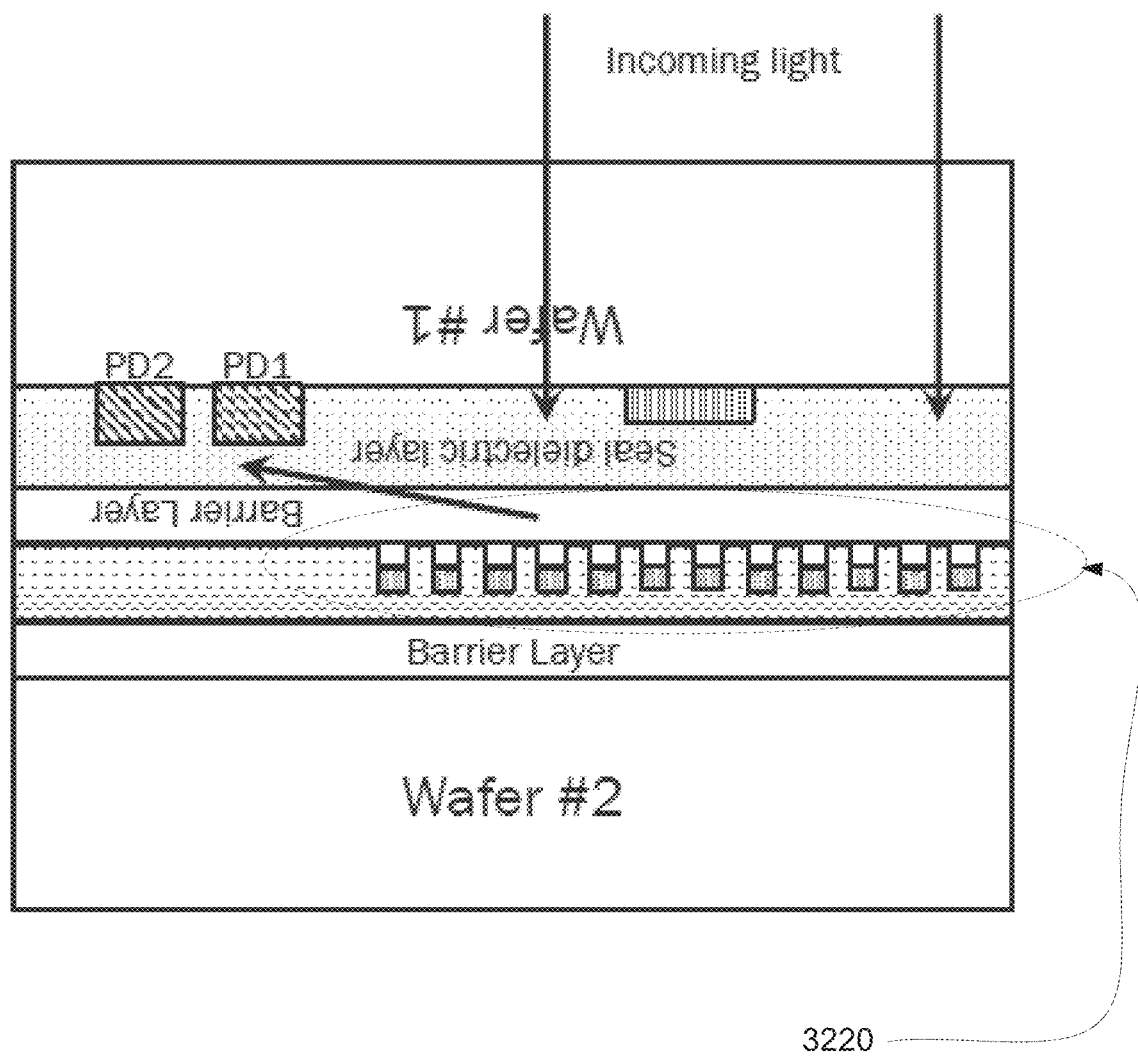
Figures 1, 32E:
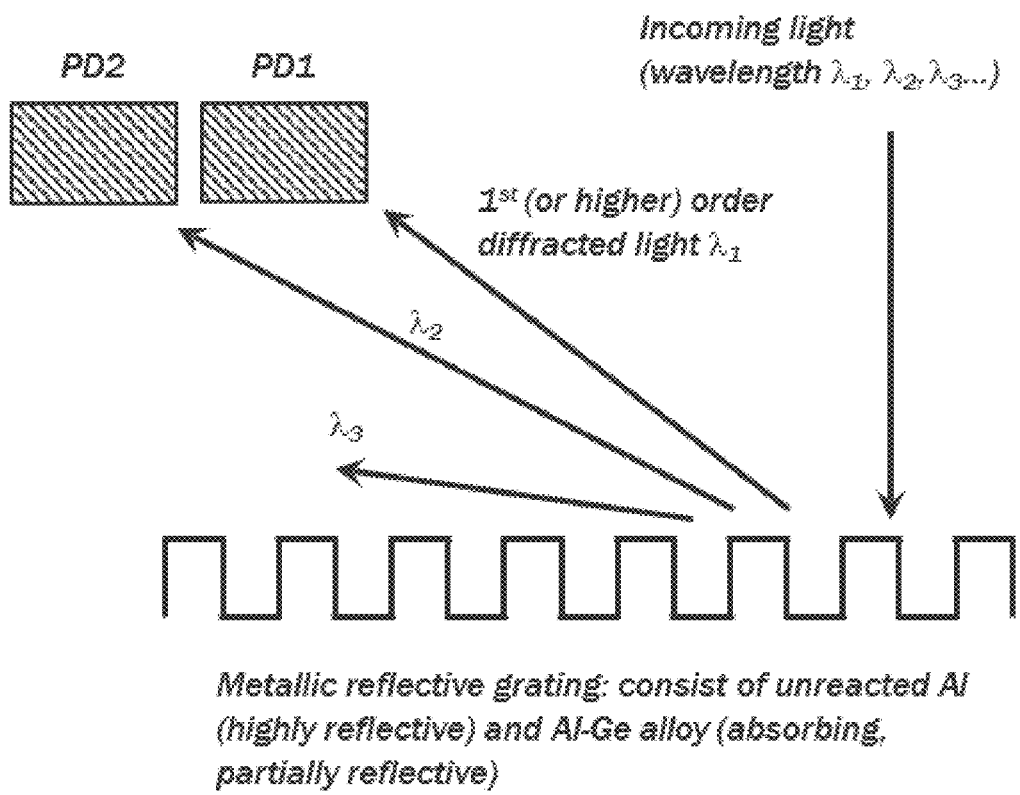
Figure 32F:
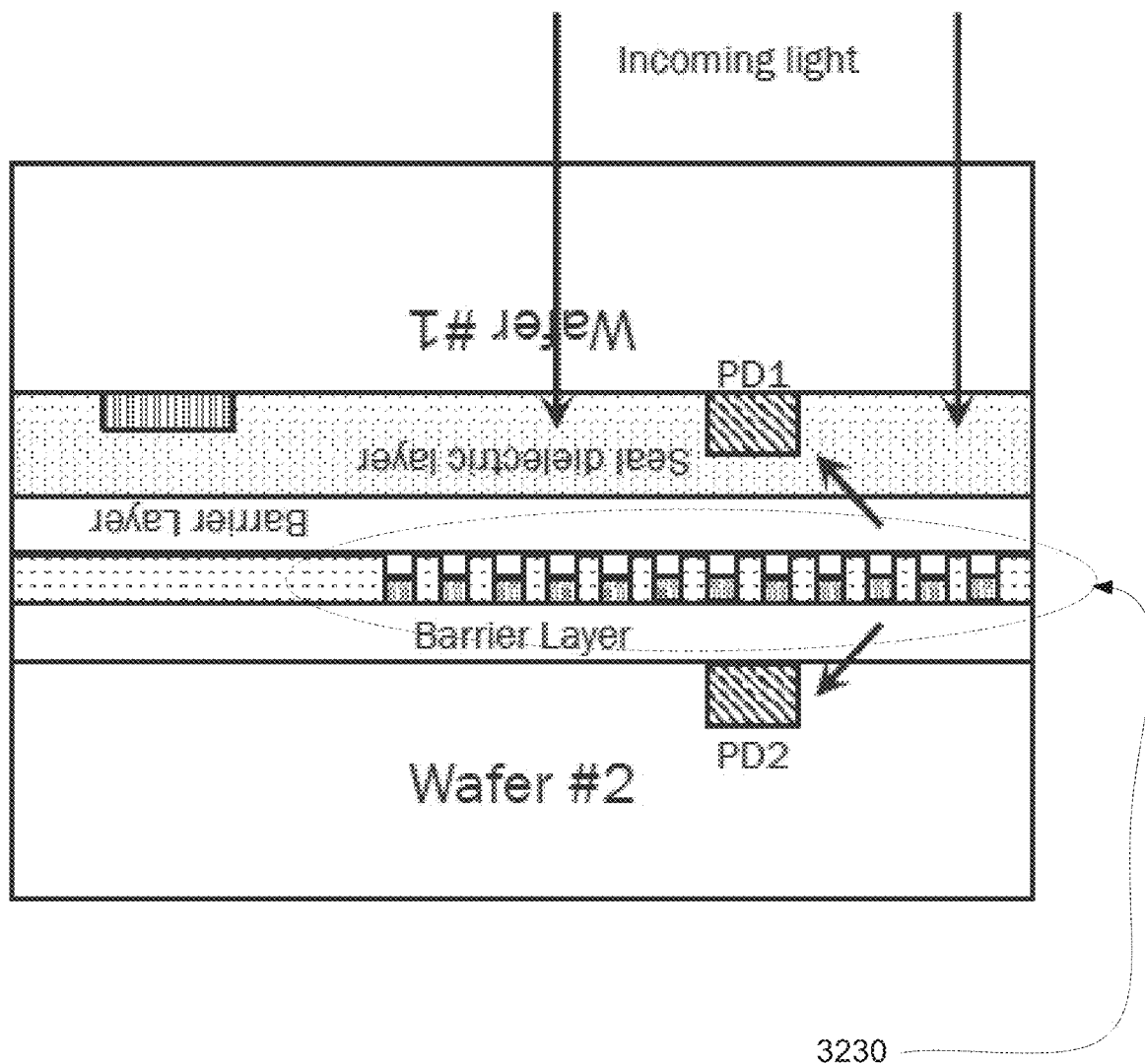
Figures 1, 32F:
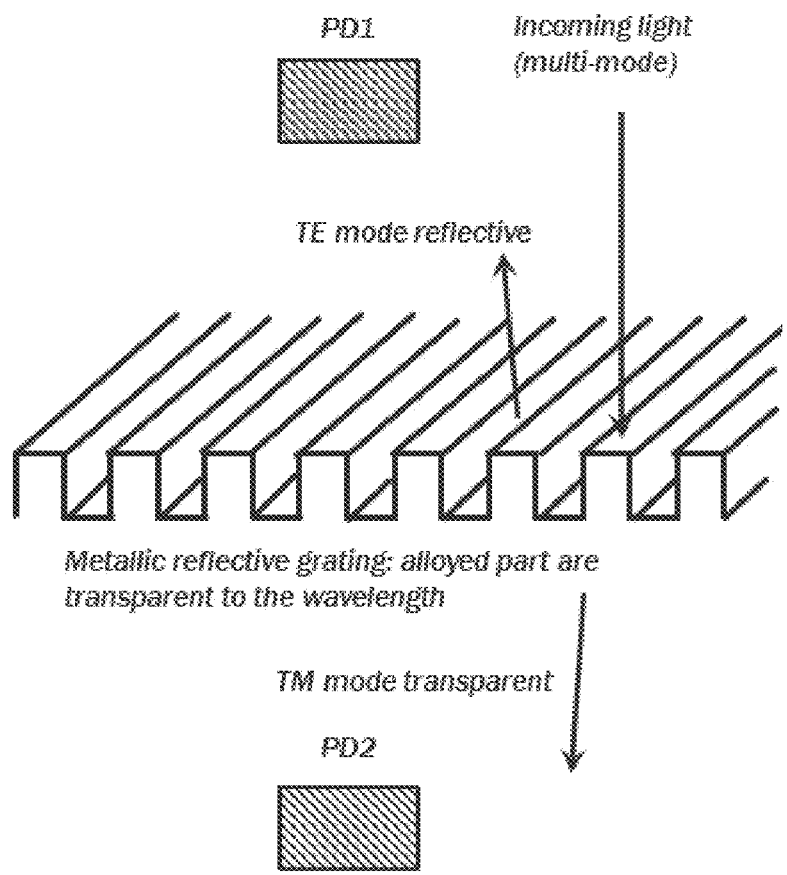

FIG. 32E shows a second example application of the technique discussed in FIG. 32C. As shown in FIG. 32E, a reflective diffraction grating is formed by the partially reacted Al—Ge bonding layer such that it can be used as a wavelength selector 3220. The diffracted light direction can be controlled by the grating spacing and the wavelength of incoming light. According to one or more embodiments, a PD (or multitude of PDs) can be placed at corresponding locations to collect a specific order of the diffracted light of a given wavelength. FIG. 32E-1 shows a diagram that further illustrates the effect of the metallic reflective grating (e.g., of the wavelength selector 3220), where the PD can be strategically positioned at locations to receive different order of diffracted light, depending on the incident light's wavelength.

FIG. 32F shows a third example application of the technique discussed in FIG. 32C. A polarization beam splitter 3230 is formed by the partially reacted Al—Ge bonding layer to decouple multi-mode incident light. More specifically, for a light wavelength that is not absorbed by Ge and Al—Ge alloy, the patterned grating in the beam splitter 3230 can, e.g., reflect one polarization of light and allow the other polarization to transmit. For example, a grating can be implemented to be transparent to the transverse magnetic (TM) mode of the incident light but reflective to the transverse electric (TE) mode. Such example is shown in FIG. 32F-1.

Figure 33:
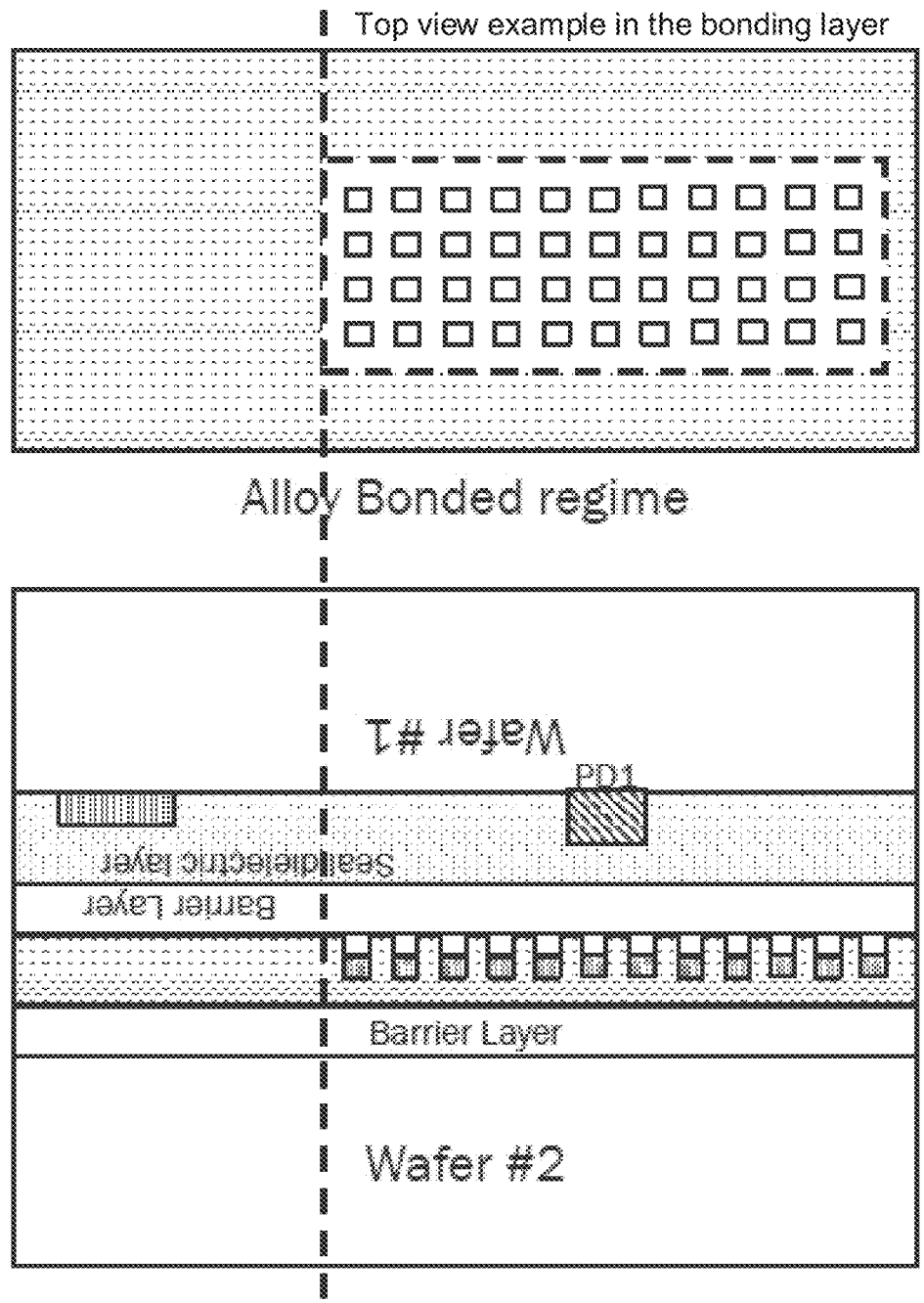
FIG. 33 illustrates yet another example structure that can be formed by the disclosed modified Al—Ge bonding technique.

FIG. 33 illustrates yet another example structure that can be formed by the disclosed modified Al—Ge bonding technique. Specifically, as shown in FIG. 33, the disclosed technique of localized suppression of bonding alloy formation may be used to define the specific locations of the bonding alloy in the bonding layer. In some examples, to ensure the bonding strength between the wafers, the unreacted Al—Ge portion is chosen not to exceed 50% of the total volume in the bonding layer stacks. Further, unreacted areas should be placed properly, e.g., enclosed within a fully alloy bonded area (such as shown in FIG. 33), to avoid de-bonding in subsequent manufacturing processes.

Overall, the modified Al—Ge eutectic alloy bonding layer, together with localized treatments at different sites, can be used in some embodiments to form a plurality of cavity structures within the layer after removal of the unreacted Al—Ge. The placement of these cavities can be in a certain repeating order or randomly distributed. The size, shape and location of the cavities can also be defined by the localized treatment patterns, multiple layers of modified Ge/Al stack thickness and combinations, and/or alloy formation anneal processes. Alternatively, in some embodiments, the unreacted Al—Ge can be left in the structure by design for various of applications, e.g., in reflective grating applications as a reflective mirror. Example applications where the cavity structure in the eutectic Al—Ge alloy layer may be used can include photonics crystal devices, plasmonic meta-materials, microfluid channels, hollow metallic waveguide, or light reflector, scatter, or grating for the devices formed on the wafers. The introduced Al—Ge bonding techniques can be generally applicable to the structures disclosed herein when the formation of such structures involves bonding. The modified Al—Ge eutectic bonding techniques disclosed here may replace conventional bonding techniques.

CONCLUSION

Unless contrary to physical possibility, it is envisioned that (i) the methods/steps described above may be performed in any sequence and/or in any combination, and that (ii) the design, structures, or components of respective embodiments may be combined in any manner.

Note that any and all of the embodiments described above can be combined with each other, except to the extent that it may be stated otherwise above or to the extent that any such embodiments might be mutually exclusive in function and/or structure.

Although the present disclosure has been described with reference to specific exemplary embodiments, it will be recognized that the invention is not limited to the embodiments described, but can be practiced with modification and alteration within the scope of the appended claims. Accordingly, the specification and drawings are to be regarded in an illustrative sense rather than a restrictive sense.

What is claimed is:
1. A semiconductor structure, comprising:
a first wafer;
an aluminum-germanium (Al—Ge) eutectic alloy layer over the first wafer; and
a second wafer bonded to the first wafer via the Al—Ge eutectic alloy layer;

wherein the Al—Ge eutectic alloy layer is formed based on an Al—Ge mixture that has an eutectic temperature ranging from 350 to 400 degrees Celsius, wherein the Al—Ge mixture is doped by a dopant including boron, tin, copper, gold, a group-V element, or fluorine.

2. The structure of claim 1, wherein the Al—Ge eutectic alloy layer is formed based on a first metal layer attached to the first wafer and a second metal layer attached to the second wafer during a pre-bonding process at said eutectic temperature, and wherein the first and second metal layers include germanium (Ge) and aluminum (Al).

3. The structure of claim 1, wherein the Al—Ge eutectic alloy layer is formed to include a cave structure.

4. The structure of claim 1, wherein a suppression-type local Ge or Al layer is formed in the cave structure.

5. The structure of claim 1, further comprising a first barrier layer between the first wafer and the Al—Ge eutectic alloy layer.

6. The structure of claim 5, further comprising a second barrier layer between the second wafer and the Al—Ge eutectic alloy layer.

7. The structure of claim 1, wherein the Al—Ge eutectic alloy layer includes a first metal layer including a modified Ge layer and a modified Al layer.

8. The structure of claim 7, wherein the first metal layer includes multiple modified Ge layers and multiple modified Al layers stacked in an interleaved manner.

9. The structure of claim 1, wherein the Al—Ge eutectic alloy layer includes a first metal layer and a second metal layer.

10. The structure of claim 9, wherein the second metal layer includes a modified Ge layer, and wherein the first metal layer includes a modified Al layer.

11. The structure of claim 9, wherein the second metal layer includes multiple modified Ge layers and multiple modified Al layers stacked in an interleaved manner.

12. The structure of claim 1, wherein the eutectic temperature is lower than a tolerance temperature of a back-end-of-line (BEOL) metal line.

13. The structure of claim 12, wherein the tolerance temperature of the BEOL metal line is higher than 420 degrees Celsius.

14. A semiconductor structure, comprising:
a first wafer;
an eutectic alloy layer over the first wafer; and
a second wafer over the eutectic alloy layer;
wherein the eutectic alloy layer is formed from an eutectic metal mixture that:
includes germanium (Ge) and aluminum (Al),
is doped by a dopant including one or more of: copper, gold, fluorine, or a group-V element, and
has an eutectic temperature ranging from 350 to 400 degrees Celsius.

15. The structure of claim 14, wherein the eutectic metal mixture further includes a dopant-modified local area, and wherein the eutectic alloy layer includes a cave structure that is formed near the dopant-modified local area.

16. A semiconductor structure, comprising:
a first wafer;
an eutectic alloy layer over the first wafer, the eutectic alloy layer including a material system
a second wafer bonded to the first wafer via the eutectic alloy layer; and
a cave structure formed in the eutectic alloy layer and including a material that is different, doped differently, and/or unreacted from the material system of the eutectic alloy layer.

17. The semiconductor structure of claim 16, wherein the material of the cave structure includes doped Ge or doped Al.

18. The semiconductor structure of claim 17, wherein the material system of the eutectic alloy layer includes Al—Ge alloy.

19. The semiconductor structure of claim 17, wherein the doped Ge or doped Al is doped by a dopant including one or more of: a group-III element, a group-IV element, copper, gold, fluorine or a group-V element.

* * * * *